US012727475B2

(12) United States Patent
Sun et al.

(10) Patent No.: US 12,727,475 B2
(45) Date of Patent: Sep. 1, 2026

(54) SEMICONDUCTOR PACKAGES AND METHODS OF FORMING THE SAME

(71) Applicant: Taiwan Semiconductor Manufacturing Co., Ltd., Hsinchu (TW)

(72) Inventors: Sey-Ping Sun, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 913 days.

(21) Appl. No.: 17/808,705

(22) Filed: Jun. 24, 2022

(65) Prior Publication Data

US 2023/0420330 A1 Dec. 28, 2023

(51) Int. Cl.

| | |
|---|---|
| ***H10W 40/00*** | (2026.01) |
| ***H10W 40/22*** | (2026.01) |
| ***H10W 40/25*** | (2026.01) |
| ***H10W 70/65*** | (2026.01) |
| ***H10W 70/685*** | (2026.01) |

(Continued)

(52) U.S. Cl.
CPC ....... *H10W 40/228* (2026.01); *H10W 40/037* (2026.01); *H10W 40/255* (2026.01); *H10W 70/65* (2026.01); *H10W 70/685* (2026.01); *H10W 72/0198* (2026.01); *H10W 90/00* (2026.01); *H10W 90/701* (2026.01); *H10W 80/312* (2026.01); *H10W 80/327* (2026.01); *H10W 90/20* (2026.01);

(Continued)

(58) Field of Classification Search
CPC ....... H01L 21/4882; H01L 2224/08145; H01L 2224/08225; H01L 2224/80895; H01L 2224/80896; H01L 2225/06524; H01L 2225/06541; H01L 2225/06589; H01L 23/3677; H01L 23/3735; H01L 23/4334; H01L 23/49811; H01L 23/49822; H01L 23/49827; H01L 23/49833; H01L 23/49838; H01L 24/08; H01L 24/80; H01L 24/96; H01L 24/97; H01L 25/0657; H01L 25/18; H01L 25/50; H01L 2924/3512; H01L 2924/37001
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |

(Continued)

FOREIGN PATENT DOCUMENTS

| | | | | |
|---|---|---|---|---|
| DE | 102019106314 A1 * | 10/2019 | ............ | B82Y 30/00 |
| TW | 202145463 A | 12/2021 | | |
| TW | 202207325 A | 2/2022 | | |

*Primary Examiner* — Telly D Green
(74) *Attorney, Agent, or Firm* — Slater Matsil, LLP

(57) ABSTRACT

A method includes bonding a first semiconductor die to a semiconductor substrate; bonding a second semiconductor die to the semiconductor substrate, wherein the second semiconductor die is laterally separated from the first semiconductor die by a gap; filling the gap between the first semiconductor die and the second semiconductor die with a metal material to form a thermally conductive region; and depositing a first dielectric layer over the first semiconductor die, the second semiconductor die, and the thermally conductive region.

20 Claims, 41 Drawing Sheets

(51) Int. Cl.

| | |
|---|---|
| ***H10W 72/00*** | (2026.01) |
| ***H10W 90/00*** | (2026.01) |
| *H10W 80/00* | (2026.01) |
| *H10W 90/20* | (2026.01) |

(52) U.S. Cl.

CPC ........ *H10W 90/288* (2026.01); *H10W 90/401* (2026.01); *H10W 90/792* (2026.01); *H10W 90/794* (2026.01)

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 11,502,072 | B2 * | 11/2022 | Yu | H01L 24/33 |
| 11,682,630 | B2 | 6/2023 | Choi | |
| 2011/0026232 | A1 * | 2/2011 | Lin | H01L 25/0652 361/760 |
| 2016/0240391 | A1 * | 8/2016 | Chen | H01L 23/49827 |
| 2018/0138101 | A1 * | 5/2018 | Yu | H01L 24/94 |
| 2018/0323177 | A1 * | 11/2018 | Yu | H01L 24/80 |
| 2019/0096825 | A1 * | 3/2019 | Kim | H01L 23/16 |
| 2019/0237412 | A1 * | 8/2019 | Lee | H01L 25/0655 |
| 2019/0385893 | A1 | 12/2019 | Shealy | |
| 2020/0105635 | A1 * | 4/2020 | Yu | H01L 23/3677 |
| 2020/0381397 | A1 * | 12/2020 | Yu | H01L 24/08 |
| 2021/0098381 | A1 * | 4/2021 | Yu | H01L 25/0657 |
| 2022/0392884 | A1 * | 12/2022 | Yu | H01L 24/09 |
| 2023/0402340 | A1 * | 12/2023 | Lin | H01L 23/3738 |

* cited by examiner 100
51
50
200
201
200
110
108
102
104
106

200
201
200
126
120
128
130
150
160
122
112
102
104
106
100
51
50
114
110
108
115

400
200
250
140
136
100
406
262
401
302
108
106
260
160
150
128
404

200
250
140
136
112
104A
102
104B
106
100
114
115
160
128
150
110
108
104

SEMICONDUCTOR PACKAGES AND METHODS OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
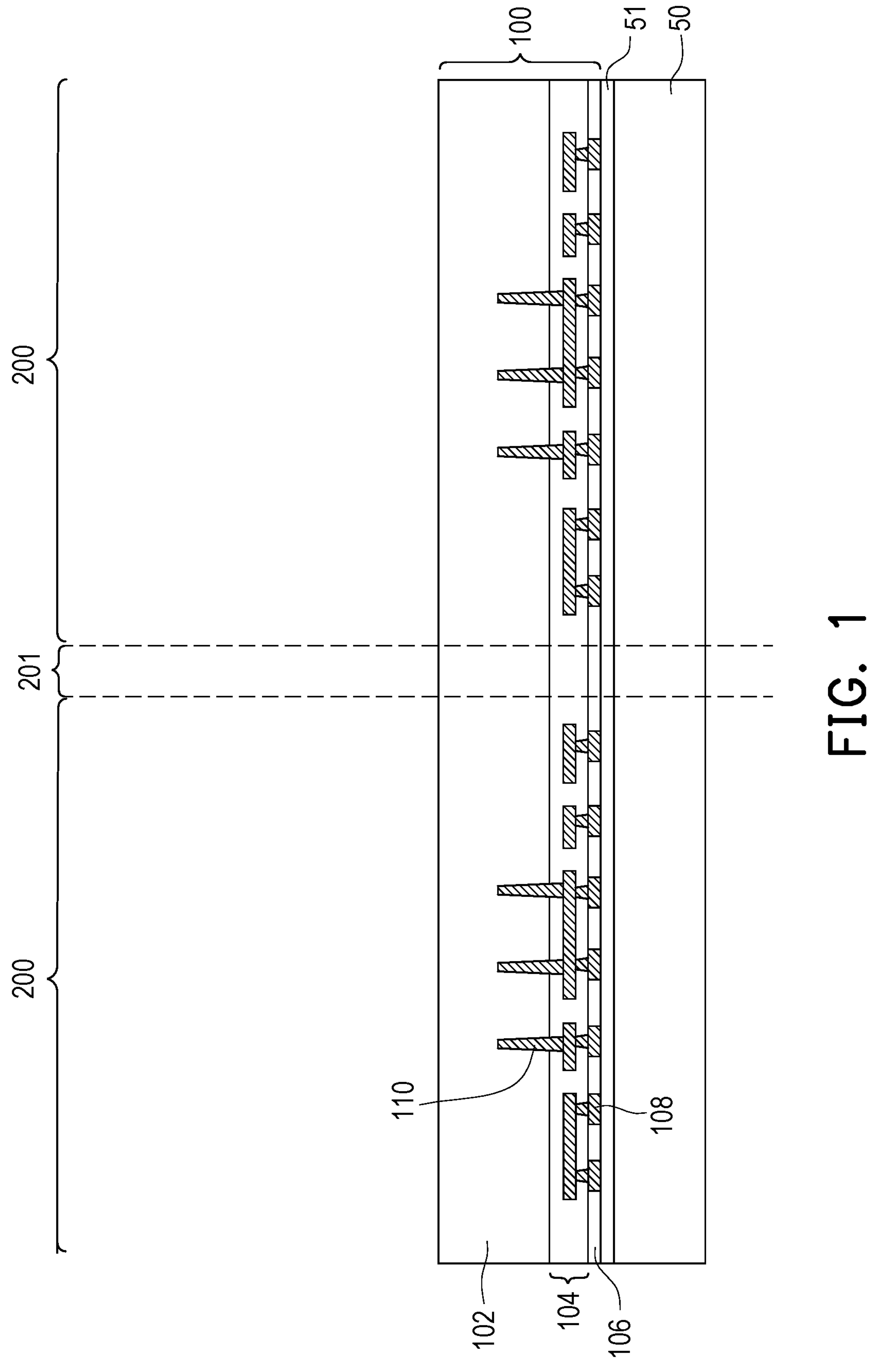
FIGS. 1, 2, 3, 4, and 5 are cross-sectional views of intermediate stages in the manufacturing of packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages are formed by bonding components such as integrated circuit dies and/or dummy dies to wafer. Gaps between components are filled with a material having a high thermal conductivity, such as a metal. By filling the gaps between components with a high thermal conductivity material, the heat dissipation and other thermal properties of the integrated circuit packages may be improved. In various embodiments, the high thermal conductivity material formed in scribe regions is replaced with a different, less soft material before singulation. Replacing the high thermal conductivity material in this manner can allow for a more efficient and reliable singulation process, with less risk of damage.

FIGS. 1-15 are cross-sectional views of intermediate stages in the manufacturing of packages 200 (see FIG. 15), in accordance with some embodiments. The packages 200 may be subsequently incorporated into a package structure, device, or the like. For example, the packages 200 may be, for example, package components for Chip-on-Wafer-on-Substrate (CoWoS) devices, package components for System-on-Integrated-Chip (SoIC) devices, package components for Integrated Fan-Out (InFO) devices, or the like.

FIG. 1 illustrates a wafer 100 bonded to a carrier substrate 50, in accordance with some embodiments. The carrier substrate 50 may be, for example, a substrate or wafer formed of silicon, laminate, ceramic, glass, silicate glass, or the like. In some embodiments, the wafer 100 is bonded to the carrier substrate 50 using a bonding layer 51. In some embodiments, alignment features (not shown) are formed in the bonding layer 51.

In some embodiments, the bonding layer 51 is an adhesive layer, a release layer, or the like. For example, the bonding layer 51 may be formed of a polymer-based material, which may be subsequently removed along with the carrier substrate 50 from the wafer 100. In some embodiments, the bonding layer 51 is an epoxy-based thermal-release material, which loses its adhesive property when heated, such as a light-to-heat-conversion (LTHC) release coating. In other embodiments, the bonding layer 51 may be an ultra-violet (UV) glue, which loses its adhesive property when exposed to UV lights. bonding layer 51 may be dispensed as a liquid and cured, may be a laminate film laminated onto the carrier substrate 50, or may be the like. The top surface of the bonding layer 51 may be planarized and may have a high degree of planarity.

In accordance with other embodiments, the bonding layer 51 is bonded to the wafer 100 using a bonding process such as direct bonding, fusion bonding, dielectric-to-dielectric bonding, oxide-to-oxide bonding, or the like. For example, the bonding layer 51 may be formed of a silicon-containing dielectric material such as silicon oxide, silicon nitride, or the like. The bonding layer 51 may be deposited using any suitable method, such as, atomic layer deposition (ALD), chemical vapor deposition (CVD), physical vapor deposition (PVD), or the like. The bonding layer 51 may be formed of a single layer or may be formed of multiple layers.

As shown in FIG. 1, the wafer 100 may include multiple package regions 200 in which packages 200 (see FIG. 15) are subsequently formed. Neighboring package regions 200 are separated by scribe regions 201 (also called "scribe lines"). In some embodiments, the scribe regions 201 may be regions through which a singulation may be performed to separate a first one of the packages 200 from a second one of the packages 200, described in greater detail below for FIG. 15. The package regions 200 of the wafer 100 may include, for example, interposers, integrated circuit dies, or the like. In some embodiments, the wafer 100 includes a substrate 102 and features formed on or in the substrate 102, such as interconnect structures 104 and conductive vias 110. In some embodiments, the wafer 100 includes conductive connectors 108 and a dielectric layer 106 formed on the interconnect structures 104. In some embodiments, the conductive connectors 108 and/or the dielectric layer 106 are bonded or otherwise attached to the bonding layer 51, as shown in FIG. 1. In other embodiments, the substrate 102 of the wafer 100 may be bonded or otherwise attached to the bonding layer 51.

The substrate 102 may be, for example, a bulk semiconductor substrate, a semiconductor-on-insulator (SOI) substrate, a multi-layered semiconductor substrate, or the like. The substrate 102 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 102 may be doped or undoped. In embodiments where interposers are formed in the wafer 100, the substrate 102 generally does not include active devices therein, although the interposers may include passive devices formed in and/or on a front surface (e.g., the surface of the substrate 102 facing downward in FIG. 1) of the substrate 102. In embodiments where integrated circuit devices are formed in the wafer 100, active devices such as transistors, capacitors, resistors, diodes, and the like, may be formed in and/or on the front surface of the substrate 102.

The interconnect structure 104 is over the front surface of the substrate 102, and is used to electrically connect the devices (if any) of the substrate 102. The interconnect structure 104 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 104 may be formed by a damascene process, such as a single damascene process, a dual damascene process, or the like.

The conductive vias 110 extend into the interconnect structure 104 and/or the substrate 102. The conductive vias 110 are electrically connected to metallization layer(s) of the interconnect structure 104. The conductive vias 110 are also sometimes referred to as through-substrate vias (TSVs). As an example to form the conductive vias 110, recesses can be formed in the interconnect structure 104 and/or the substrate 102 by, for example, etching, milling, laser techniques, a combination thereof, and/or the like. A thin dielectric material may be formed in the recesses, such as by using an oxidation technique. A thin barrier layer may be conformally deposited in the openings, such as by ALD, CVD, PVD, thermal oxidation, the like, or a combination thereof. The barrier layer may be formed of an oxide, a nitride, a carbide, the like, or a combination thereof. A conductive material may be deposited over the barrier layer and in the openings. The conductive material may be formed by an electro-chemical plating process, CVD, ALD, PVD, the like, or a combination thereof. Examples of conductive materials are copper, tungsten, aluminum, silver, gold, the like, or a combination thereof. Excess conductive material and barrier layer may be removed from a surface of the interconnect structure 104 or the substrate 102 using, for example, a chemical-mechanical polish (CMP) or the like. Remaining portions of the barrier layer and conductive material form the conductive vias 110.

In some embodiments, conductive connectors 108 and a dielectric layer 106 are formed on the interconnect structure 104. The conductive connectors 108 may be conductive pillars, pads, or the like, to which external connections to the interconnect structure 104 are made. For example, in some embodiments, the conductive connectors 108 may be directly bonded to external connectors in subsequent process steps. The conductive connectors 108 may be formed in and/or on the interconnect structure 104. For example, the conductive connectors 108 may be part of an upper metallization layer of the interconnect structure 104. The conductive connectors 108 can be formed of one or more metals, such as copper, aluminum, or the like, and can be formed by, for example, plating, or the like. The conductive connectors 108 may include other layers, such as a barrier layer or a liner, in some embodiments.

The dielectric layer 106 may be formed in and/or on the interconnect structure 104. For example, the dielectric layer 106 may be an upper dielectric layer of the interconnect structure 104. The dielectric layer 106 laterally encapsulates the conductive connectors 108. The dielectric layer 106 may be, for example, silicon oxide, silicon nitride, silicon oxynitride, silicon oxycarbide, a polymer, the like, or a combination thereof. In some embodiments, the material of the dielectric layer 106 may be similar to the material of the bonding layer 51. The dielectric layer 106 may be formed, for example, by spin coating, lamination, CVD, PVD, or the like. In some embodiments, the dielectric layer 106 may bury the conductive connectors 108 such that the top surface of the dielectric layer 106 is above the top surfaces of the conductive connectors 108. A planarization process (e.g., a CMP process or the like) may then be performed to expose the conductive connectors 108. In other embodiments, the dielectric layer 106 may be formed first and then the conductive connectors 108 are formed in the dielectric layer 106. A planarization process may be performed, which may leave top surfaces of the conductive connectors 108 and the dielectric layer 106 substantially coplanar (within process variations) such that they are level with one another. In some embodiments, the wafer 100 may have a thickness in the range of about 20 μm to about 40 μm, though other thicknesses are possible.

Figure 2:
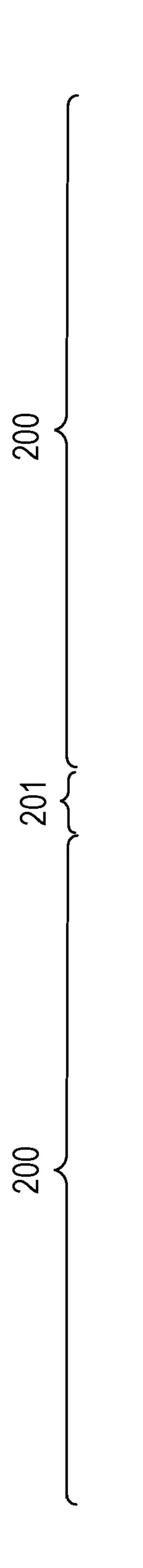
Figure 2:
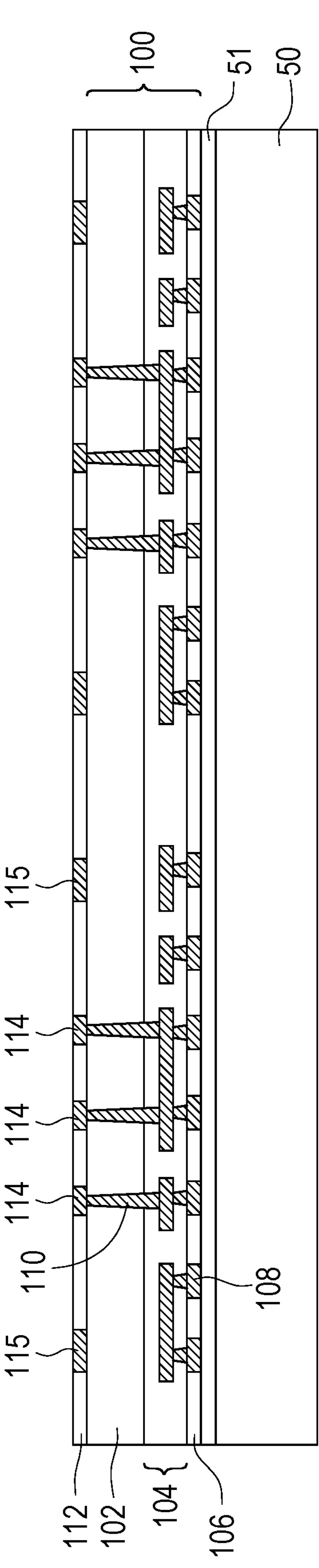

In FIG. 2, the substrate 102 is thinned to expose the conductive vias 110, in accordance with some embodiments. The thinning process may be a planarization process or the like, and may include a grinding process, a CMP process, an etch-back, the like, or a combination thereof. In some embodiments (not separately illustrated), the thinning process for exposing the conductive vias 110 includes a CMP process, and the conductive vias 110 protrude from the substrate 102 at the back-side of the wafer 100 as a result of dishing that occurs during the CMP process. In such embodiments, an insulating layer (not separately illustrated) may optionally be formed on the back surface of the substrate 102, surrounding the protruding portions of the conductive vias 110. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 102 is thinned, exposed surfaces of the conductive vias 110 may be coplanar (within process variations) with the insulating layer (if present) or the substrate 102. In this manner, top surfaces of the conductive vias 110 and the insulating layer or the substrate 102 may be level with one another, and may be exposed at the back-side of the wafer 100.

In some embodiments, a wafer bonding layer 112, conductive connectors 114, and/or conductive bond pads 115 may be formed over the thinned substrate 102. The wafer bonding layer 112, the conductive connectors 114, and/or the conductive bond pads 115 may be used for bonding the wafer 100 to other structures such as one or more semiconductor devices 150 (described in greater detail below), thermal structures 160 (described in greater detail below), or the like. For example, the wafer bonding layer 112 may be used for a bonding process such as direct bonding, fusion bonding, dielectric-to-dielectric bonding, oxide-to-oxide bonding, or the like. The conductive connectors 114 and/or the conductive bond pads 115 may be used for a bonding process such as direct bonding, fusion bonding, metal-to-metal bonding, or the like. In some embodiments, the conductive connectors 114 and the conductive bond pads 115 are similar, except that the conductive connectors 114 are also used to make electrical connections (e.g., between conductive vias 110 and the semiconductor devices 150). In some cases, the conductive bond pads 115 may be electrically isolated. In some embodiments, the wafer bonding layer 112, the conductive connectors 114, and the conductive bond pads 115 are all utilized for bonding the wafer 100 to other structures, such as using "hybrid bonding." In this manner, the wafer bonding layer 112, the conductive connectors 114, and the conductive bond pads 115 may form the "bonding surfaces" of the wafer 100.

In some embodiments, the wafer bonding layer 112 is formed of a silicon-containing dielectric material such as silicon oxide, silicon nitride, silicon oxynitride, or the like. The wafer bonding layer 112 may be deposited using any suitable method, such as, ALD, CVD, PVD, or the like. The conductive connectors 114 and the conductive bond pads 115 may be formed using any suitable technique, such as damascene, dual damascene, or the like. As an example, the conductive connectors 114 and the conductive bond pads 115 may be simultaneously formed by first forming bond openings (not separately illustrated) within the wafer bonding layer 112. The bond openings may be formed, for example, by applying and patterning a photoresist over the top surface of the wafer bonding layer 112, then etching the wafer bonding layer 112 using the patterned photoresist as an etching mask. The wafer bonding layer 112 may be etched by dry etching (e.g., reactive ion etching (RIE), neutral beam etching (NBE), or the like), wet etching, or the like. In accordance with some embodiments of the present disclosure, the etching stops on the substrate 102 such that the conductive vias 110 are exposed through the openings in the wafer bonding layer 112. Other techniques of forming the bond openings are possible.

Conductive material may then be deposited in the bond openings to form the conductive connectors 114 and the conductive bond pads 115, in some embodiments. In an embodiment, the conductive material may comprise a barrier layer, a seed layer, a fill metal, or a combination thereof. For example, a barrier layer may first be blanket deposited over the substrate 102. The barrier layer may comprise titanium, titanium nitride, tantalum, tantalum nitride, the like, or a combination thereof. The seed layer may be a conductive material such as copper and may be blanket deposited over the barrier layer using a suitable process, such as sputtering, evaporation, plasma-enhanced chemical vapor deposition (PECVD), or the like. The fill metal may be a conductive material such as copper, copper alloy, aluminum, or the like, and may be deposited using a suitable process, such as electroplating, electroless plating, or the like. The fill metal may fill or overfill the bond openings, in some embodiments. Once the fill metal has been deposited, excess material of the fill metal, the seed layer, and the barrier layer may be removed using, for example, a planarization process such as a CMP process After the planarization process, top surfaces of the wafer bonding layer 112, the conductive connectors 114, and/or the conductive bond pads 115 may be substantially level or coplanar, in some cases.

However, the above described embodiment in which the wafer bonding layer 112 is formed, patterned, and the conductive material of the conductive connectors 114, and the conductive bond pads 115 is plated into openings before being planarized is intended to be illustrative and is not intended to be limiting upon the embodiments. Rather, any suitable method of formation of the wafer bonding layer 112, the conductive connectors 114, or the conductive bond pads 115 may be utilized. For example, in other embodiments, the conductive material of the conductive connectors 114 and the conductive bond pads 115 may be formed first using, for example, a photolithographic patterning and plating process. The dielectric material of the wafer bonding layer 112 may then be deposited to gap fill the area around the conductive connectors 114 and the conductive bond pads 115. A planarization process may then be performed to remove excess material. In other embodiments, the conductive connectors 114 and the conductive bond pads 115 may be formed using separate processing steps. Any suitable manufacturing processes are fully intended to be included within the scope of the embodiments.

Figure 3:
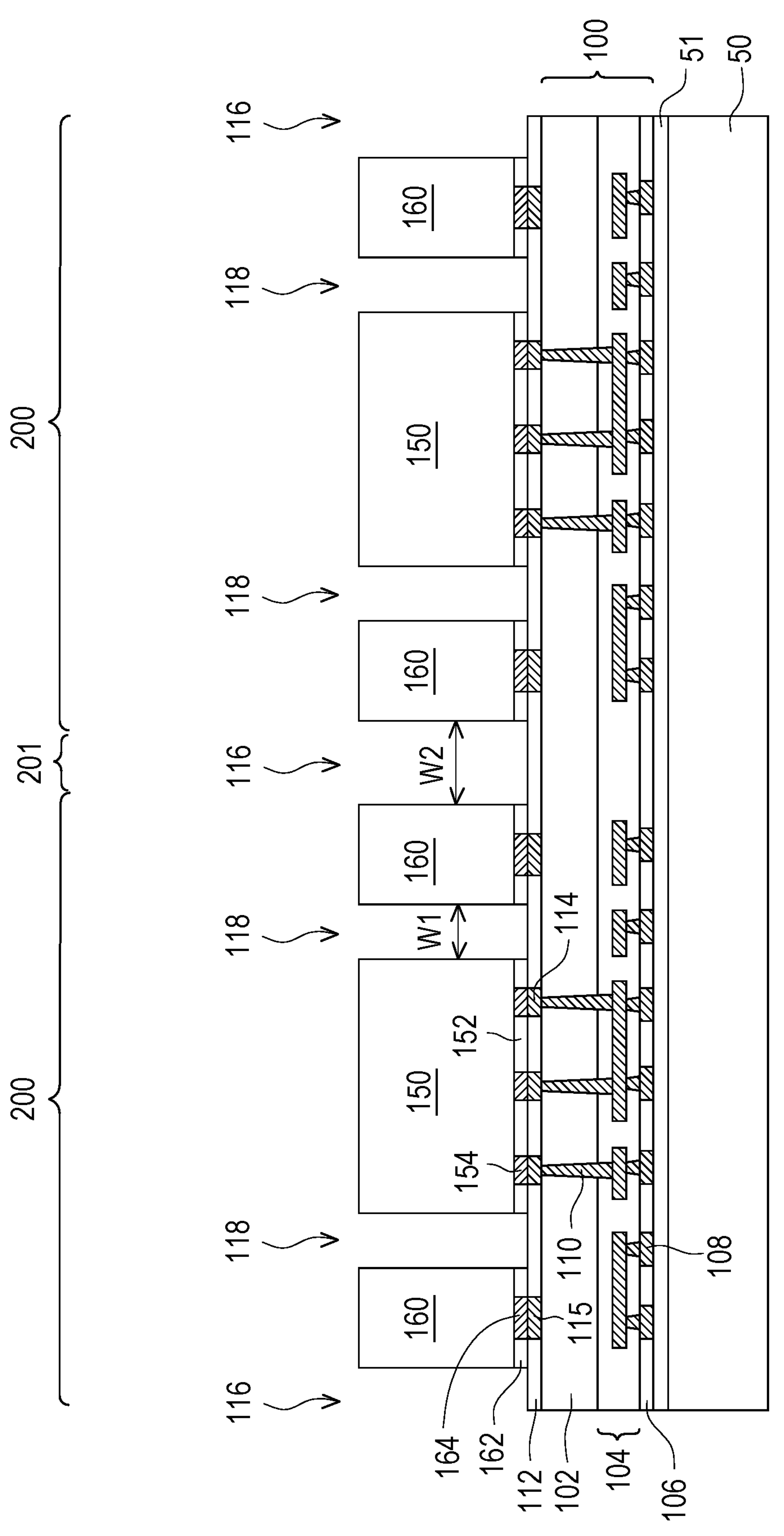

In FIG. 3, semiconductor devices 150 and thermal structures 160 are bonded to the wafer 100, in accordance with some embodiments. The semiconductor devices 150 and the thermal structures 160 may be collectively referred to herein as the "bonded components." Any suitable number or types of semiconductor devices 150 or thermal structures 160 may be bonded to the wafer 100 in any suitable arrangement. For example, each package region 200 shown in FIG. 3 includes one semiconductor device 150 between two thermal structures 160, but in other embodiments a package region 200 may have another number or arrangement of semiconductor devices 150 or thermal structures 160. In such embodiments, the multiple semiconductor devices 150 within each package region 200 may be similar or different types of devices. The top surfaces of the bonded components within each package region 200 may have the same height above the wafer 100 or may have different heights above the wafer 100. In some embodiments, a planarization process (e.g., a CMP process) is performed after bonding the bonded components, after which the top surfaces of the bonded components may have approximately the same height above the wafer 100. In some embodiments, the bonded components may have thicknesses in the range from about 20 μm to about 600 μm, though other thicknesses are possible.

As shown in FIG. 3, the bonded components within each package region 200 are laterally separated by gaps 118. The gaps 118 within a package region 200 may form a continuous region. The various gaps 118 between the various bonded components within a package region 200 may have similar or different widths. For example, a gap 118 between neighboring bonded components of a package region 200 may have a width W1 that is in the range of about 20 μm to about 100 μm, though other widths are possible. The depths of the gaps 118 may correspond to the thicknesses of bonded components.

Still referring to FIG. 3, the bonded components of two neighboring package regions 200 are laterally separated by gaps 116. In this manner, the gaps 116 may correspond to the scribe regions 201. A gap 116 between neighboring bonded components of two different package regions 200 may have a width W2 that is in the range of about 70 μm to about 300 μm, though other widths are possible. The depths of the gaps 116 may correspond to the thicknesses of bonded components.

The semiconductor devices 150 may be, for example, a chip, a die (e.g., a thin or thick die), an integrated circuit device, or the like. For example, a semiconductor device 150 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). In some embodiments, a semiconductor device 150 is a stacked device that includes multiple semiconductor substrates. For example, a semiconductor device 150 may be a memory device that includes multiple memory dies such as a hybrid memory cube (HMC) device, a high bandwidth memory (HBM) device, or the like. In such embodiments, the semiconductor device 150 includes multiple semiconductor substrates interconnected by through-substrate vias (TSVs) such as through-silicon vias. Other types or configurations of semiconductor devices 150 are possible, and the bonded components of a package region 200 may include semiconductor devices 150 of different types, in some embodiments.

In some embodiments, the semiconductor devices 150 include a bonding layer 152 and connectors 154 formed in the bonding layer 152. The bonding layer 152 may surround the connectors 154, and may have a surface that is coplanar or level with surfaces of the connectors 154. The bonding layer 152 and the connectors 154 are used to bond the semiconductor devices 150 to the wafer 100. For example, the bonding layer 152 may be bonded to the wafer bonding layer 112 using direct bonding, fusion bonding, dielectric-to-dielectric bonding, oxide-to-oxide bonding, or the like, and the connectors 154 may be bonded to conductive connectors 114 using direct bonding, fusion bonding, metal-to-metal bonding, or the like. Bonding connectors 154 and conductive connectors 114 together in this manner may also form electrical connections between a semiconductor device 150 and the wafer 100.

The connectors 154 may be, for example, conductive pillars, conductive pads, or the like. In some embodiments, the connectors 154 may be similar to the conductive connectors 108 or the conductive connectors 114, and may be formed using similar techniques. For example, the connectors 154 may comprise a barrier layer, a seed layer, a fill metal, or a combination thereof. The fill metal may comprise, for example, a conductive material such as copper, copper alloy, aluminum, or the like, and may be deposited using a suitable process, such as PVD, CVD, ALD, electroplating, electroless plating, or the like.

The bonding layer 152 be made of any suitable material for direct bonding or fusion bonding. In some embodiments, the bonding layer 152 may be similar to the wafer bonding layer 112, the dielectric layer 106, or the bonding layer 51, and may be formed using similar techniques. For example, the bonding layer 152 may be silicon oxide, silicon nitride, silicon oxynitride, silicon oxycarbide, silicon oxycarbonitride, or the like. The bonding layer 152 may be formed, for example, by spin coating, PECVD, CVD, LPCVD, ALD, PVD, or the like. A planarization process (e.g., a CMP process) may be performed on the bonding layer 152.

Notably, the semiconductor devices 150 are bonded to the wafer 100 without the use of solder connections (e.g., microbumps or the like). By directly bonding the semiconductor devices 150 to the wafer 100, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die may be achieved between the semiconductor devices 150, which has the benefits of smaller form-factor, higher bandwidth, improved power integrity (PI), improved signal integrity (SI), and lower power consumption.

The thermal structures 160 may be structures bonded to the wafer 100 that facilitate the dissipation of heat from the wafer 100 and/or from the semiconductor devices 150. As such, the thermal structures 160 may comprise one or more materials having a suitably high thermal conductivity. For example, the thermal structures 160 may comprise a material such as silicon (e.g., bulk silicon), silicon oxide, silicon carbine, aluminum nitride, a ceramic material, the like, or a combination thereof. The thermal structures 160 may be free of active and/or passive devices, and thus may be considered "dummy die" in some cases.

In some embodiments, the thermal structures 160 include a bonding layer 162 and conductive bond pads 164 formed in the bonding layer 162. The bonding layer 162 may surround the conductive bond pads 164, and may have a surface that is coplanar or level with surfaces of the conductive bond pads 164. The bonding layer 162 and the conductive bond pads 164 are used to bond the thermal structures 160 to the wafer 100. For example, the bonding layer 162 may be bonded to the wafer bonding layer 112, and the conductive bond pads 164 may be bonded to the conductive bond pads 115. The bonding layer 162 may be formed of materials similar to those described previously for a bonding layer 152 of a semiconductor device 150, and may be formed using similar techniques. The conductive bond pads 164 may be formed of materials similar to those described previously for the connectors 154 of a semiconductor device 150, and may be formed using similar techniques.

In FIG. 3, each thermal structure 160 is shown as having a single conductive bond pad 164, but in other embodiments a thermal structure 160 may have no conductive bond pads 164 or may have multiple conductive bond pads 164. In some cases, the use of conductive bond pads 164 to bond a thermal structure 160 may improve heat dissipation. In some embodiments, the thermal structures 160 may have metal vias (not shown in the figures) extending partly or fully through the thermal structures 160 to facilitate the transfer of heat within the thermal structures 160. In some embodiments, the thermal structures 160 may be electrically isolated from other features (e.g., other bonded components), from the conductive vias 110, or from the interconnect structure 104. In other embodiments, the thermal structures 160 may be electrically connected to other features, may be grounded, or may be biased.

In some embodiments, the semiconductor devices 150 and the thermal structures 160 are bonded to the wafer 100 using, for example, dielectric-to-dielectric bonding, metal-to-metal bonding, or a combination thereof (e.g., "hybrid bonding"). In some embodiments, an activation process may be performed on the bonding surfaces of the wafer 100 (e.g., the wafer bonding layer 112, the conductive connectors 114, and the conductive bond pads 115), the bonding surfaces of the semiconductor devices 150 (e.g., the bonding layer 152 and the connectors 154), and the bonding surfaces of the thermal structures 160 (e.g., the bonding layer 162 and the conductive bond pads 164) prior to bonding.

Activating the bonding surfaces of the wafer 100, the semiconductor devices 150, and/or the thermal structures 160 may comprise a dry treatment, a wet treatment, a plasma treatment, exposure to an inert gas plasma, exposure to $H_2$, exposure to $N_2$, exposure to $O_2$, a combination thereof, or the like. For embodiments in which a wet treatment is used, an RCA cleaning may be used. In other embodiments, the activation process may comprise other types of treatments. The activation process facilitates bonding of the semiconductor devices 150 and the thermal structures 160 to the wafer 100.

After the activation process, the bonding surfaces of the semiconductor devices 150 and the thermal structures 160 may be placed into contact with the bonding surfaces of the wafer 100. For example, the bonding layer 152 of each semiconductor device 150 may be placed into physical contact with the wafer bonding layer 112, and the connectors 154 of each semiconductor device 150 may be placed into physical contact with corresponding conductive connectors 114. Similarly, the bonding layer 162 of each thermal structure 160 may be placed into physical contact with the wafer bonding layer 112, and the conductive bond pads 164 of each thermal structure 160 may be placed into physical contact with corresponding conductive bond pads 115. In some cases, the bonding process between bonding surfaces begins as the bonding surfaces physically contact each other.

In some embodiments, a thermal treatment is performed after the bonding surfaces are in physical contact. The thermal treatment may strengthen the bonding between the bonded components and the wafer 100, in some cases. The thermal treatment may include a process temperature in the range of about 200° C. to about 400° C., though other temperatures are possible. In some embodiments, the thermal treatment includes a process temperature that is at or above a eutectic point for a material of the conductive connectors 114, the conductive bond pads 115, the connectors 154, and/or the conductive bond pads 164. In this manner, the semiconductor devices 150, the thermal structures 160, and the wafer 100 are bonded using dielectric-to-dielectric bonding and/or metal-to-metal bonding.

Additionally, while specific processes have been described to initiate and strengthen the bonds between the semiconductor devices 150, the thermal structures 160, and the wafer 100, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

Figure 4:
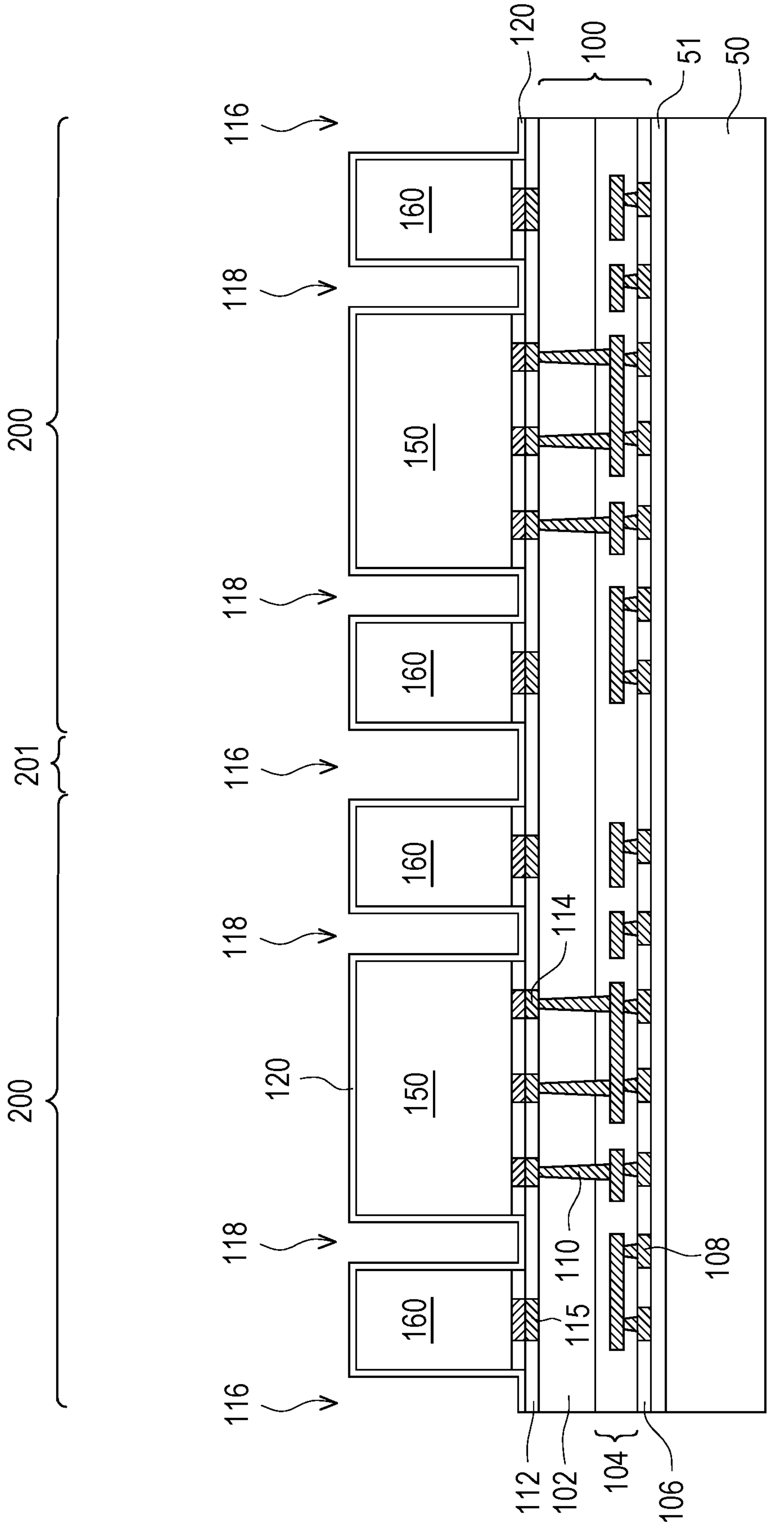

In FIG. 4, a stop layer 120 is deposited over the semiconductor devices 150, the thermal structures 160, and the wafer 100, in accordance with some embodiments. The stop layer 120 may be subsequently used as a planarization stop layer, described in greater detail below for FIG. 7. The stop layer 120 may also be used to protect or isolate the semiconductor devices 150 and the thermal structures 160. In some embodiments, the stop layer 120 may comprise one or more layers of a dielectric material such as silicon nitride, silicon oxynitride, silicon carbide, silicon carbonitride, the like, or a combination thereof. The stop layer 120 may be formed using one or more suitable techniques, such as ALD, PVD, CVD, PECVD, or the like. Other materials or deposition techniques are possible. In some embodiments, the stop layer 120 may be deposited conformally as a blanket layer that extends on top surfaces of the semiconductor devices 150, on top surfaces of the thermal structures 160, on the sidewalls and bottom surfaces of the gaps 116, and on the sidewalls and bottom surfaces of the gaps 118, as shown in FIG. 4. In some embodiments, the stop layer 120 may have a thickness that is in the range of about 50 nm to about 250 nm, though other thicknesses are possible.

Figure 5:
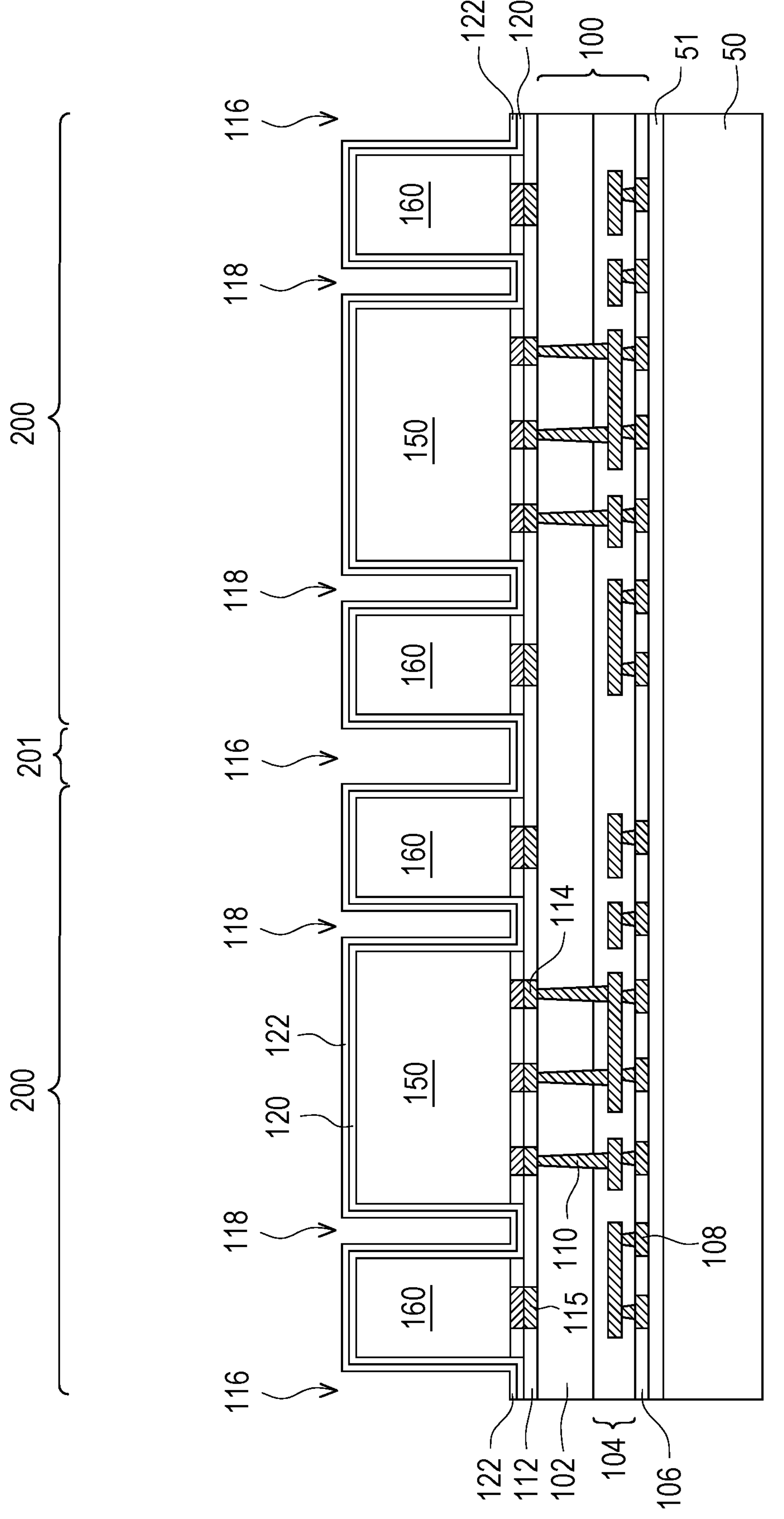

In FIG. 5, a barrier layer 122 is formed over the stop layer 120, in accordance with some embodiments. The barrier layer 122 may comprise a material such as titanium, titanium nitride, tantalum, tantalum nitride, the like, or a combination thereof. The barrier layer 122 may be deposited using one or more suitable techniques, such as ALD, PVD, CVD, PECVD, or the like. Other materials or deposition techniques are possible. In some embodiments, the barrier layer 122 may be deposited conformally as a blanket layer, as shown in FIG. 5. In some embodiments, the barrier layer 122 may have a thickness that is in the range of about 5 nm to about 30 nm, though other thicknesses are possible. The barrier layer 122 may help block diffusion of the metal fill material 124 (see FIG. 6), in some cases.

Figure 6:
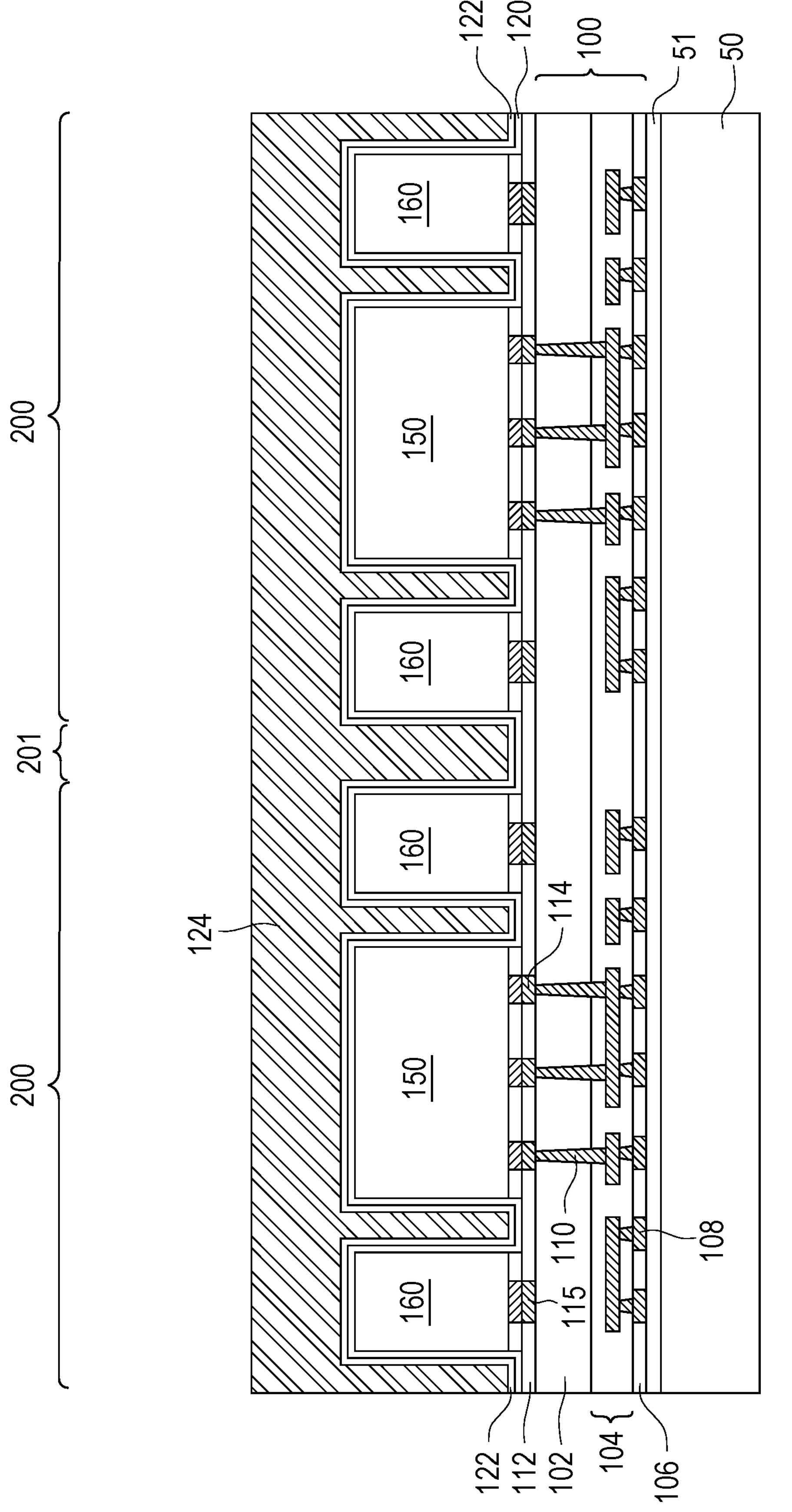
FIGS. 6 and 7 are cross-sectional views of intermediate stages in the manufacturing of thermal metal regions of packages, in accordance with some embodiments.

In FIG. 6, a metal fill material 124 is deposited to fill the gaps 116 and the gaps 118, in accordance with some embodiments. The metal fill material 124 may overfill the gaps 116/118 and may extend over the semiconductor devices 150 and/or the thermal structures 160, in some embodiments. The metal fill material 124 may laterally surround or each of the bonded components (e.g., the semiconductor devices 150 and the thermal structures 160). The metal fill material 124 may comprise one or more materials having a high thermal conductivity, such as materials having a higher thermal conductivity than bulk silicon, molding compound, some dielectrics (e.g., oxides, nitrides, or the like), or other gap-filling materials. For example, the metal fill material 124 may comprise one or more metals, such as copper, copper alloy, titanium, tungsten, aluminum, or the like. Other materials are possible. In some embodiments, the metal fill material 124 is formed by first depositing a seed layer (not separately illustrated) over the barrier layer 122. In some embodiments, the seed layer is a metal layer, which may be a single layer or a composite layer comprising a plurality of sub-layers formed of different materials. The seed layer may be a conductive material and may be blanket deposited over the barrier layer 122 using a suitable process, such as sputtering, evaporation, PVD, or the like. In some embodiments, the seed layer comprises copper. Other materials or techniques are possible. The metal fill material 124 may then be deposited on the seed layer. The metal fill material 124 may be formed, for example, using a plating process, such as an electroplating process or an electroless plating process, or the like. Other deposition techniques are possible.

Figure 7:
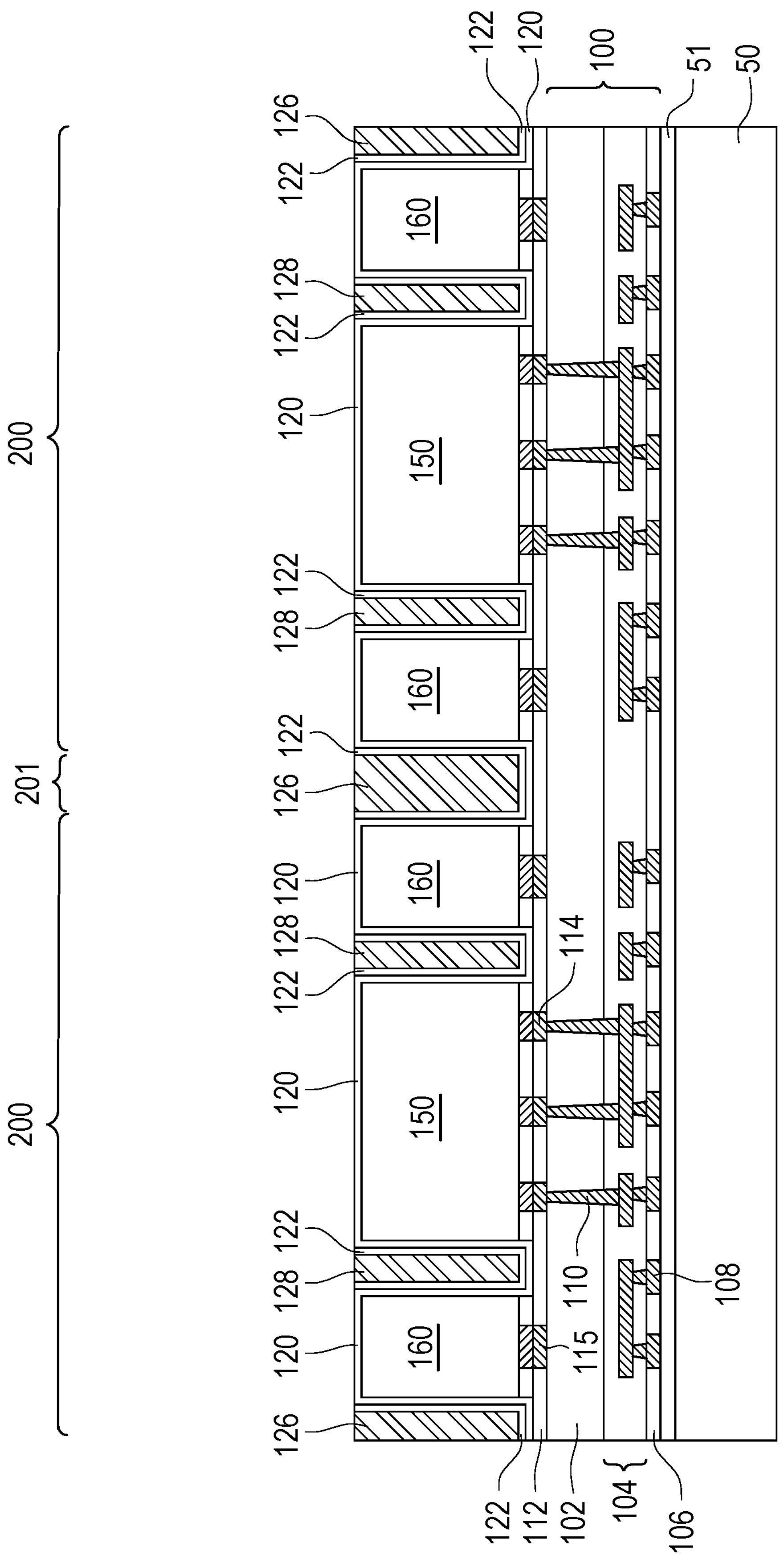

In FIG. 7, a planarization process is performed to remove excess metal fill material 124, in accordance with some embodiments. The planarization process may be, for example, a CMP process, a grinding process, or the like. In some embodiments, the stop layer 120 may be used as a stop layer for the planarization process. For example, the planarization process may remove portions of the metal fill material 124 and barrier layer 122 from over the bonded components, and may expose portions of the stop layer 120 extending over top surfaces of the bonded components. Top surfaces of the bonded components may remain covered by the stop layer 120 after performing the planarization process, in some embodiments. In other embodiments, the planarization process removes portions of the stop layer 120 from over the semiconductor devices 150 and/or the thermal structures 160, which may expose top surfaces of semiconductor devices 150 and/or thermal structures 160.

After performing the planarization process, the remaining portions of the metal fill material 124 at least partially fill the gaps 116 and the gaps 118. In accordance with some embodiments, the remaining portions of the metal fill material 124 and barrier layer 122 in the gaps 118 (e.g., between the bonded components of a package region 200) form thermal metal regions 128, and the remaining portions of the metal fill material 124 and barrier layer 122 in the gaps 116 (e.g., in the scribe regions 201) form scribe metal regions 126. In some embodiments, the thermal metal regions 128 and the scribe metal regions 126 are electrically isolated from circuitry, metallization patterns, metal lines, or the like within the package by the stop layer 120. In some embodiments, the scribe metal regions 126 are subsequently removed and replaced with a scribe fill material 134 (see FIG. 11).

In some embodiments, after performing the planarization process, each bonded component is laterally surrounded by a thermal metal region 128. In some embodiments, a single continuous thermal metal region 128 may surround each bonded component of a package region 200. In some embodiments, after performing the planarization process, top surfaces of the thermal metal regions 128, the scribe metal regions 126, the barrier layer 122, and the stop layer 120 may be substantially coplanar or level. In other embodiments, the top surfaces of the thermal metal regions 128, the scribe metal regions 126, and/or the barrier layer 122 may be higher or lower than top surfaces of the stop layer 120. In some embodiments, the thermal metal regions 128 and the scribe metal regions 126 may have top surfaces that are higher than top surfaces of the bonded components. In some embodiments in which the planarization process exposes top surfaces of the bonded components, top surfaces of the thermal metal regions 128, the scribe metal regions 126, and/or the barrier layer 122 may be substantially coplanar with the top surfaces of the bonded components. In some cases, the top surfaces of the thermal metal regions 128 or the scribe metal regions 126 may be concave (e.g., due to dishing), convex, or substantially flat. In some cases, filling the gaps 116 between bonded components with a material having a high thermal conductivity, such as the metal fill material 124, can allow heat to be more efficiently transferred away from the bonded components or from the wafer 100. In this manner, the use of thermal metal regions 128 as described herein can improve the thermal dissipation efficiency of a package or device, which can allow for improved reliability or improved operation.

Figure 8:
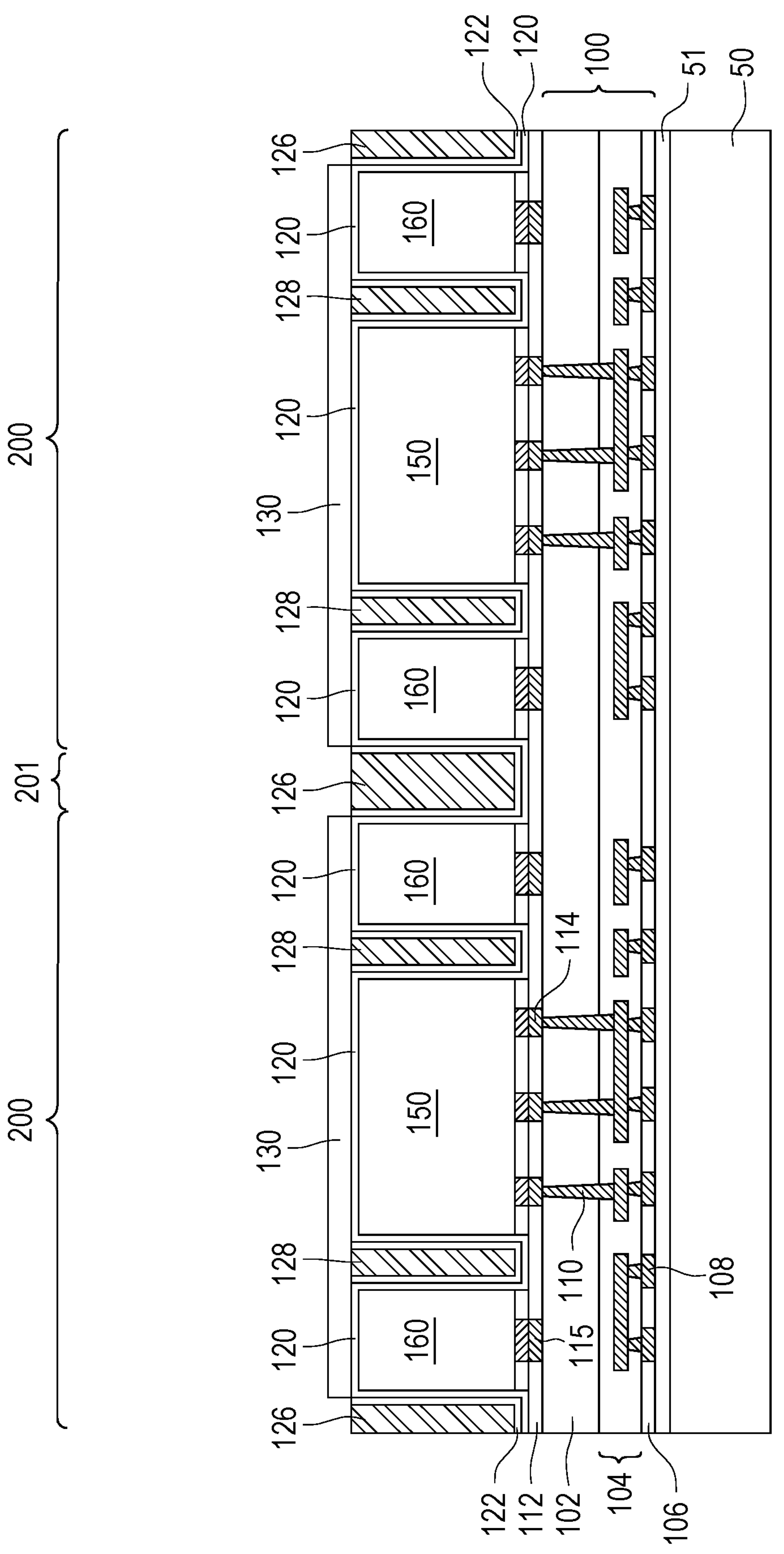
FIGS. 8, 9, 10, 11, and 12 are cross-sectional views of intermediate stages in the manufacturing of scribe fill regions of packages, in accordance with some embodiments.

In FIG. 8, a mask layer 130 is formed and patterned, in accordance with some embodiments. The mask layer 130 may be deposited over the top surfaces of the thermal metal regions 128, the scribe metal regions 126, and the stop layer 120. In some embodiments, the mask layer 130 may be a material that allows for selective etching of the barrier layer 122 and the metal fill material 124. For example, in some embodiments, the mask layer 130 may comprise amorphous carbon. The mask layer 130 may be deposited using a suitable technique, such as by spin coating, PECVD, CVD, PVD, ALD, or the like. Other materials or techniques are possible.

After depositing the mask layer 130, openings may be patterned in the mask layer 130 to expose the scribe metal regions 126. In some cases, the openings may partially or fully overlap the scribe regions 201. The mask layer 130 may be patterned using suitable photolithography and etching techniques. For example, a photoresist (not shown) may be formed over the mask layer 130 and then patterned. The photoresist can be formed by using a spin-on technique and can be patterned using acceptable photolithography techniques. The pattern of the photoresist corresponds to the subsequently formed openings in the mask layer 130. The openings in the mask layer 130 may then be formed by etching the mask layer 130 using the patterned photoresist as an etching mask. The mask layer 130 may be etched using a suitable etching process, which may include a wet etching process and/or a dry etching process. In some embodiments, the photoresist is then removed using a suitable process, such as an etching process that selectively removes the photoresist. In other embodiments, the photoresist is left remaining on the mask layer 130 after forming the openings in the mask layer 130. Other techniques for patterning the mask layer 130 are possible.

Figure 9:
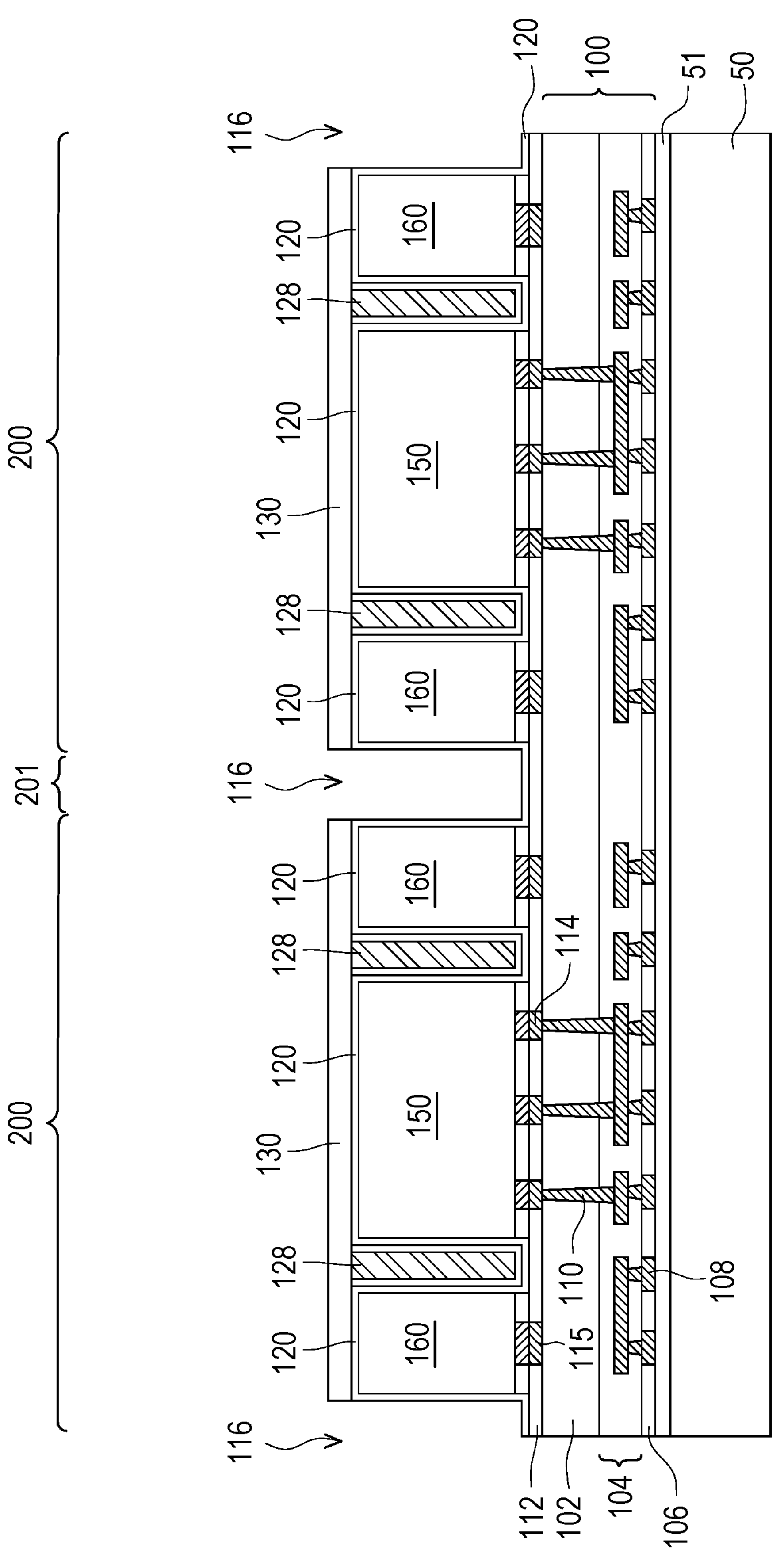

In FIG. 9, an etching process is performed to remove the scribe metal regions 126 from the gaps 116, in accordance with some embodiments. The etching process etches the portions of the scribe metal regions 126 exposed by the openings in the mask layer 130, while the portions of the mask layer 130 covering the thermal metal regions 128 protect the thermal metal regions 128 from being etched by the etching process. In some embodiments, the etching process selectively etches the materials of the scribe metal regions 126. For example, the etching process may etch the metal fill material 124 and the barrier layer 122 of the scribe metal regions 126 without significantly etching the mask layer 130 or the stop layer 120. In this manner, after performing the etching process, portions of the stop layer 120 that cover sidewalls and bottom surfaces of the gaps 116 are exposed.

The etching process may include a single etching step or may include multiple etching steps. The etching steps may include wet etching steps and/or dry etching steps. For example, in some embodiments, the etching process may include performing a first etching step that etches the metal fill material 124 and then performing a second etching step that etches the barrier layer 122. For example, in some embodiments in which the metal fill material 124 comprises copper, a wet etch comprising sulfuric acid ($H_2SO_4$) and hydrogen peroxide ($H_2O_2$) may be used to remove the metal fill material 124. A wet etch comprising ammonium hydroxide (NH4OH) and hydrogen peroxide ($H_2O_2$) may then be used to remove the barrier layer 122. In other embodiments, a single etching step may remove both the metal fill material 124 and the barrier layer 122. These are examples, and other etches or etching steps may be used in other embodiments.

Figure 10:
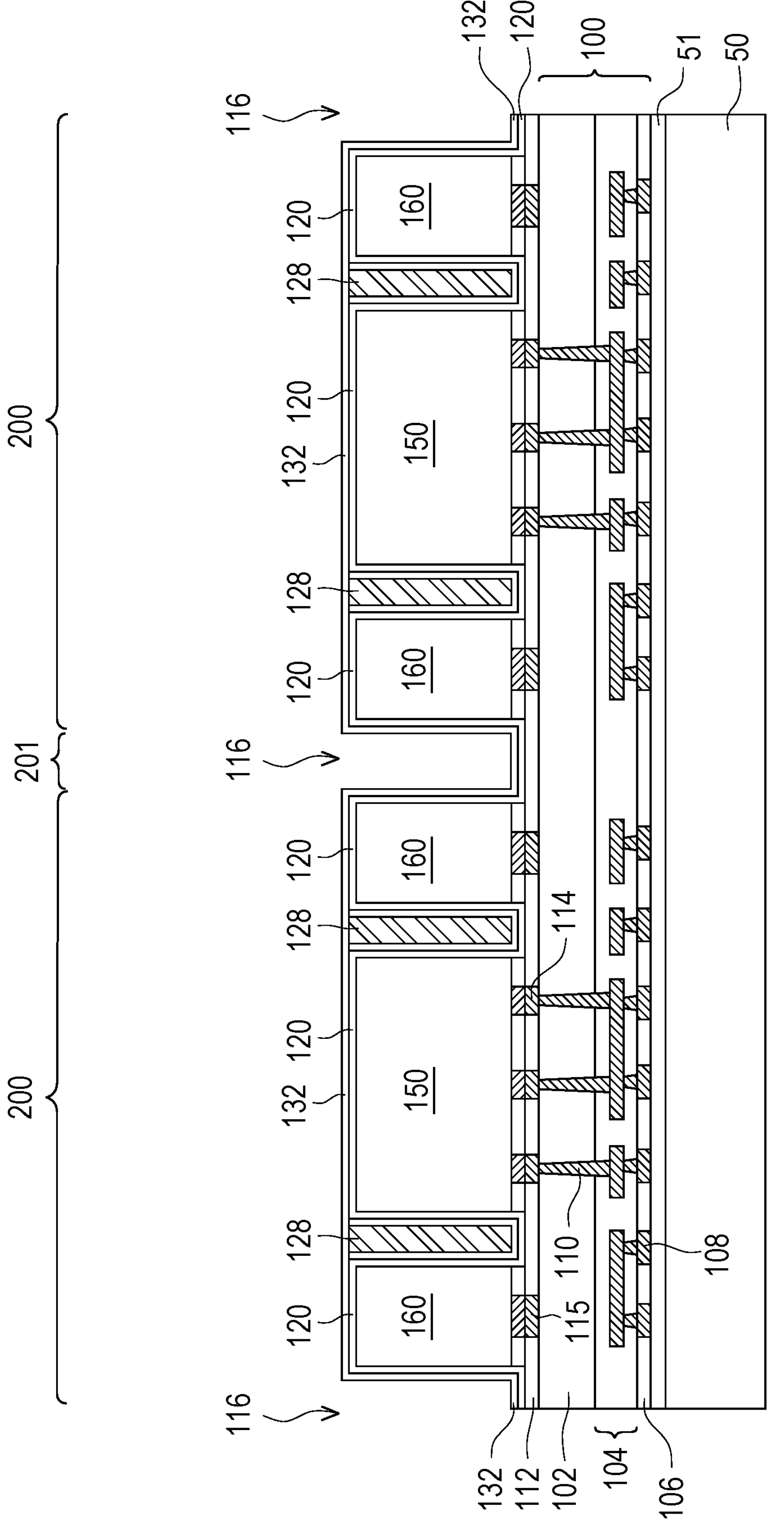

In FIG. 10, the mask layer 130 is removed and a protection layer 132 is deposited over the stop layer 120 and the thermal metal regions 128, in accordance with some embodiments. The mask layer 130 may be removed using a suitable process, such as using a dry etching process, an ashing process, or the like. The protection layer 132 may then be deposited, for example, to protect or isolate the thermal metal regions 128. In some embodiments, the protection layer 132 may be deposited conformally as a blanket layer that extends on exposed surfaces of the stop layer 120 and on exposed surfaces of the thermal metal regions 128. As shown in FIG. 10, the protection layer 132 may extend on the sidewalls and bottom surfaces of the gaps 116. In some embodiments, the protection layer 132 may include one or more materials similar to those described above for the stop layer 120. For example, the protection layer 132 may be formed of silicon nitride, silicon oxynitride, silicon carbonitride, the like, or a combination thereof. The protection layer 132 may be formed using one or more suitable techniques, such as ALD, PVD, CVD, PECVD, or the like. Other materials or deposition techniques are possible. In some embodiments, the protection layer 132 may have a thickness that is in the range of about 50 nm to about 250 nm, though other thicknesses are possible.

Figure 11:
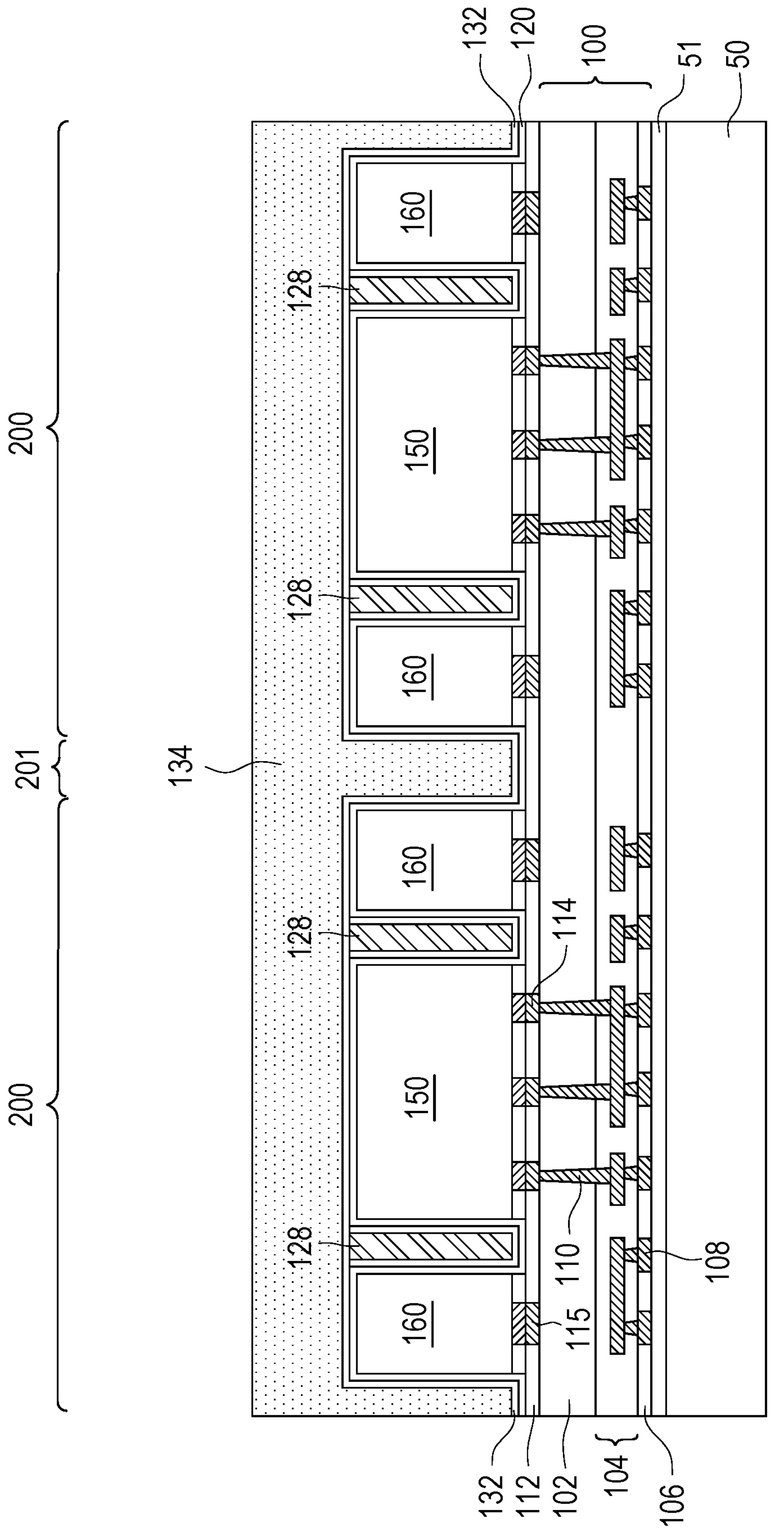

In FIG. 11, scribe fill material 134 is deposited over the protection layer 132 and within the gaps 116. As shown in FIG. 11, the scribe fill material 134 fills or overfills the gaps 116. The scribe fill material 134 may surround each package region 200, in some cases. In some embodiments, the scribe fill material 134 may be a non-metallic material. For example, the scribe fill material 134 may include one or more materials such as a glass (e.g., phosphosilicate Glass (PSG), borosilicate glass (BSG), boron-doped phosphosilicate glass (BPSG), undoped silicate glass (USG), spin-on glass (SOG), or the like), silicon oxide, a molding compound, the like, or a combination thereof. Other materials are possible. In some embodiments, the scribe fill material 134 may have a Young's modulus in the range of about 50 GPa to about 150 GPa or a coefficient of thermal expansion (CTE) in the range of about 2 ppm/° C. to about 10 ppm/° C., though other values are possible. In some cases, the choice of scribe fill material 134 may be based on the dimensions or proportions of the gaps 116. For example, in some cases, some materials may more reliably fill a gap 116 that has a large depth or a small aspect ratio (e.g., width: depth) than other materials. As a non-limiting example, in some embodiments, a SOG may be used for gaps 116 having a depth less than about 600 μm or an aspect ratio greater than about 2:1, and a molding compound may be used for gaps 116 having a depth greater than about 100 μm or an aspect ratio less than about 3:10. The scribe fill material 134 may be formed, for example, by spin coating, a molding process, a suitable deposition process, or the like. Other materials, depths, aspect ratios, or deposition techniques are possible.

Figure 12:
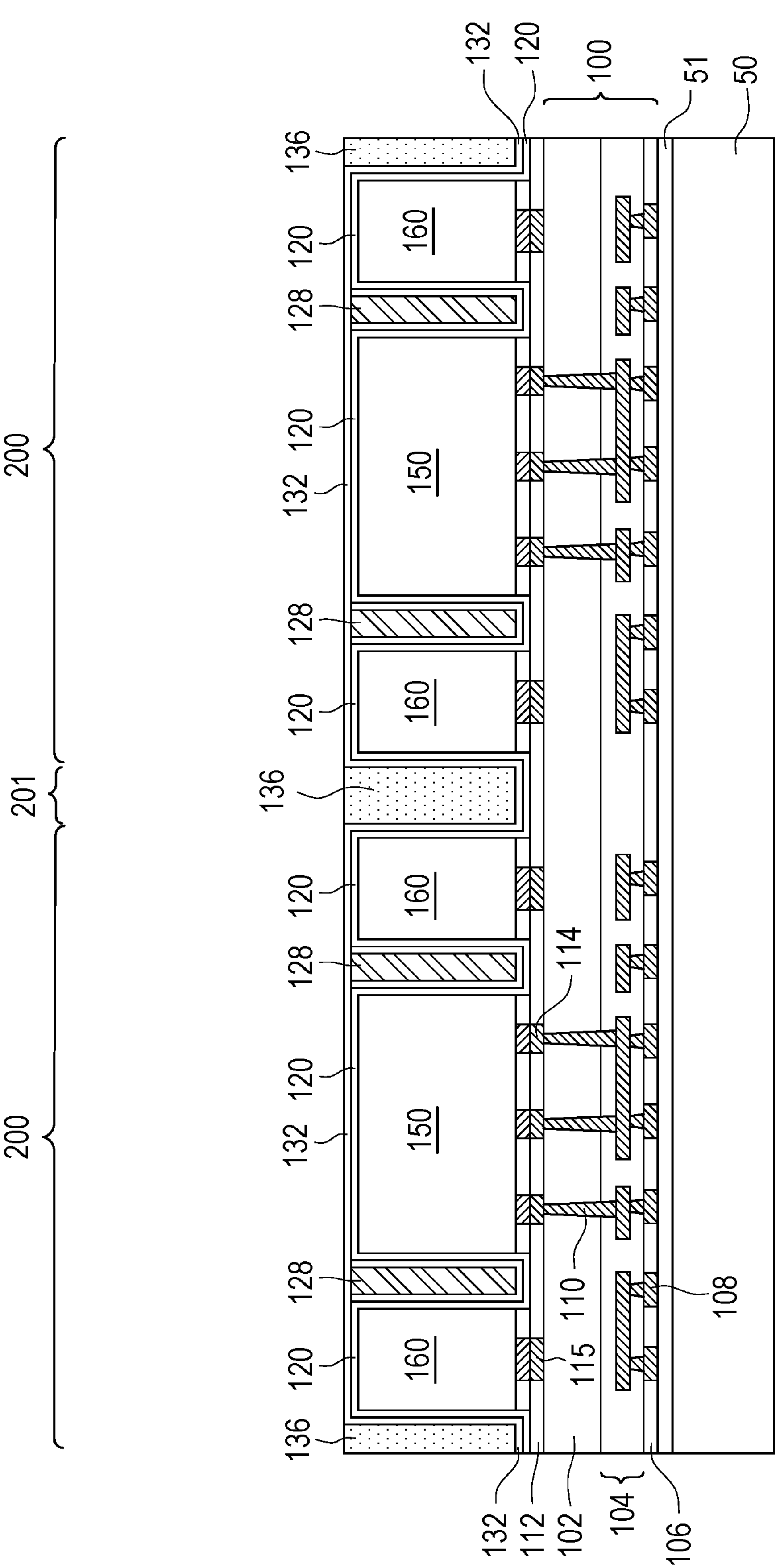

In FIG. 12, a planarization process is performed to remove excess scribe fill material 134 and form scribe fill regions 136, in accordance with some embodiments. The planarization process may be, for example, a CMP process, a grinding process, or the like. In some embodiments, the planarization process may remove portions of the scribe fill material 134 that extend over the bonded components. In some cases, a scribe fill region 136 may surround each package region 200. In some embodiments, the protection layer 132 may be used as a stop layer for the planarization process. For example, the planarization process may remove portions of the scribe fill material 134 from over the bonded components, and may expose portions of the protection layer 132 extending over top surfaces of the bonded components. Top surfaces of the bonded components may remain covered by the protection layer 132 after performing the planarization process, in some embodiments. In some embodiments, after performing the planarization process, top surfaces of the scribe fill regions 136 and the protection layer 132 may be substantially coplanar or level. In other embodiments, the top surfaces of the scribe fill regions 136 may be higher or lower than top surfaces of the protection layer 132. In some cases, the top surfaces of the protection layer 132 may be concave (e.g., due to dishing), convex, or substantially flat. In this manner, scribe fill regions 136 may be formed in the scribe regions 201. In some cases, replacing the scribe metal regions 126 with scribe fill regions 136 as described herein can allow for improved singulation of the package regions 200 along the scribe regions 201, described in greater detail below for FIG. 15. The process steps described in FIGS. 4-12 for forming thermal metal regions 128 and scribe fill regions 136 is an example, and the thermal metal regions 128 and scribe fill regions 136 may be formed using other process steps in other embodiments. Some example process steps for forming thermal metal regions 128 and scribe fill regions 136 according to other embodiments are described below for FIGS. 30-41.

Figure 13:
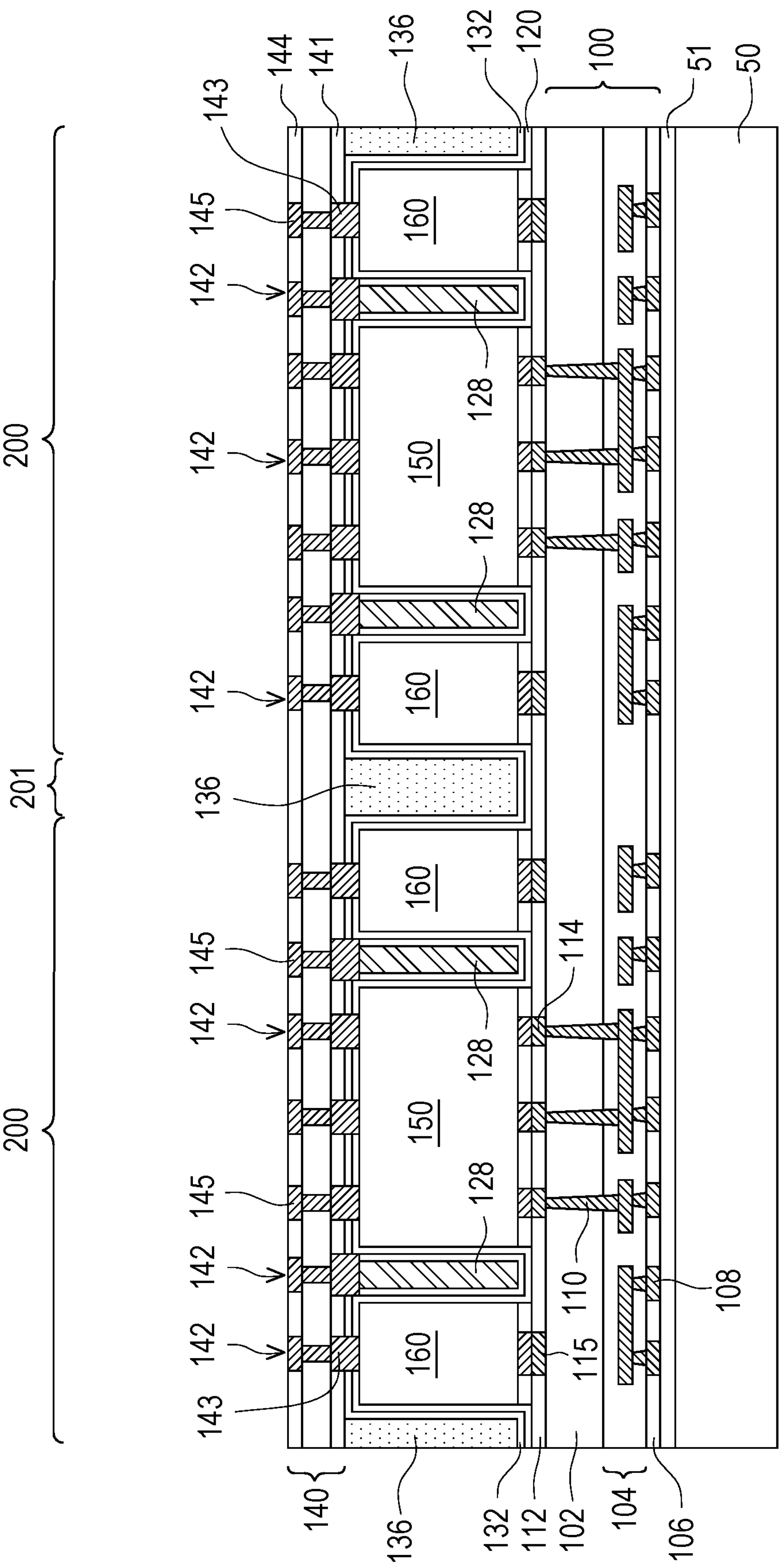
FIGS. 13, 14, and 15 are cross-sectional views of intermediate stages in the manufacturing of packages, in accordance with some embodiments.

Turning to FIG. 13, a thermal interconnect structure 140 is formed over the bonded components (e.g., the semiconductor devices 150 and the thermal structures 160) and the thermal metal regions 128, in accordance with some embodiments. The thermal interconnect structure 140 is an optional structure comprising one or more thermal vias 142 formed in one or more dielectric layers. The thermal vias 142 may be, for example, metal features formed over the bonded components and over the thermal metal regions 128 that facilitate the transfer of heat away from the bonded components and thermal metal regions 128. In some embodiments, the thermal vias 142 may make physical contact with the bonded components and/or the thermal metal regions 128, which can improve the transfer of heat away from the bonded components and/or the thermal metal regions 128. In some cases, the semiconductor devices 150 or the thermal structures 160 may comprise metal features (e.g., vias or the like) that facilitate heat dissipation, and the thermal vias 142 may physically contact these metal features. The thermal interconnect structure 140 and thermal vias 142 shown in FIG. 13 are examples, and in other embodiments, the thermal interconnect structure 140 may have a different number of dielectric layers or the thermal vias 142 may have a different configuration, shape, size, number, or arrangement. These and other such variations are considered within the scope of the present disclosure.

The dielectric layers of the thermal interconnect structure 140 may be formed of one or more dielectric materials, which may be similar to those described previously for the stop layer 120, the scribe fill material 134, the wafer bonding layer 112, or the dielectric layer 106. The various dielectric layers of the thermal interconnect structure 140 may be formed of a similar material or may include layers formed of different materials. For example, in some embodiments, the dielectric layers of the thermal interconnect structure may comprise silicon oxide, silicon nitride, glass (e.g., SOG, USG, or the like), polymer, molding compound the like, or a combination thereof. The dielectric layers may be formed using suitable techniques, such as by spin coating, PECVD, CVD, PVD, ALD, or the like. Other materials or deposition techniques are possible. In some embodiments, the topmost dielectric layer of the interconnect structure 140 may be used for bonding the thermal interconnect structure 140 to other structures (e.g., the support structure 250, described below). For example, the topmost dielectric layer of the interconnect structure 140 may be used for a bonding process such as direct bonding, fusion bonding, dielectric-to-dielectric bonding, oxide-to-oxide bonding, or the like. Accordingly, the topmost dielectric layer of the interconnect structure 140 is shown in FIG. 13 as bonding layer 144.

The thermal vias 142 may be formed using any suitable techniques, such as damascene, dual damascene, or the like. The thermal vias 142 may be formed using a single metal deposition step, or may be formed using multiple metal deposition steps. For example, in some embodiments, the thermal vias 142 may be formed by repeatedly depositing a dielectric layer, forming openings that extend through that dielectric layer, and then depositing a metal material into the openings to form a "via layer" of metal material. In this manner, thermal vias 142 may be formed of a stack of via layers, such as the thermal vias 142 shown in FIG. 13. In other embodiments, the thermal vias 142 may be formed by forming openings that extend through multiple dielectric layers and then depositing metal material into the openings. Other process steps for forming the thermal vias 142 are possible.

As a non-limiting example of forming the thermal interconnect structure 140, a first dielectric layer 141 may be deposited over top surfaces of the protection layer 132 and the scribe fill regions 136. The first dielectric layer 141 may be a material similar to or different than the material of the underlying protection layer 132. Openings may then be formed extending through the first dielectric layer 141, the protection layer 132, and the stop layer 120. In some embodiments, the openings may expose top surfaces of one or more semiconductor devices 150, thermal structures 160, and/or thermal metal regions 128. In other embodiments, top surfaces of one or more semiconductor devices 150, thermal structures 160, and/or thermal metal regions 128 remain covered by the stop layer 120 and/or the protection layer 132 after forming the openings. The openings may be formed using acceptable photolithography and etching techniques, such as by forming and patterning a photoresist and then performing an etching process using the patterned photoresist as an etching mask. The etching process may include, for example, a dry etching process and/or a wet etching process.

Metal material may then be deposited in the openings in the first dielectric layer 141 to form first via layers 143. The first via layers 143 may physically contact one or more semiconductor devices 150, thermal structures 160, and/or thermal metal regions 128, in some embodiments. The first via layers 143 may be formed using materials and techniques similar to those described previously for the conductive connectors 114 and the conductive bond pads 115 (see FIG. 2), in some embodiments. For example, the first via layers 143 may comprise a barrier layer, a seed layer, a fill metal, or a combination thereof. In some embodiments, excess material of the fill metal, the seed layer, and the barrier layer may be removed using, for example, a planarization process such as a CMP process. After the planarization process, top surfaces of the first via layers 143 and the first dielectric layer 141 may be substantially level or coplanar, in some cases.

Additional dielectric layers and via layers may be formed over the first dielectric layer 141 and the first via layers 143 to form the thermal interconnect structure 140 and the thermal vias 142, in accordance with some embodiments. The additional dielectric layers and vias layers may be formed using materials or techniques similar to those for forming the first dielectric layer 141 and the first via layers 143. For example, a dielectric layer may be deposited over via layers, openings formed in the dielectric layer to expose the underlying via layers, and then metal material deposited in the openings to form additional via layers. This process may be repeated a desired number of times to form a desired number of dielectric layers and via layers. This is an example, and any suitable manufacturing processes for forming a thermal interconnect structure 140 are fully intended to be included within the scope of the embodiments.

As described previously, the topmost dielectric layer of the thermal interconnect structure 140 may be a bonding layer 144 that is subsequently used for bonding. Similarly, the topmost via layers of the thermal vias 142 may be used for bonding the thermal interconnect structure 140 to other structures (e.g., the support structure 250, described below). For example, the topmost via layers of the thermal vias 142 may be used for a bonding process such as direct bonding, fusion bonding, metal-to-metal bonding, or the like. Accordingly, the topmost via layers of the thermal interconnect structure 140 are shown in FIG. 13 as bonding pads 145.

Figure 14:
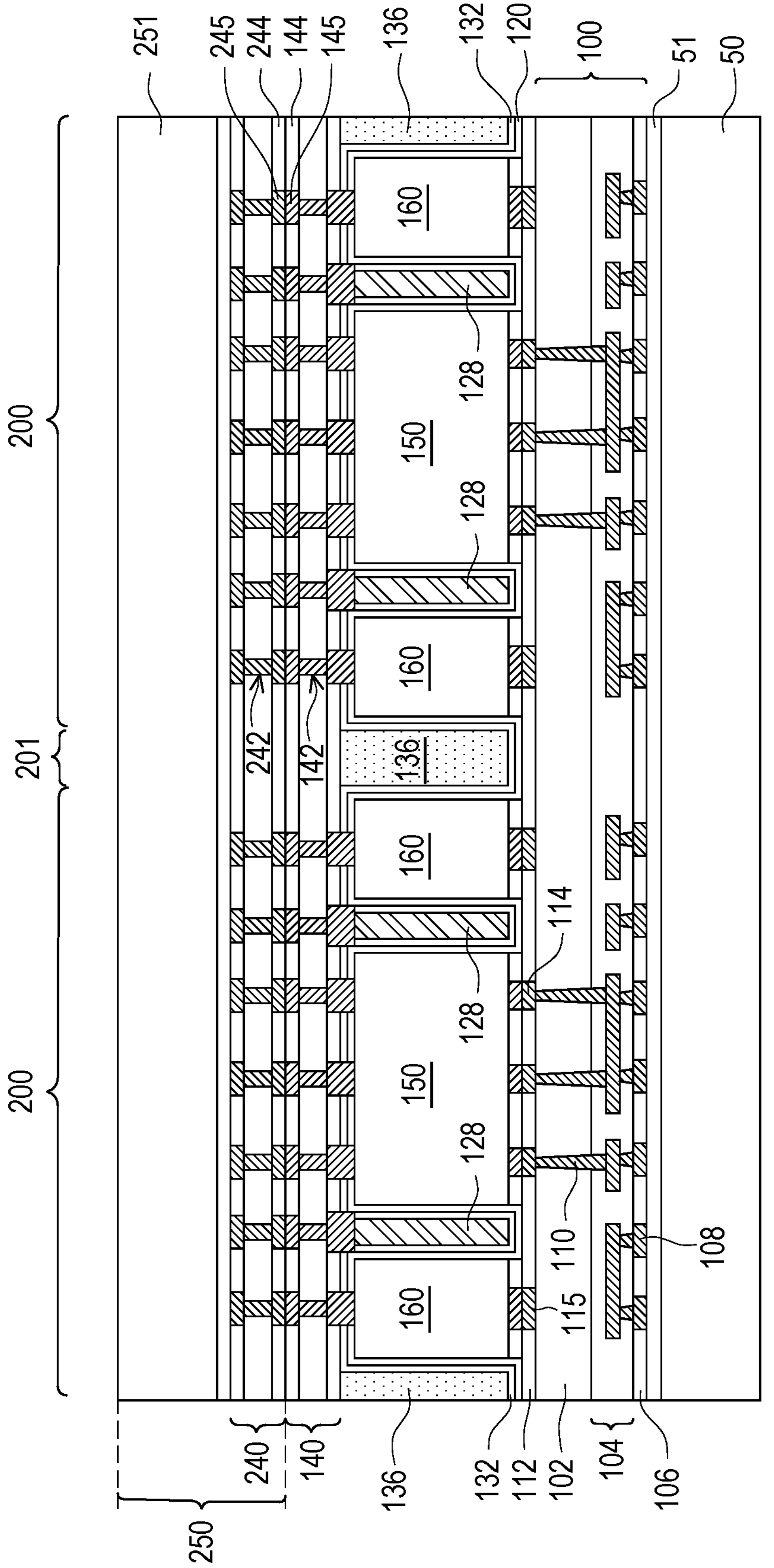

FIG. 14 illustrates the bonding of a support structure 250 to the thermal interconnect structure 140, in accordance with some embodiments. The support structure 250 may be bonded to the thermal interconnect structure 140 to provide structural support and to facilitate heat dissipation for the bonded structures and the wafer 100. The support structure 250 shown in FIG. 14 is an example, and the support structure 250 may have different layers, different features, or a different configuration in other embodiments. In some embodiments, the support structure 250 includes a support substrate 251 and a thermal interconnect structure 240 formed on the support structure. In other embodiments, the support structure 250 is omitted. In other embodiments, the thermal interconnect structures 140 and/or 240 are omitted, and an example embodiment is described below for FIG. 19.

The support substrate 251 may be, for example, a semiconductor material such as silicon (e.g., bulk silicon, a silicon wafer, or the like), a glass material, a ceramic material, a metal material, or the like. Other materials are possible. The thermal interconnect structure 240 may comprise one or more dielectric layers and one or more thermally conductive (e.g. metallic) features, and may be generally similar to the thermal interconnect structure 140 in some embodiments. For example, the thermal interconnect structure 240 may include thermal vias 242 formed in one or more dielectric layers. The thermal vias 242 may include bonding pads 243 formed in a bonding layer 244, which may be similar to the bonding pads 145 and the bonding layer 244 of the thermal interconnect structure 140, respectively. For example, the bonding layer 244 may be used for a bonding process such as direct bonding, fusion bonding, dielectric-to-dielectric bonding, oxide-to-oxide bonding, or the like. The bonding layer 244 may be formed using materials or techniques similar to those described previously for the bonding layer 144. The bonding pads 243 may be used for a bonding process such as direct bonding, fusion bonding, metal-to-metal bonding, or the like. The bonding pads 243 may be formed using materials or techniques similar to those described previously for the bonding pads 243. The support structure 250 shown in FIG. 14 is an illustrative example, and in other embodiments, the interconnect structure 240 may be different than the interconnect structure 140, or may have a different number or a different configuration of thermal vias 242 than shown.

In some embodiments, the thermal interconnect structure 240 of the support structure 250 may be bonded to the thermal interconnect structure 140 using direct bonding. For example the bonding layer 144 and the bonding layer 244 may be directly bonded together, and bonding pads 145 may be directly bonded to corresponding bonding pads 243. The bonding process may include techniques similar to those described previously, such as for bonding the semiconductor devices 150 to the wafer 100. For example, an activation process may first be performed on the bonding surfaces of the thermal interconnect structure 140 and the thermal interconnect structure 240. The support bonding layer 151 may then be placed into contact with the package bonding layer 131. In some cases, the bonding process between the bonding surfaces begins as the bonding surfaces physically contact each other. In some embodiments, a thermal treatment is performed after the bonding surfaces are in physical contact. The thermal treatment may include a process temperature in the range of about 200° C. to about 400° C., though other temperatures are possible. In some cases, bonding the support structure 250 to the thermal interconnect structure 140 can provide additional volume and pathways for the diffusion of heat. In some cases, directly bonding the thermal vias 142 to the thermal vias 242 as described herein can allow more efficient transfer of heat away from the semiconductor devices 150 and the wafer 100.

Figure 15:
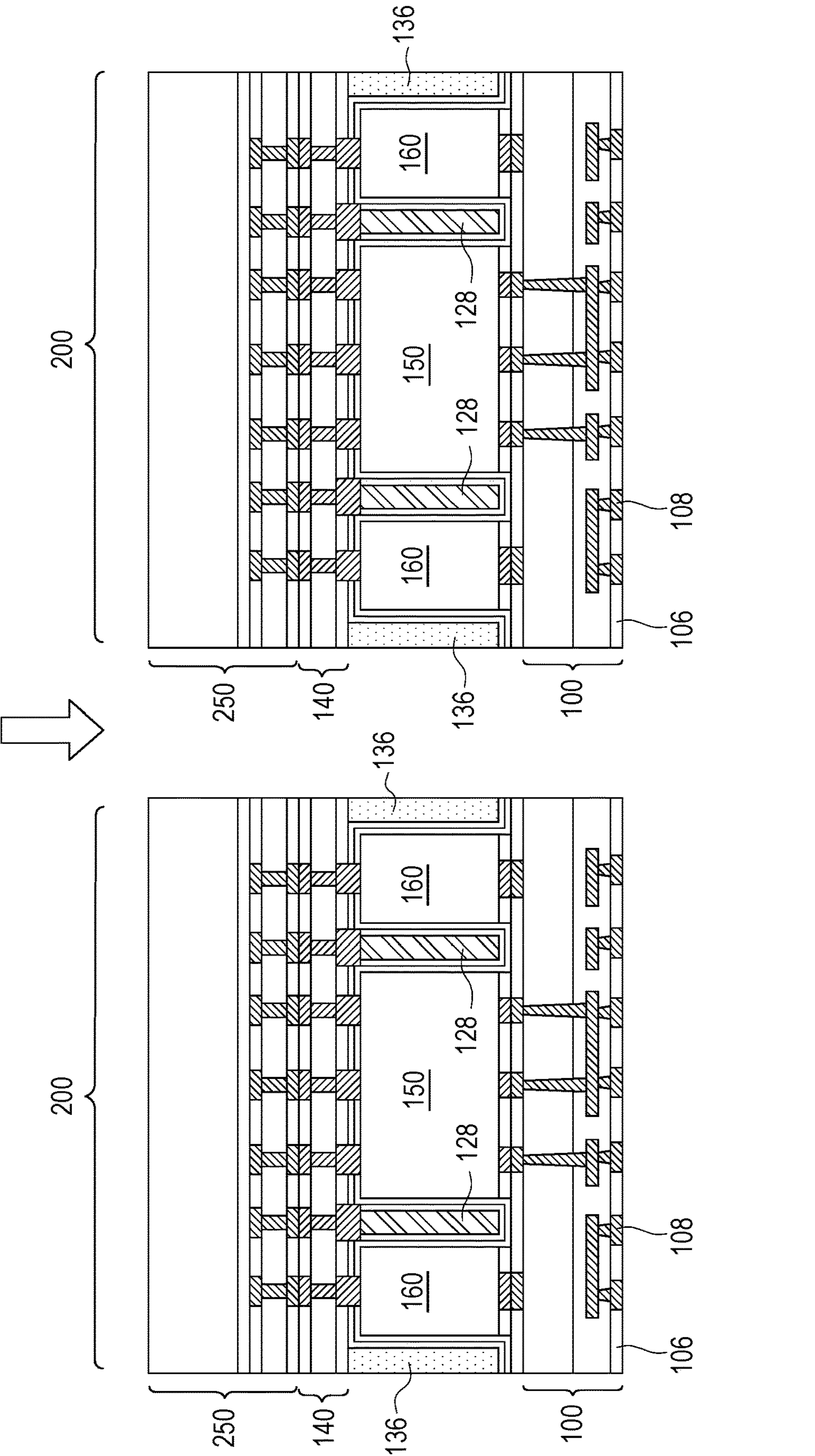

In FIG. 15, the carrier substrate 50 is removed and a singulation process is performed to form individual packages 200, in accordance with some embodiments. The carrier substrate 50 may be removed using a suitable process, such as using a CMP process and/or an etching process. The bonding layer 51 may also be removed using a suitable process, such as a CMP process and/or an etching process. After removing the bonding layer 51, surfaces of the dielectric layer 106 and the conductive connectors 108 may be exposed. In some embodiments, the bonding layer 51 is removed after performing the singulation process.

The singulation process is performed by cutting along scribe regions 201 (e.g., around the package regions 200) to singulate the structures formed in the package regions 200 into individual packages 200. The singulation process may include sawing, dicing, a laser cutting process, or the like. The singulation process may cut through the scribe fill regions 136, and portions of the scribe fill regions 136 may be exposed by the singulation process. After performing the singulation process, the scribe fill regions 136 may have exposed sidewall surfaces. In other embodiments, the singulation process removes the scribe fill regions 136. As a result of the singulation process, sidewall surfaces of the wafer 100, scribe fill regions 136, the thermal interconnect structure 140, and/or the support structure 250 may be laterally coterminous (within process variations).

In some cases, forming scribe fill regions 136 in the scribe regions 201 can have advantages. For example, the relatively hard material of the scribe fill regions 136, (e.g., SOG or the like) may be easier to saw through than the relatively soft metal material of the scribe metal regions 126 (e.g., copper or another metal). Thus, replacing the scribe metal regions 126 with the scribe fill region 136 can allow for more efficient and reproducible singulation. Additionally, the material of the scribe fill regions 136 may be less prone to cracking or damage during a singulation process than the material of the scribe metal regions 126. In some cases, voids may form within the scribe metal regions 126, or the gaps 116 may be incompletely filled when forming the scribe metal regions 126. By replacing the scribe metal regions 126 with the scribe fill regions 136, damage or defects due to voids or incomplete filling may be avoided, particularly during the singulation process. In this manner, the techniques described herein allow for the formation of thermal metal regions 128 that can improve heat dissipation, while also preventing some problems from occurring during singulation by forming scribe fill regions 136. In this manner, the operation and yield of packages 200 can be improved.

Figure 16:
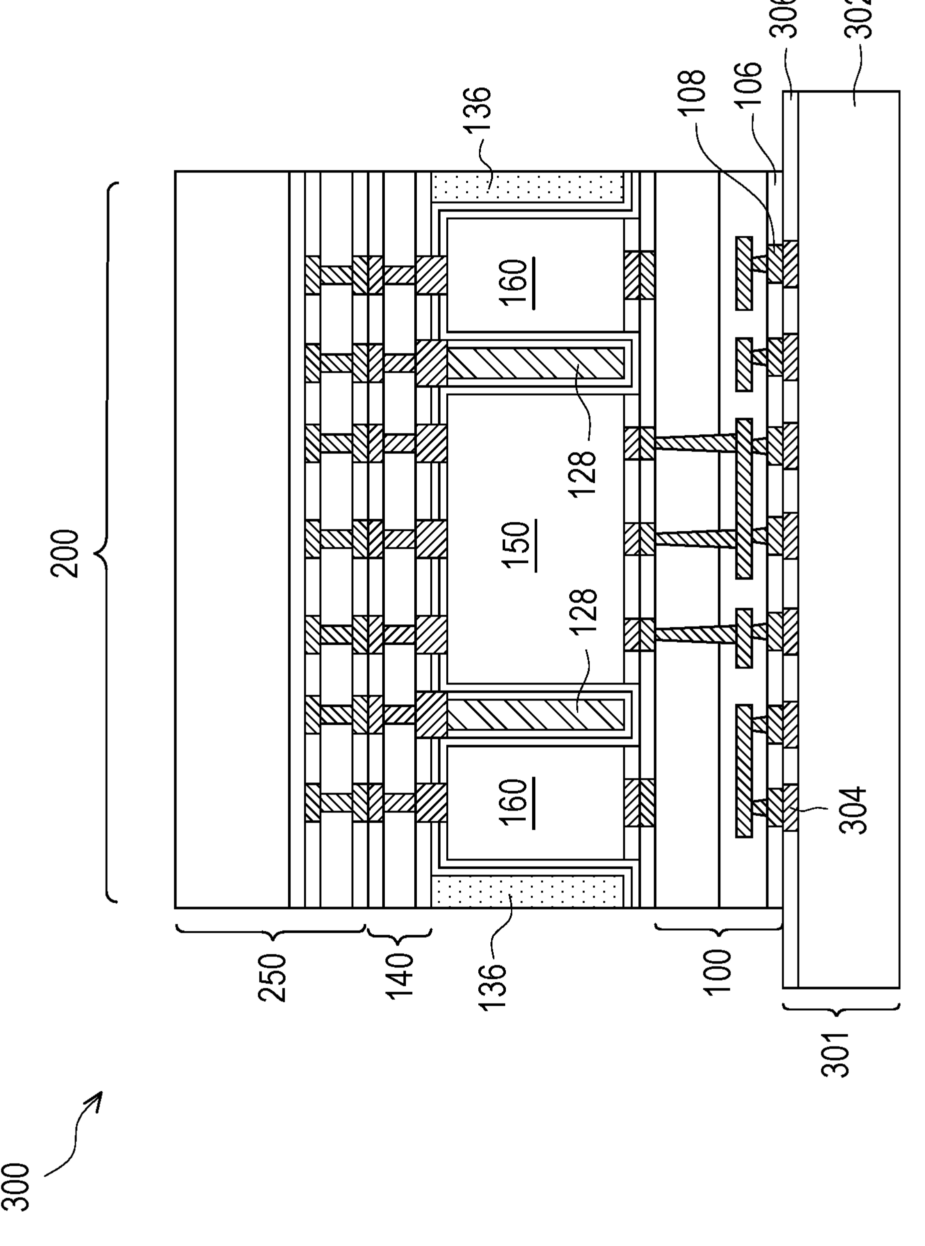
FIG. 16 is a cross-sectional view of an intermediate stage in the formation of a package structure, in accordance with some embodiments.
Figure 17:
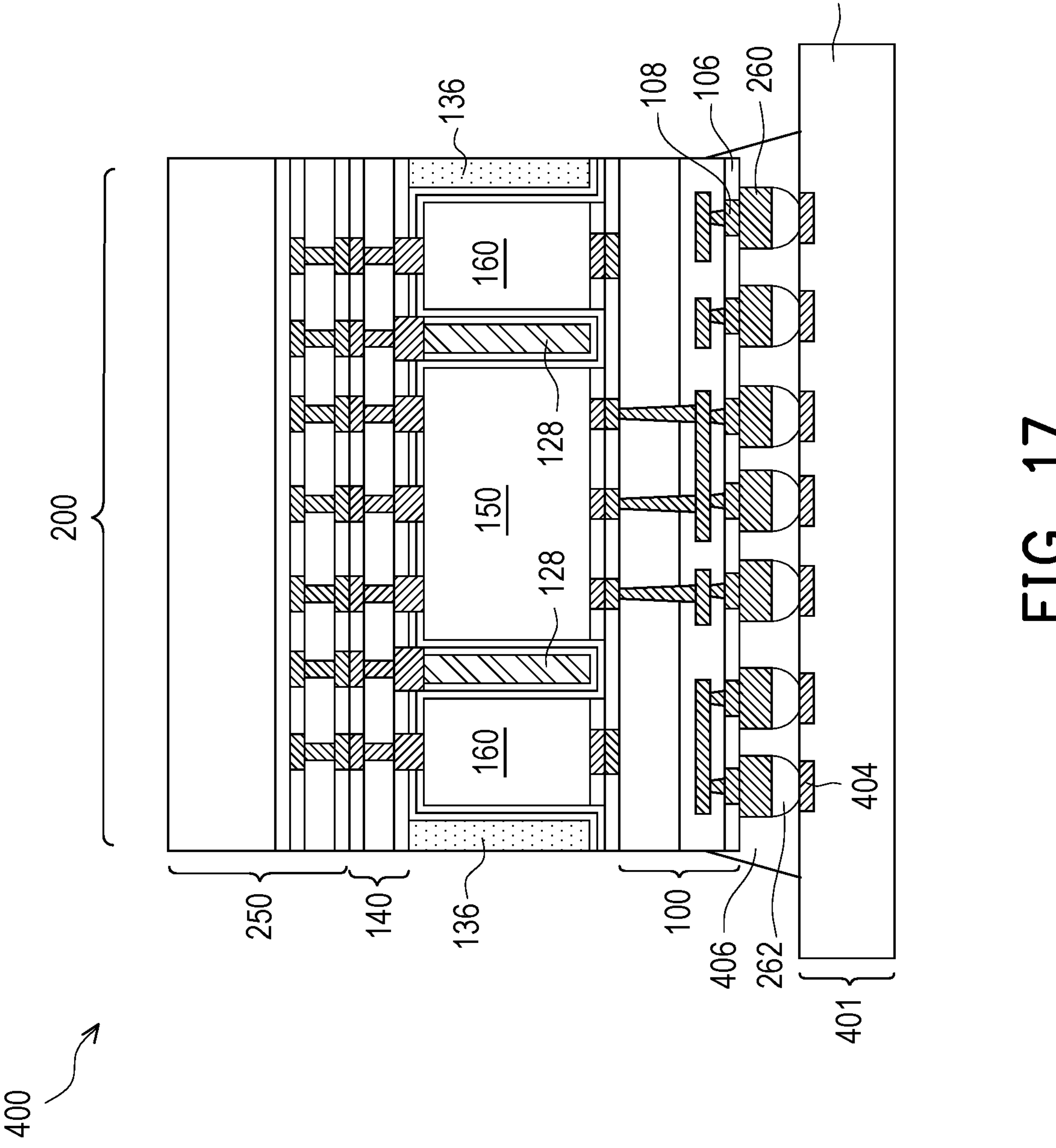
FIG. 17 is a cross-sectional view of an intermediate stage in the formation of a package structure, in accordance with some embodiments.

FIGS. 16 and 17 illustrate example package structures 300 and 400 that incorporate a package 200, in accordance with some embodiments. The package structures 300 and 400 are illustrative examples, and other package structures that incorporate a package 200 are possible. The package 200 may be incorporated into a package structure such as a System-on-Integrated-Chip (SoIC), Chip-on-Wafer-on-Substrate (CoWoS), Integrated Fan-Out (InFO), or the like. All suitable package structures or variations thereof of considered within the scope of the present disclosure.

FIG. 16 illustrates a package structure 300 that includes a package structure 200 bonded to a package substrate 301, in accordance with some embodiments. The package substrate 301 may comprise, for example, a substrate 302, a bonding layer 306 formed on the substrate 302, and bonding pads 304 formed in the bonding layer 306. The substrate 302 may be made of a semiconductor material such as silicon, germanium, or the like. Other semiconductor materials are possible. Additionally, the substrate 302 may be an semiconductor-on-insulator (SOI) substrate or a buried oxide (BOX) substrate. The substrate 302 may comprise other materials, such as PCB materials, organic materials, build-up films, laminates, the like, or another material. The substrate 302 may include active or passive devices (not shown), or may be substantially free of active or passive devices. The substrate 302 may also include metallization layers and vias (not shown), with the bond pads 304 being physically and/or electrically coupled to the metallization layers and vias. In other embodiments, surface mount devices (SMDs), integrated passive devices (IPDs), or the like may also be connected to the package substrate 301.

The bonding layer 306 of the package structure 301 may be a dielectric material that is bonded to the dielectric layer 106 of the package 200 using a bonding process such as direct bonding, fusion bonding, dielectric-to-dielectric bonding, oxide-to-oxide bonding, or the like. Accordingly, the bonding layer 306 may be a suitable material such as those described previously for the dielectric layer 106, the bonding layer 144, or the like. The bonding pads 304 may be a conductive material that is bonded to the conductive connectors 108 of the package 200 using a bonding process such as direct bonding, fusion bonding, metal-to-metal bonding, or the like. Accordingly, the bonding pads 304 may be a suitable material such as those described previously for the conductive connectors 108, the bonding pads 145, or the like. The conductive connectors 108 may make physical and electrical connection to the bonding pads 304. In this manner, the bonding of the package 200 to the package substrate 301 may include a combination of dielectric-to-dielectric bonding and metal-to-metal bonding (e.g., "hybrid bonding").

The bonding process may include techniques similar to those described previously, such as for bonding the semiconductor devices 150 to the wafer 100. For example, an activation process may first be performed on the bonding surfaces of the package 200 and the package substrate 301. The package 200 may then be placed into contact with the package substrate 301. In some cases, the bonding process between the bonding surfaces begins as the bonding surfaces physically contact each other. In some embodiments, a thermal treatment is performed after the bonding surfaces are in physical contact. The thermal treatment may include a process temperature in the range of about 200° C. to about 400° C., though other temperatures are possible. Other bonding techniques are possible.

FIG. 17 illustrates a package structure 400 that incorporates a package 200, in accordance with some embodiments. The package structure 400 is similar to the package structure 300 shown in FIG. 16, except that the package 200 is attached to a package substrate 401 using conductive connectors 262. The package substrate 401 may comprise, for example, a substrate 402 and bonding pads 404. The substrate 402 may be similar to the substrate 302 described for FIG. 16, and the bonding pads 404 may be similar to the bonding pads 304 described for FIG. 16. Other variations of the substrate 402 and the bonding pads 404 are possible.

In some embodiments, optional under-bump metallizations (UBMs) 260 may be formed on the conductive connectors 108 of the package 200. The UBMs 260 may have bump portions on and extending along the major surface of the dielectric layer 106. The UBMs may comprise one or more conductive materials. In some embodiments, the UBMs 260 may be conductive pads or conductive pillars, such as copper pads or copper pillars. The UBMs 260 may formed by sputtering, printing, plating, CVD, or the like, though other techniques are possible. The UBMs 260 may be solder-free and may have substantially vertical sidewalls. The UBMs 260 may have other configurations or comprise other materials in other embodiments.

Conductive connectors 262 may then be formed on the UBMs 260, in some embodiments. The conductive connectors 262 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 262 may include a conductive material such as solder, copper, aluminum, gold, nickel, silver, palladium, tin, the like, or a combination thereof. In some embodiments, the conductive connectors 262 are formed by initially forming a layer of solder through evaporation, electroplating, printing, solder transfer, ball placement, or the like. Once a layer of solder has been formed on the structure, a reflow may be performed in order to shape the material into the desired bump shapes.

The package 200 may be mounted to the package substrate 401 using the conductive connectors 262. In some embodiments, the conductive connectors 262 are reflowed to attach the conductive connectors 108 of the package 200 to the bonding pads 404 of the package substrate 401. The conductive connectors 262 electrically and/or physically couple the package substrate 401, including any metallization layers in the substrate 402, to the package 200. In some embodiments, an underfill 406 may be formed between the package 200 and the package substrate 401 and surrounding the conductive connectors 262. The underfill 406 may be formed by a capillary flow process after the package 200 is attached or may be formed by a suitable deposition method before the package 200 is attached.

Figures 18A, 18B:
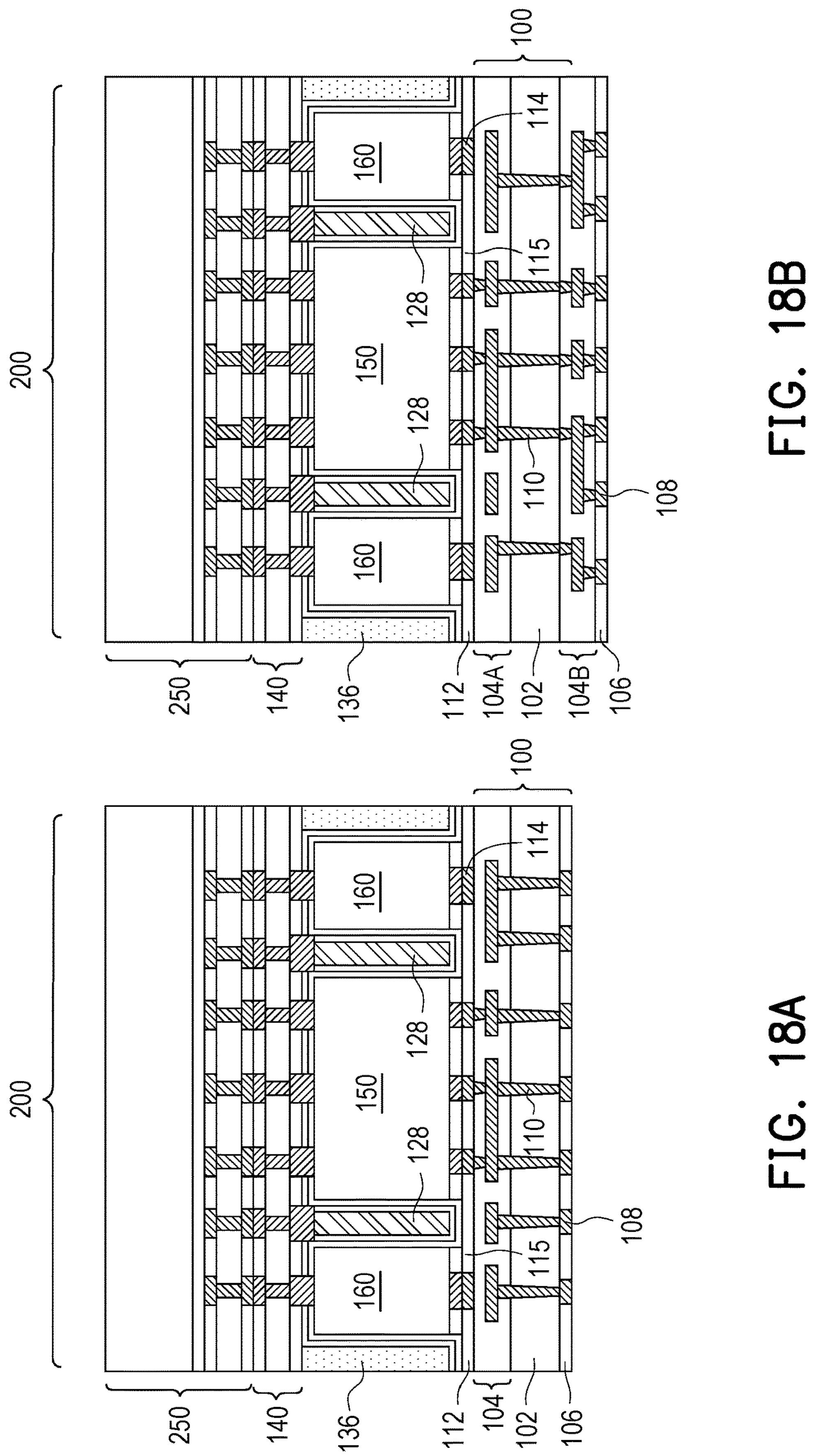
FIGS. 18A, 18B, and 19 are cross-sectional views of different packages, in accordance with some embodiments.

The wafer 100 shown in FIGS. 1-15 is an example, and in other embodiments, the wafer 100 of a package 200 may have a different configuration or include additional interconnect structures 104. As additional examples, FIGS. 18A and 18B show packages 200 formed with different wafers 100, in accordance with some embodiments. The packages 200 in FIGS. 18A-18B are similar to the packages 200 shown in FIG. 200, except for differences in the wafers 100. The packages 200 in FIGS. 18A-18B may be formed using manufacturing steps similar to those described for FIGS. 1-15. The wafers 100 shown in FIGS. 15, 18A, and 18B are examples, and all suitable variations of a wafer 100 are considered within the scope of the present disclosure.

The wafer 100 shown in FIG. 18A is similar to the wafer 100 shown in FIG. 15, except that the wafer bonding layer 112, conductive connectors 114, and conductive bond pads 115 are formed on the interconnect structure 104 and not on the substrate 102. Accordingly, the bonded structures (e.g., the semiconductor devices 150 and thermal structures 160) are bonded to the side of the wafer 100 on which the interconnect structure 104 is formed. In some embodiments, the dielectric layer 106 and conductive connectors 108 are formed on the substrate 102, and the conductive connectors 108 may physically and electrically contact the conductive vias 110. In some cases, bonding the bonded structured closer to the interconnect structure 104 may allow for reduced power consumption and improved device operation.

The wafer 100 shown in FIG. 18B is similar to the wafer 100 shown in FIG. 15, except that the wafer 100 includes two interconnect structures 104A and 104B. The interconnect structure 104A is formed on one side of the wafer 100, and the interconnect structure 104B is formed on the opposite side of the wafer 100. The interconnect structures 104A-B may be electrically connected by the conductive vias 110. The conductive vias 110 may extend into one of the interconnect structures 104A-B, in some cases. The wafer bonding layer 112, conductive connectors 114, and conductive bond pads 115 are formed on one of the interconnect structures 104A-B (e.g., on the interconnect structure 104A in FIG. 18B), and the dielectric layer 106 and conductive connectors 108 are formed on the other of the interconnect structures 104A-B (e.g., on the interconnect structure 104B in FIG. 18B). In some cases, forming multiple interconnect structures 104A-B may allow for more efficient electrical routing in a package 200.

Figure 19:
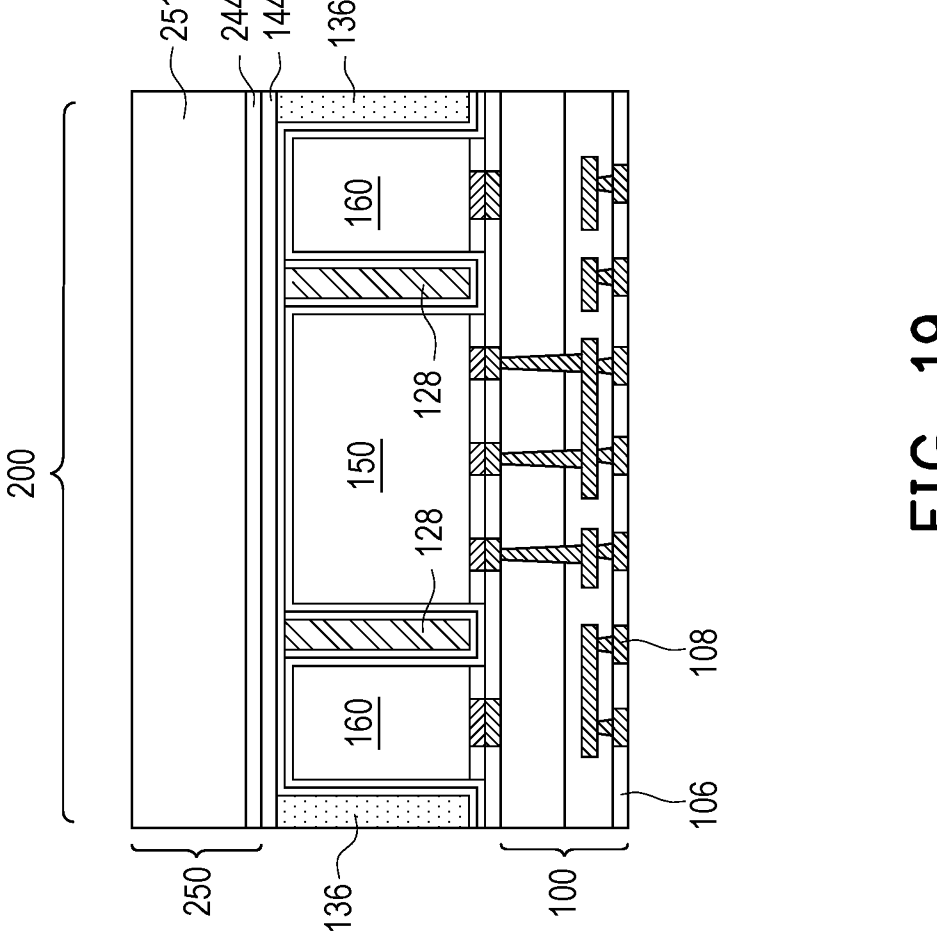

FIG. 19 illustrates a package 200 similar to the package 200 shown in FIG. 15, except that a thermal interconnect structure 140 is not formed over the bonded structures, and the support structure 250 does not include a thermal interconnect structure 240. For example, a bonding layer 144 may be formed over top surfaces of the protection layer 132 and the scribe fill regions 136. The bonding layer 144 may be similar to the bonding layer 144 described for FIG. 13, in some embodiments. A bonding layer 244 may be formed on the support substrate 251, which may be similar to the bonding layer 244 and support substrate 251 described for FIG. 14, in some embodiments. The bonding layer 244 of the support structure 250 is then bonded to the bonding layer 144 using a bonding process such as direct bonding, fusion bonding, dielectric-to-dielectric bonding, oxide-to-oxide bonding, or the like. The bonding process may be similar to the bonding process described previously for FIG. 14. In other embodiments, only one of the thermal interconnect structures 140 or 240 is omitted. In some cases, omitting one or both thermal interconnect structure 140/240 may allow for a package 200 having smaller dimensions.

Figure 20:
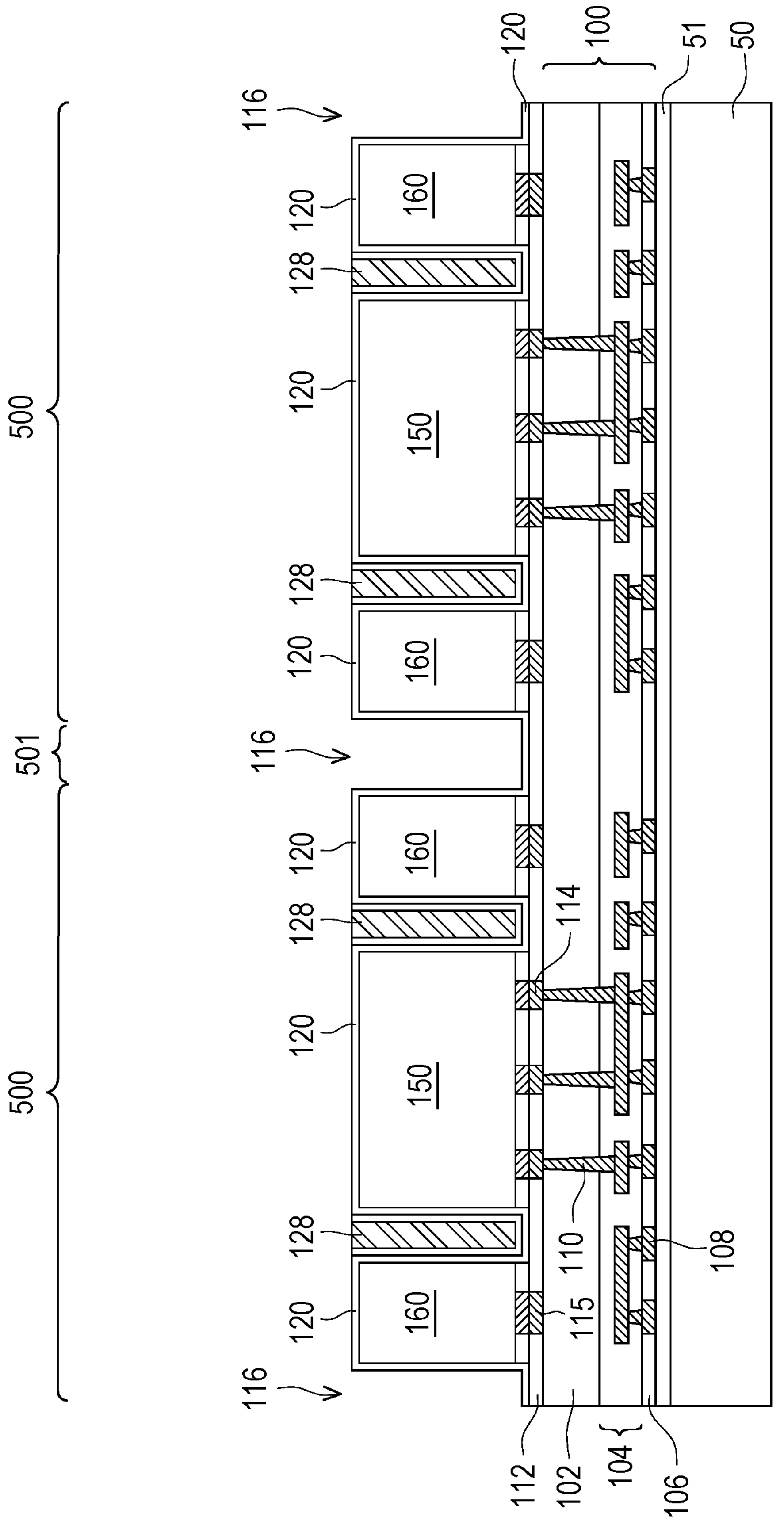
FIGS. 20, 21, 22, and 23 are cross-sectional views of intermediate stages in the manufacturing of packages having scribe fill structures, in accordance with some embodiments.

FIGS. 20 through 23 illustrate intermediate processes in the formation of a package 500 (see FIG. 23), in accordance with some embodiments. The package 500 is similar to the package 200 shown in FIG. 15, except that scribe fill structures 502 are placed in the gaps 116 rather than forming scribe fill regions 136 in the gaps 116. In some cases, using scribe fill structures 502 as described herein may reduce cracking or damage during singulation. Turning first to FIG. 20, a structure similar to the structure of FIG. 9 is shown, except that the mask layer 130 has been removed after etching the scribe metal regions 126 to form gaps 116. As shown in FIG. 20, the structure may include multiple package regions 500 in which packages 500 (see FIG. 23) are subsequently formed. Neighboring package regions 500 are separated by a scribe region 501.

Figure 21:
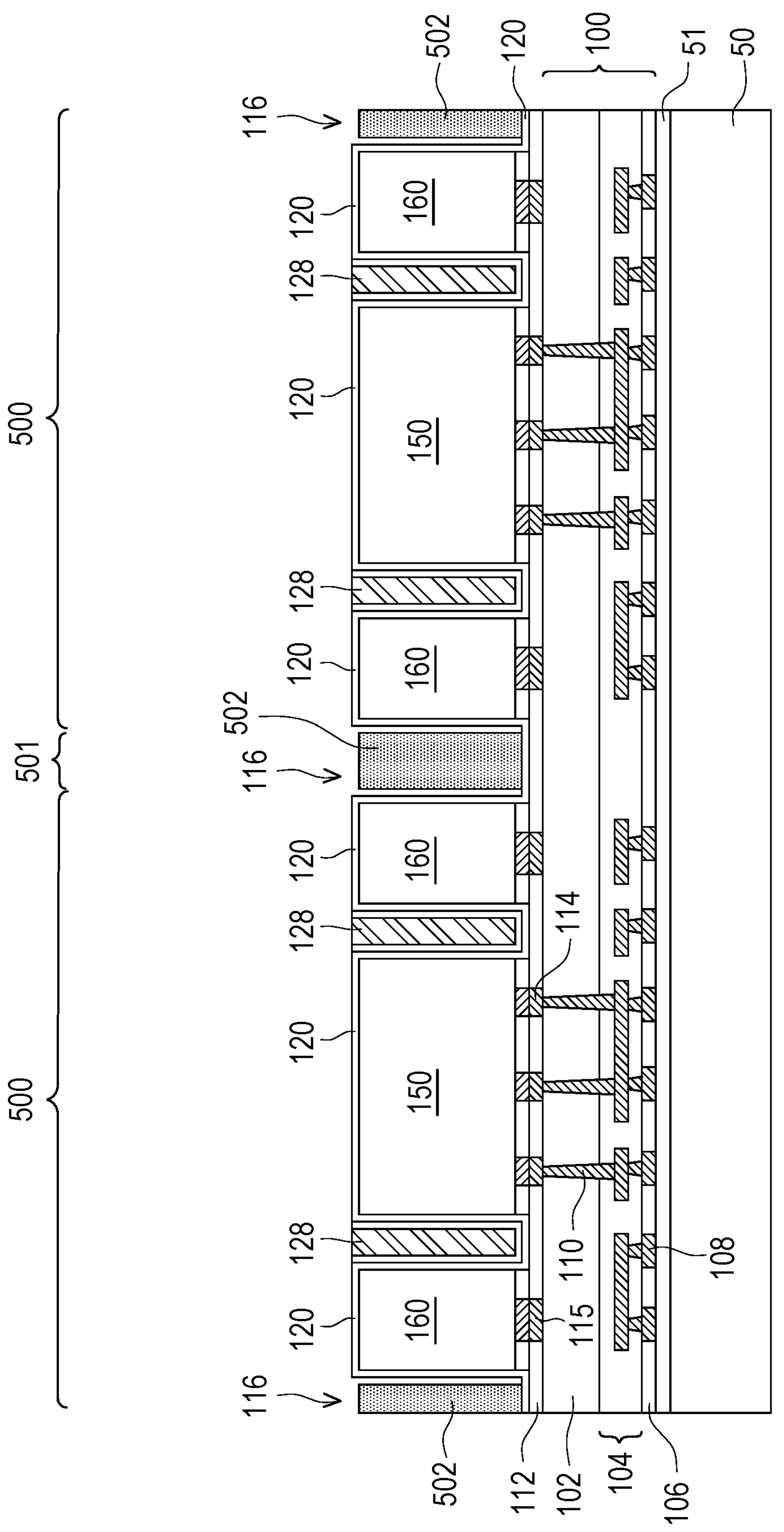

In FIG. 21, scribe fill structures 502 are placed in the gaps 116. The scribe fill structures 502 may be placed using, for example, a pick-and-place process or another suitable process. In some embodiments, an adhesive (not shown) is formed in the gaps 116 and/or on the scribe fill structures 502 to facilitate adhesion of the scribe fill structures 502. The scribe fill structures 502 may be a material such as silicon (e.g., bulk silicon), silicon oxide, a ceramic, a composite material, or the like. Other materials are possible. In some cases, the scribe fill structures 502 may be considered "dummy die" or "dummy structures." The scribe fill structures 502 may have top surfaces that are below, approximately level with, or above top surfaces of the stop layer 120. After placing the scribe fill structures 502, gaps may be present between the scribe fill structures 502 and the sidewalls of the gaps 116.

Figure 22:
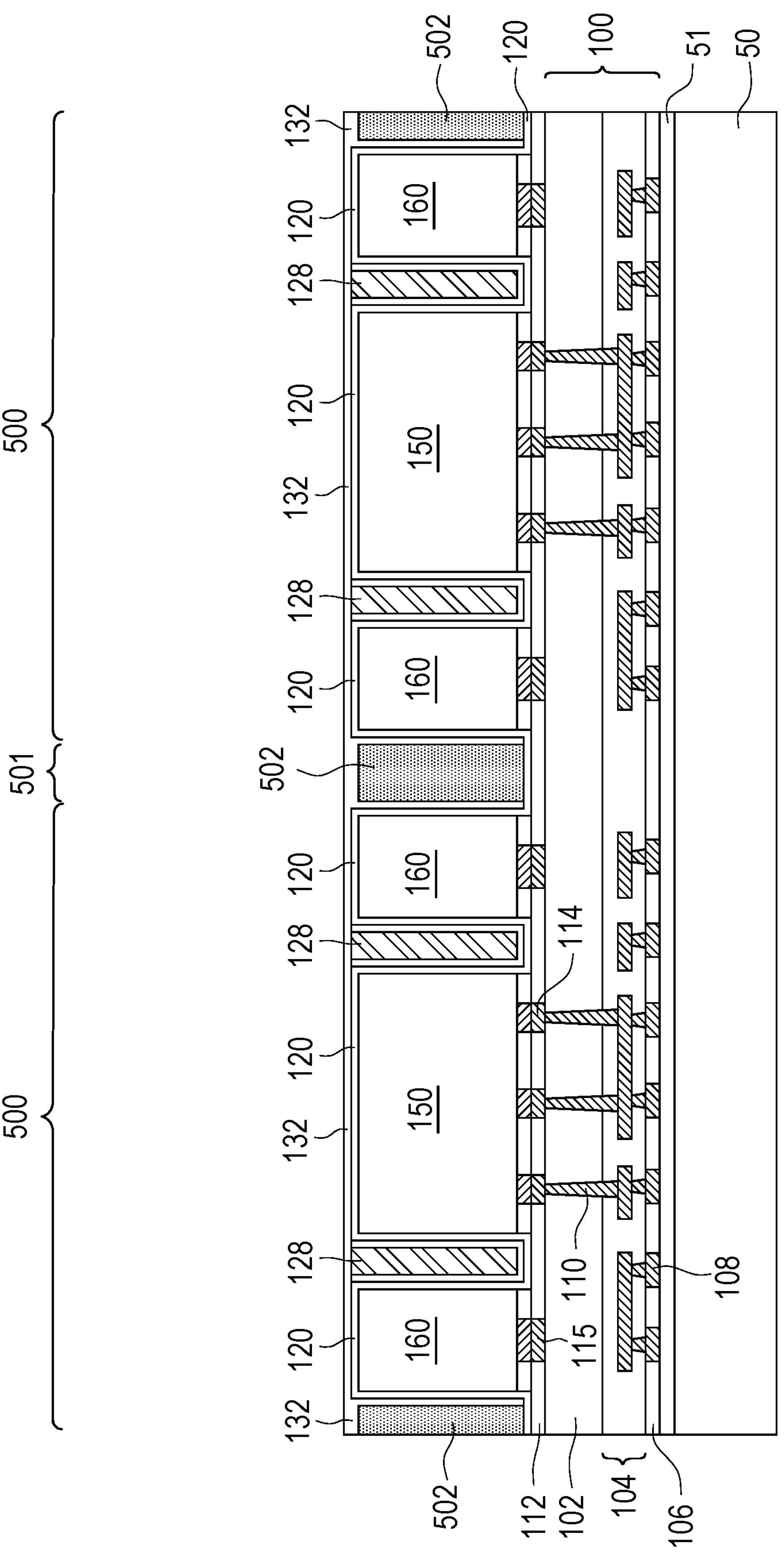

In FIG. 22, a protection layer 132 is deposited over the stop layer 120 and the scribe fill structures 502, in accordance with some embodiments. The protection layer 132 may be similar to the protection layer 132 described previously for FIG. 10, and may be formed using similar techniques. In some embodiments, the protection layer 132 at least partially fills the gaps between the scribe fill structures 502 and the sidewalls of the gaps 116. In some embodiments, the protection layer 132 covers air gaps (not shown) that are present between the scribe fill structures 502 and the sidewalls of the gaps 116. As shown in FIG. 22, the protection layer 132 may cover top surfaces of the scribe fill structures 502. After forming the protection layer 132, a planarization process (e.g., a CMP process or the like) may be performed to remove excess portions of the protection layer 132. In some embodiments, top surfaces of the scribe fill structures 502 may be exposed by the planarization process.

Figure 23:
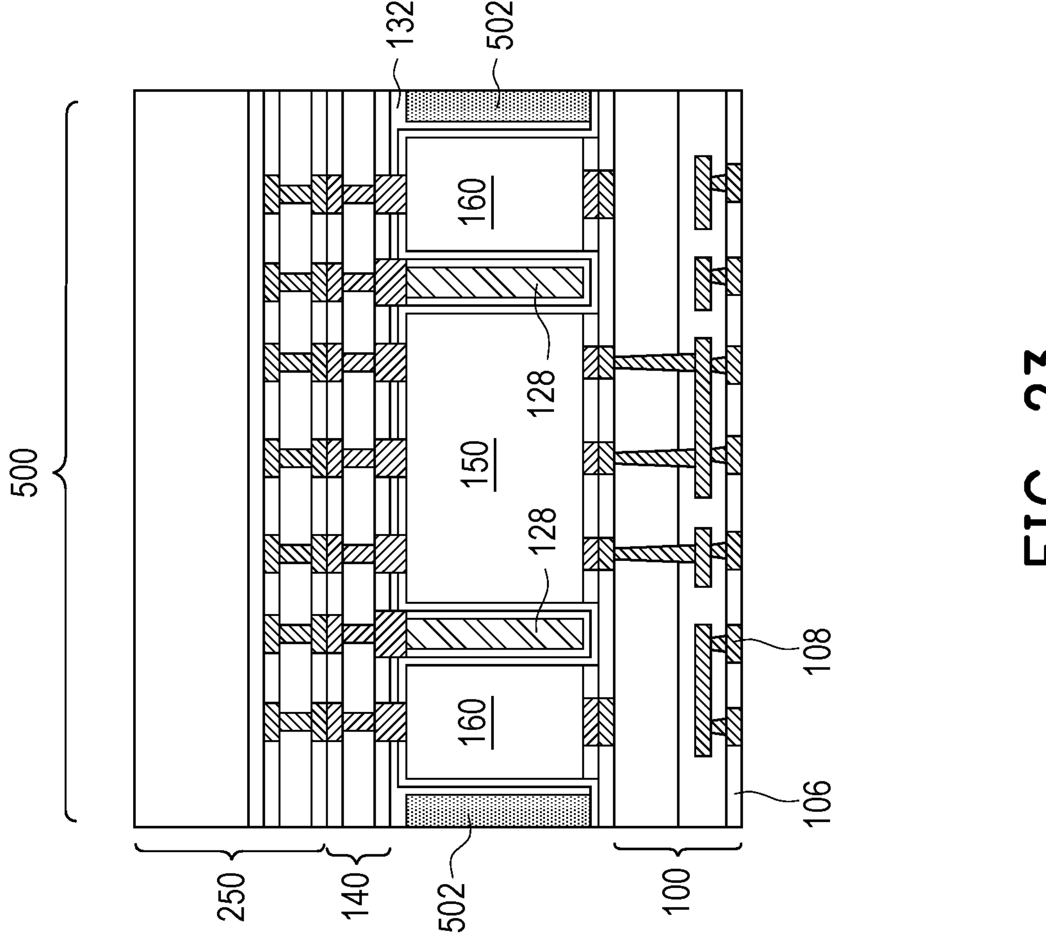

FIG. 23 illustrates a singulated package 500 after performing additional manufacturing steps, in accordance with some embodiments. The additional manufacturing steps may be similar to those described for FIGS. 13-15 or elsewhere herein. For example, a thermal interconnect structure 140 may be formed over the protection layer 132, a support structure 250 may be bonded to the thermal interconnect structure 140, and a singulation process may be performed. The singulation process may be performed by cutting along scribe regions 501 (e.g., around the package regions 500) to singulate the structures formed in the package regions 500 into individual packages 500. The singulation process may include sawing, dicing, a laser cutting process, or the like. The singulation process may cut through the scribe fill structures 502, and portions of the scribe fill structures 502 may be exposed by the singulation process. After performing the singulation process, the scribe fill structures 502 may have exposed sidewall surfaces. In other embodiments, the singulation process removes the scribe fill structures 502. As a result of the singulation process, sidewall surfaces of the wafer 100, scribe fill structures 502, the thermal interconnect structure 140, the protection layer 132, and/or the support structure 250 may be laterally coterminous (within process variations).

Figure 24:
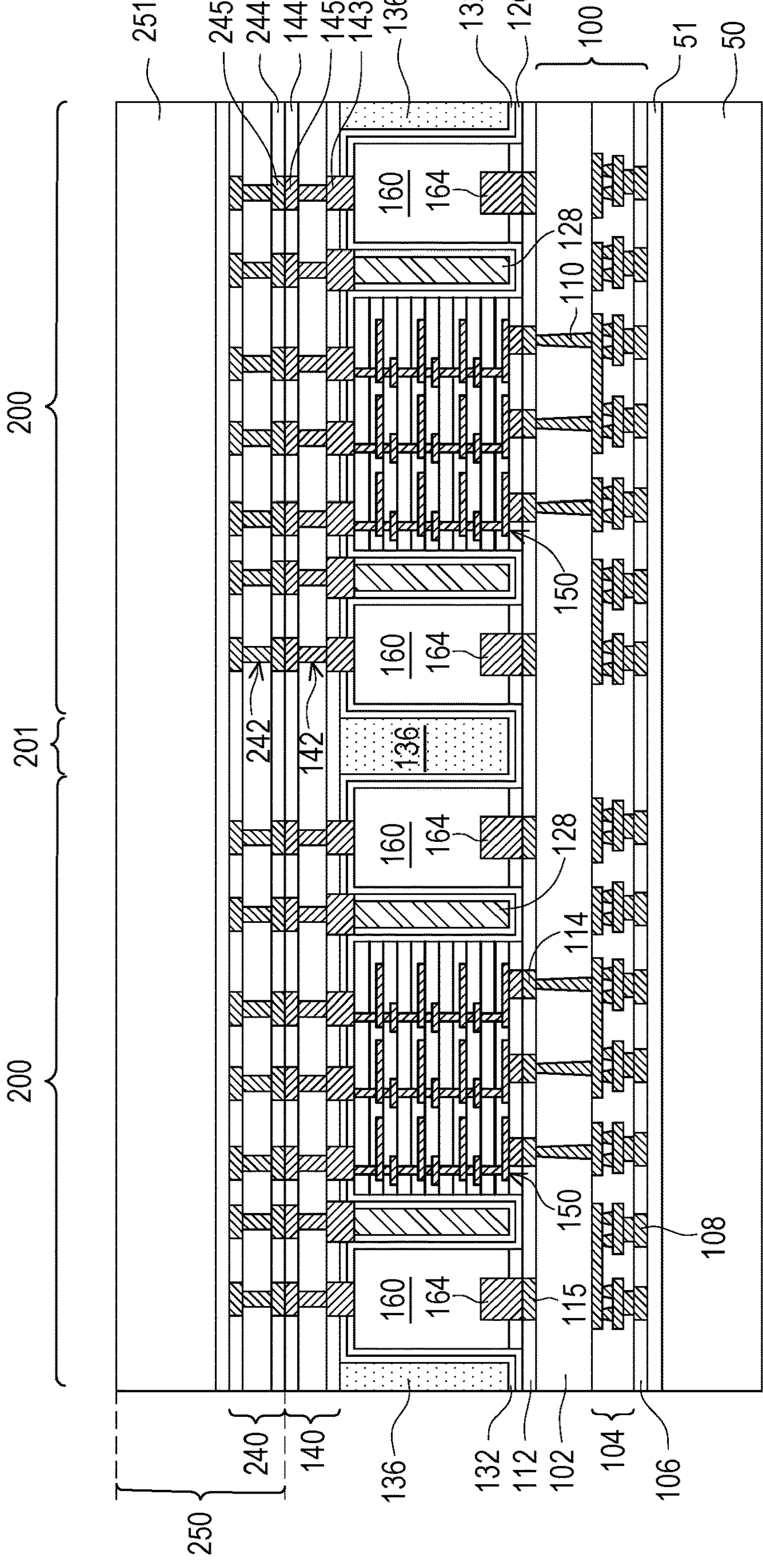
FIG. 24 is a cross-sectional view of an intermediate stage in the formation of a package structure, in accordance with some embodiments.

FIG. 24 illustrates a cross-sectional view of an intermediate step in the formation of packages 200, in accordance with some embodiments. The structure shown in FIG. 24 is a non-limiting embodiment similar to the structure shown in FIG. 14, except for the arrangement and configuration of some features. For example, the semiconductor devices 150 in FIG. 24 are shown as stacked memory devices, such as stacked SRAM die, stacked DRAM die, HBM die, HBC die, or the like. In some embodiments, the semiconductor devices 150 may comprise thermal through vias (shown in FIG. 24 but not specifically indicated) that facilitate dissipation of heat towards the thermal interconnect structure 140. For example, the first via layers 143 may be formed on the thermal through vias, as shown in FIG. 24. In some cases, forming first via layer 143 on thermal features of the semiconductor devices 150 in this manner can improve heat dissipation of a package 200. Additionally, as shown in FIG. 24, the conductive bond pads 164 of the thermal structures 160 may penetrate the bonding layer 162 and protrude into the body of the thermal structures 160, in some embodiments. In some cases, forming larger conductive bond pads 164 in this manner can improve the heat dissipation of the thermal structures 160.

FIGS. 25, 26, 27, 28, 29A, and 29B illustrate cross-sectional views of intermediate steps in the formation of packages 600 (e.g., packages 600A and 600B in FIGS. 29A-29B), in accordance with some embodiments. The process and structures shown in FIGS. 25 through 29A-29B are similar to the process and structures shown in FIGS. 1 through 15, except that semiconductor dies 602 are used instead of a wafer 100. Some of the processes or features of FIGS. 25-29B are similar to those of FIGS. 1-15, and for brevity some details of the similar processes or features are not repeated.

Figure 25:
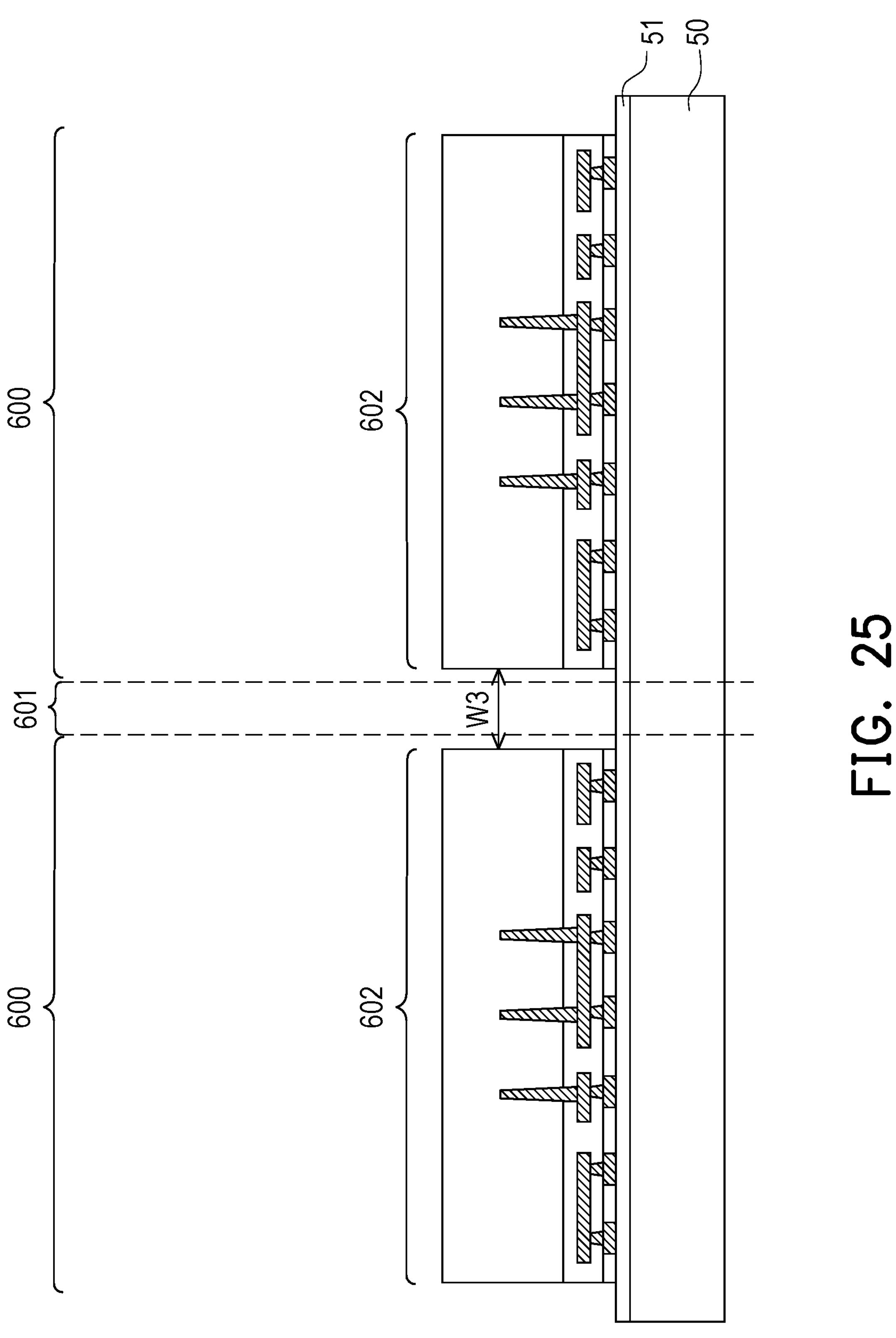
FIGS. 25, 26, 27, and 28 are cross-sectional views of intermediate stages in the manufacturing of packages, in accordance with some embodiments.

FIG. 25 illustrates the bonding of semiconductor dies 602 to a carrier substrate 50, in accordance with some embodiments. For example, the semiconductor die 602 may be bonded to a bonding layer 51 using direct bonding, fusion bonding, or the like. In some embodiments, the semiconductor dies 602 may be devices similar to those described previously for the semiconductor devices 150, such as logic dies, memory dies, System-on-a-Chip (SoC) dies, etc. As shown in FIG. 25, each semiconductor die 602 is part of a corresponding package region 600 in which packages 600 (see FIGS. 29A-29B) are subsequently formed. In other embodiments, a package region 600 may comprise two or more semiconductor dies 602. Neighboring package regions 600 are separated by scribe regions 601 (also called "scribe lines"). In some embodiments, adjacent semiconductor dies 602 are separated by a width W3 that is in the range of about 70 μm to about 300 μm, though other widths are possible. In some cases, the width W3 corresponds to the width of a scribe region 601 or the width W2 between thermal structures 160 (see FIG. 3).

Figure 26:
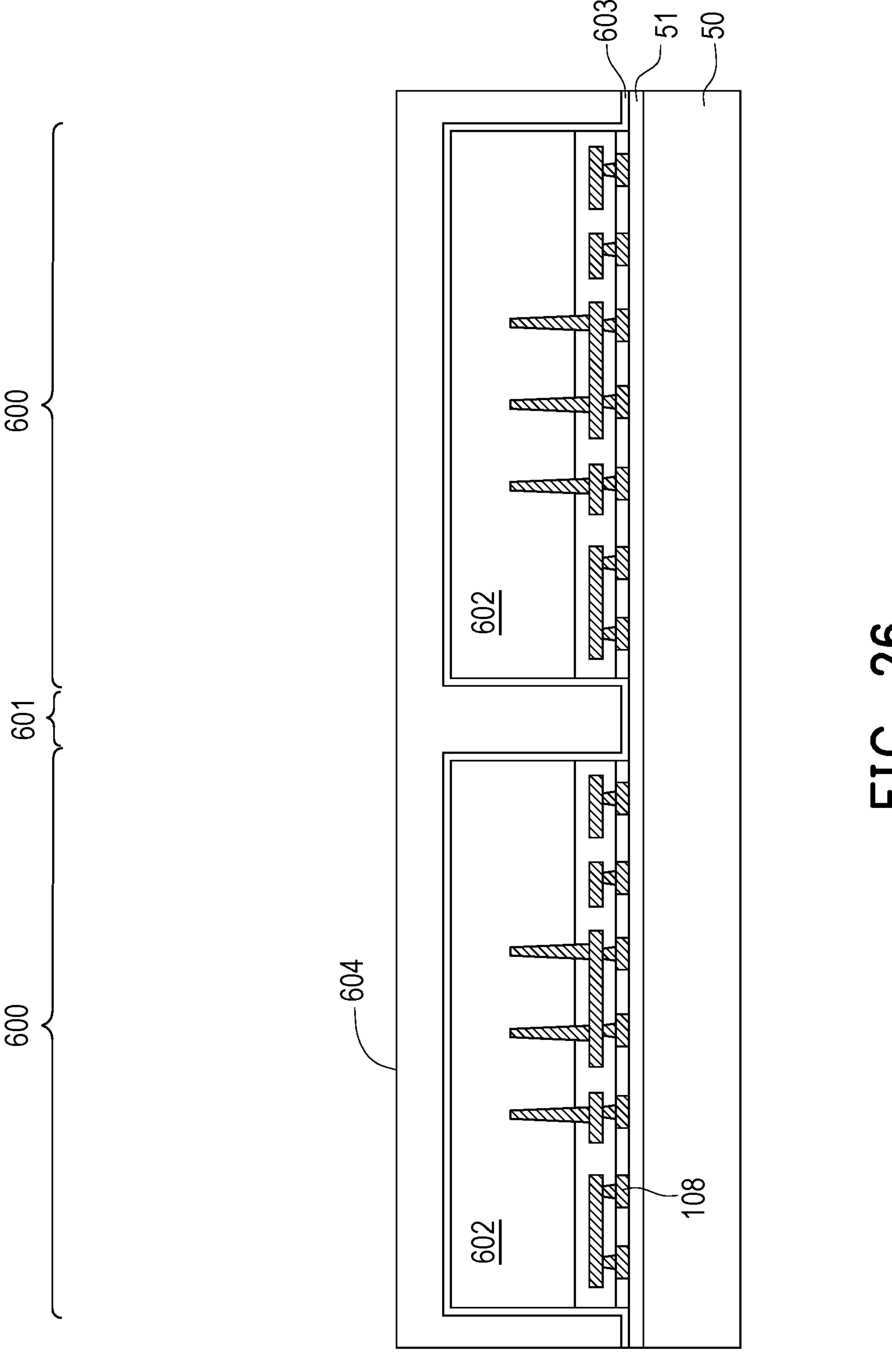

In FIG. 26, a protection layer 603 and a scribe fill material 604 are deposited over the semiconductor dies 602, in accordance with some embodiments. The protection layer 603 may be formed using materials or techniques similar to those described previously for the stop layer 120 or the protection layer 132. For example, the protection layer 603 may comprise silicon nitride in some embodiments, though other materials are possible. In some embodiments, the protection layer 603 may be formed having a thickness in the range of about 50 nm to about 200 nm, though other thicknesses are possible. The scribe fill material 604 is then deposited over the protection layer 603. The scribe fill material 604 may be formed using materials or techniques similar to those described previously for the scribe fill material 134 (see FIG. 11). For example, the scribe fill material 604 may comprise glass (e.g., SOG or the like), silicon oxide, molding compound, the like, or a combination thereof. Other materials are possible.

Figure 27:
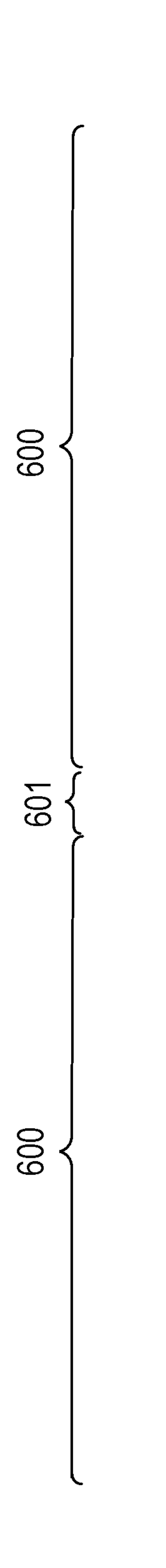
Figure 27:
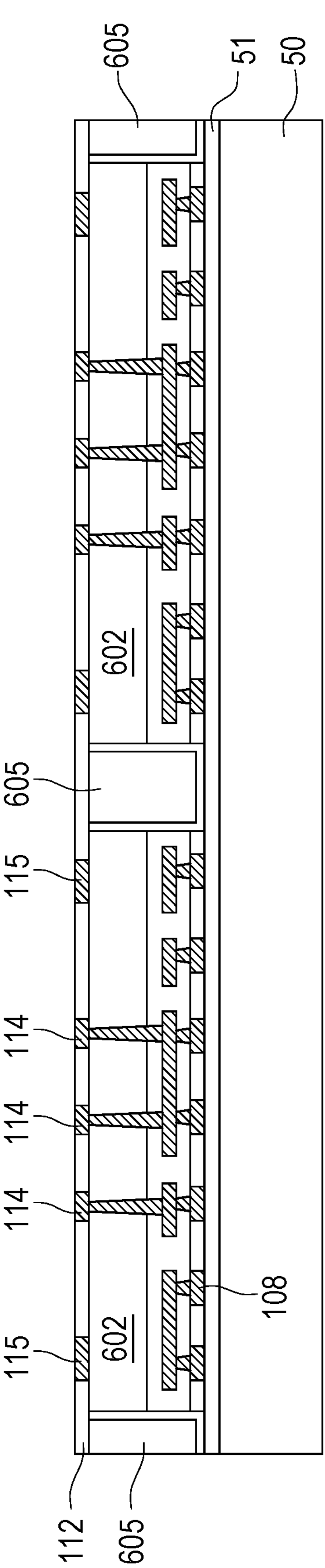

In FIG. 27, a planarization process is performed to form scribe fill regions 605, in accordance with some embodiments. The planarization process may remove excess portions of the protection layer 603 and the scribe fill material 604 from over the semiconductor dies 602, with the remaining portions of the protection layer 603 and the scribe fill material 604 forming scribe fill regions 605. The scribe fill regions 602 may have widths approximately the same as the corresponding widths W3 (see FIG. 25). The planarization process may also remove portions of the semiconductor dies 602, and may expose conductive features within the semiconductor dies 602 such as through vias, conductive pads, or the like. The planarization process may comprise a grinding process, a CMP process, an etching process, the like, or a combination thereof. After performing the planarization process, the semiconductor dies 602 and the scribe fill regions 605 may have top surfaces that are substantially level or coplanar. After performing the planarization process, the semiconductor dies 602 and/or the scribe fill regions 605 may have a height that is in the range of about 20 μm to about 40 μm, though other heights are possible. In some cases, forming scribe fill regions 605 between semiconductor dies 602 as described herein can allow for improved subsequent singulation of packages 600, such as reduced risk of cracking or other damage. In some cases, the structure formed by the semiconductor die 602 separated by scribe fill regions 605 may be considered a "reconstituted wafer" or a "wafer structure."

Still referring to FIG. 27, a bonding layer 112, conductive connectors 114, and conductive bond pads 115 may be formed over the semiconductor dies 602 and the scribe fill regions 605, in accordance with some embodiments. The bonding layer 112, conductive connectors 114, and/or conductive bond pads 115 may be similar to those described previously for FIG. 2, and may be formed using similar techniques.

Figure 28:
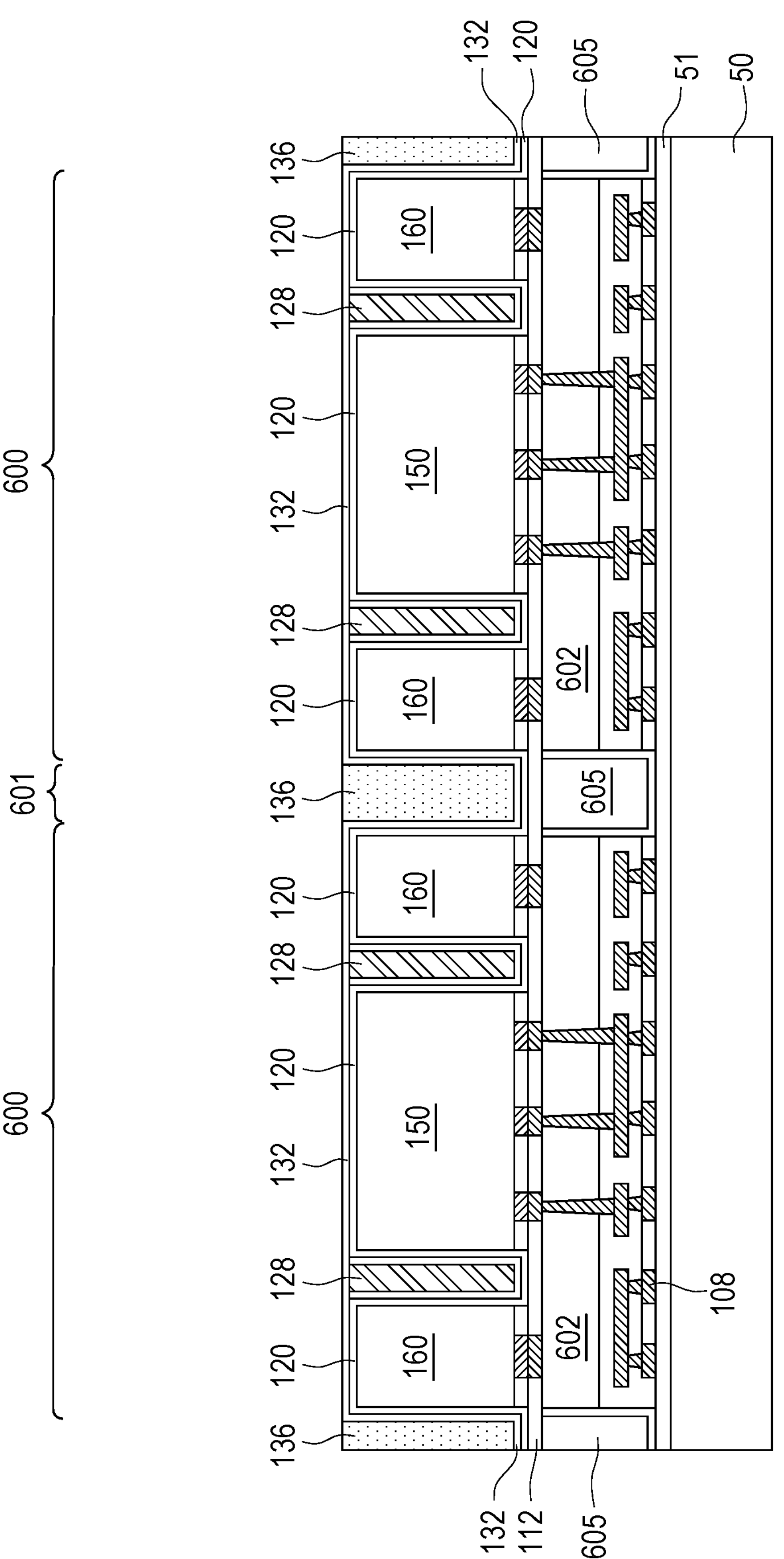

FIG. 28 illustrates the structure after subsequent processing steps have been performed, in accordance with some embodiments. The processing steps may be similar to those described previously for FIGS. 3 through 12. For example, semiconductor devices 150 and thermal structures 160 may be bonded to the bonding layer 112, thermal metal regions 128 may be formed, and scribe fill regions 136 may be formed. The thermal metal regions 128 and the scribe fill regions 136 may be formed using materials or techniques similar to those described in FIGS. 4-12 or elsewhere herein. The scribe fill regions 136 may have widths smaller than, about the same as, or greater than widths of underlying scribe fill regions 605.

Figures 29A, 29B:
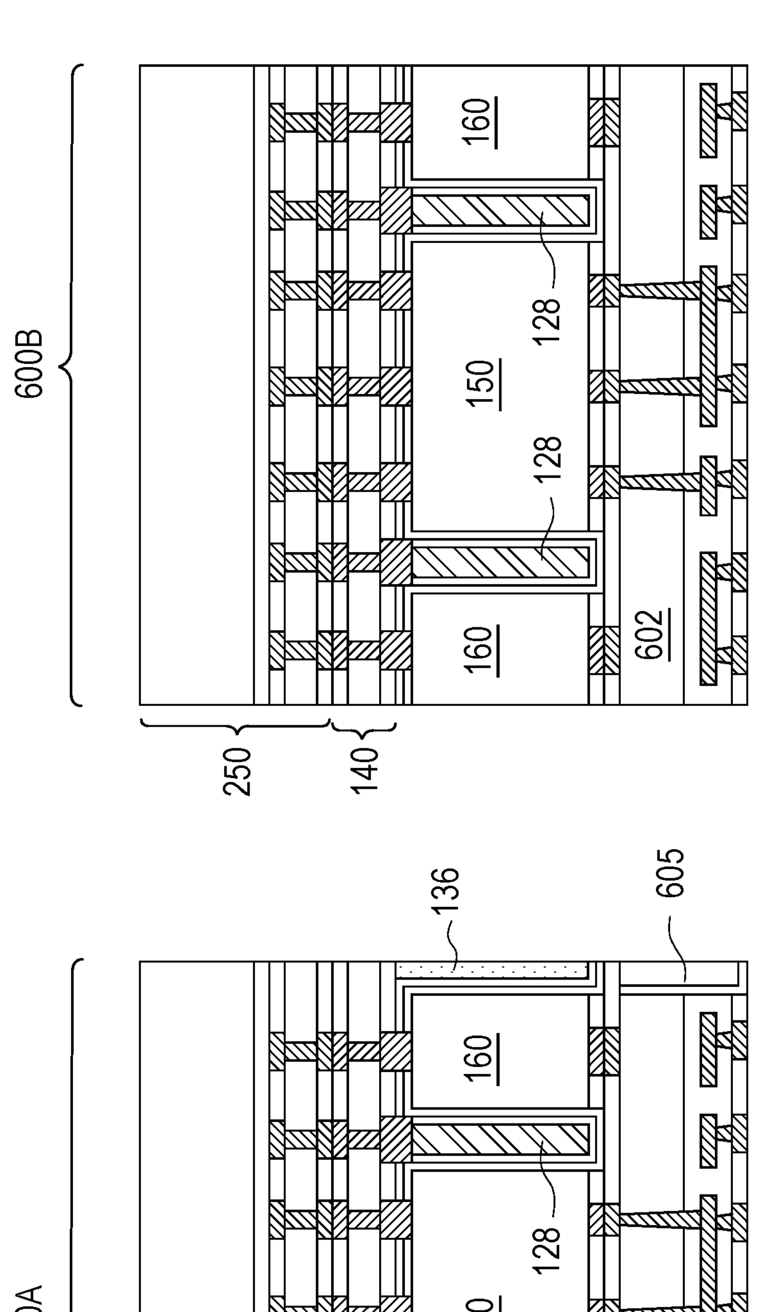
FIGS. 29A and 29B are cross-sectional views of different packages, in accordance with some embodiments.

The structure shown in FIG. 28 may be subsequently processed and then singulated to form individual packages 600. The structure shown in FIG. 28 may be processed using steps similar to those described previously for FIGS. 13 and 14, for example, though other processing steps are possible. The singulation process may be similar to the singulation process described previously for FIG. 15. Example packages 600 are shown in FIGS. 29A and 29B, in accordance with some embodiments. FIG. 29A illustrates a package 600A and FIG. 29B illustrates a package 600B. The packages 600A and 600B may be similar to the packages 200 described in FIG. 15, 18A, or 18B. The singulation process may leave portions of the scribe fill regions 605 and portions of the scribe fill regions 136 at sidewalls of the package 600. This is shown in FIG. 29A, in which sidewalls of the package 600A comprise exposed portions of the scribe fill regions 605 and the scribe fill regions 136. The exposed portions of the scribe fill regions 605 and the scribe fill regions 136 may be substantially coplanar or coterminous. In other embodiments, the singulation process may leave exposed portions of one of the scribe fill regions 605 or 136 and remove the other. For example, the singulation process may leave portions of the scribe fill regions 605 or 136 that has a larger width, in some cases. In other embodiments, the singulation process may remove both the scribe fill regions 605 and the scribe fill regions 136. This is shown in FIG. 29B, in which the package 600B is free of the scribe fill regions 605 and is free of the scribe fill regions 136. In this manner, sidewalls of the semiconductor die(s) 602, semiconductor device(s) 160, and/or thermal structure(s) 160 may be exposed, and may be coplanar or coterminous. The packages 600A and 600B shown in FIGS. 29A and 29B are illustrative examples, and other configurations or variations of packages are possible.

FIGS. 30, 31, 32, and 33 illustrate cross-sectional views of intermediate steps in the formation of packages 700 (see FIG. 33), in accordance with some embodiments. The structures shown in FIGS. 30-32 comprise package regions 700 separated by scribe regions 701 (also called "scribe lines"). The package regions 700 are subsequently singulated to form individual packages 700 (see FIG. 33). The packages 700 may be similar to the packages 200 described previously, except that the packages 700 comprise scribe fill regions 736 and thermal metal regions 128 formed using different process steps than the corresponding features of the packages 200. The process steps described for FIGS. 30-33 may be performed after forming a structure similar to that of FIG. 4. For example, the process steps of 30-33 may be performed after bonding semiconductor devices 150 and the thermal structures 160 to a wafer 100 and then depositing a stop layer 120. Some of the processes or features of FIGS. 30-33 are similar to those of FIGS. 1-15, and for brevity some details of the similar processes or features are not repeated.

Figure 30:
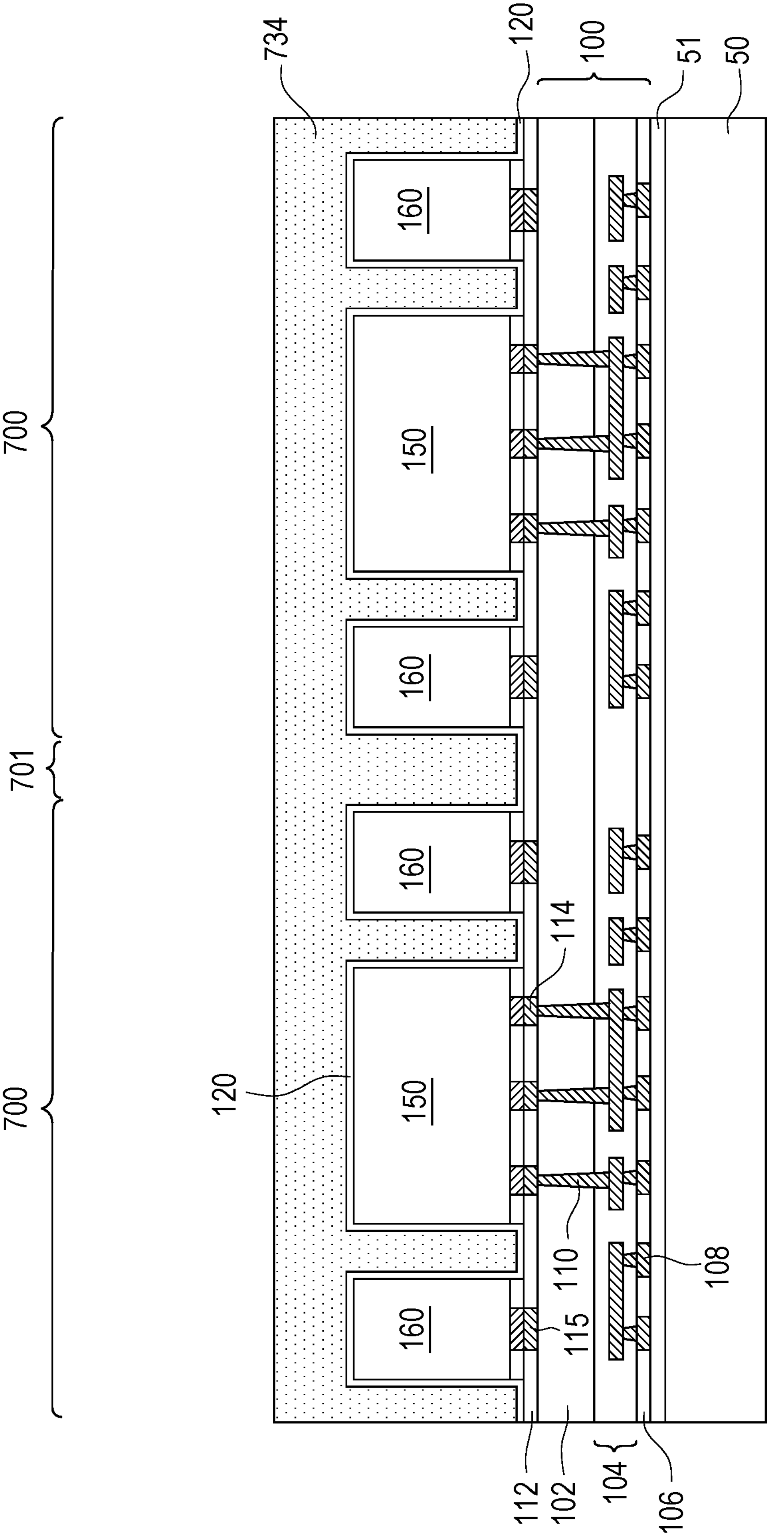
FIGS. 30, 31, 32, and 33 are cross-sectional views of intermediate stages in the manufacturing of packages, in accordance with some embodiments.

In FIG. 30, a scribe fill material 734 is deposited over the stop layer 120, in accordance with some embodiments. The scribe fill material 734 may be deposited to fill the gaps 116 and the gaps 118 (see FIG. 4), and may cover the semiconductor devices 150 and the thermal structures 160. The scribe fill material 734 may be formed using materials or techniques similar to those described previously for the scribe fill material 134 (see FIG. 11). For example, the scribe fill material 734 may comprise glass (e.g., SOG or the like), silicon oxide, molding compound, the like, or a combination thereof. Other materials are possible.

Figure 31:
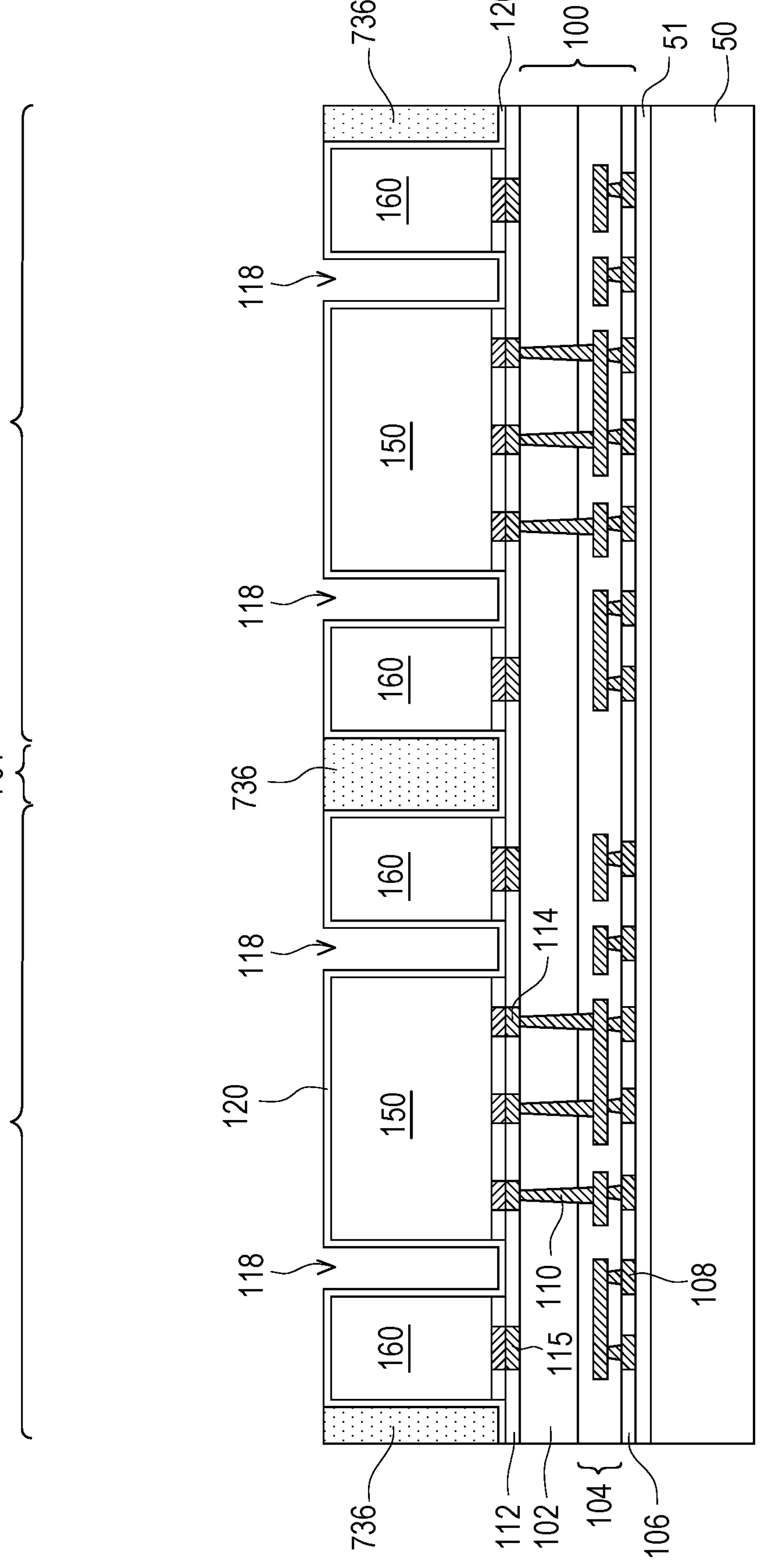

In FIG. 31, the scribe fill material 734 is removed from the gaps 118, with remaining portions of the scribe fill material 734 in the gaps 116 forming scribe fill regions 736, in accordance with some embodiments. In some embodiments, a planarization process (e.g, a CMP process or the like) is performed to remove excess scribe fill material 734 from over the semiconductor devices 150 and the thermal structures 160. The planarization process may stop on the stop layer 120 and/or may expose the stop layer 120. After performing the planarization process, a photolithography and etching process may be performed to remove scribe fill material from the gaps 118. For example, a patterned mask (not illustrated) may be formed that covers the scribe fill material 734 in the gaps 116 but has openings that expose the scribe fill material 734 in the gaps 118. The mask may comprise a suitable material such as a photoresist, and may be formed and patterned using suitable photolithographic techniques. An etching process may then be performed to remove scribe fill material 734 from the gaps 118. The etching process may comprise a suitable wet etching process and/or a suitable dry etching process. The mask may then be removed using a suitable process, such as an ashing process. The remaining portions of the scribe fill material 734 form scribe fill regions 736. The scribe fill regions 736 may be similar to the scribe fill regions 136 described previously for FIG. 12, except that a protection layer (e.g., protection layer 132) is not deposited on the stop layer 120 before depositing the scribe fill material 734. In other embodiments, the planarization process is performed after removing the scribe fill material 734 from the gaps 118. In other embodiments, the scribe fill material 734 may be blocked from filling the gaps 118 by a sacrificial material, similar in principle to the techniques described below for FIGS. 34-36, in which a sacrificial material 180 is used to block the metal fill material 124 from filling the gaps 116.

Figure 32:
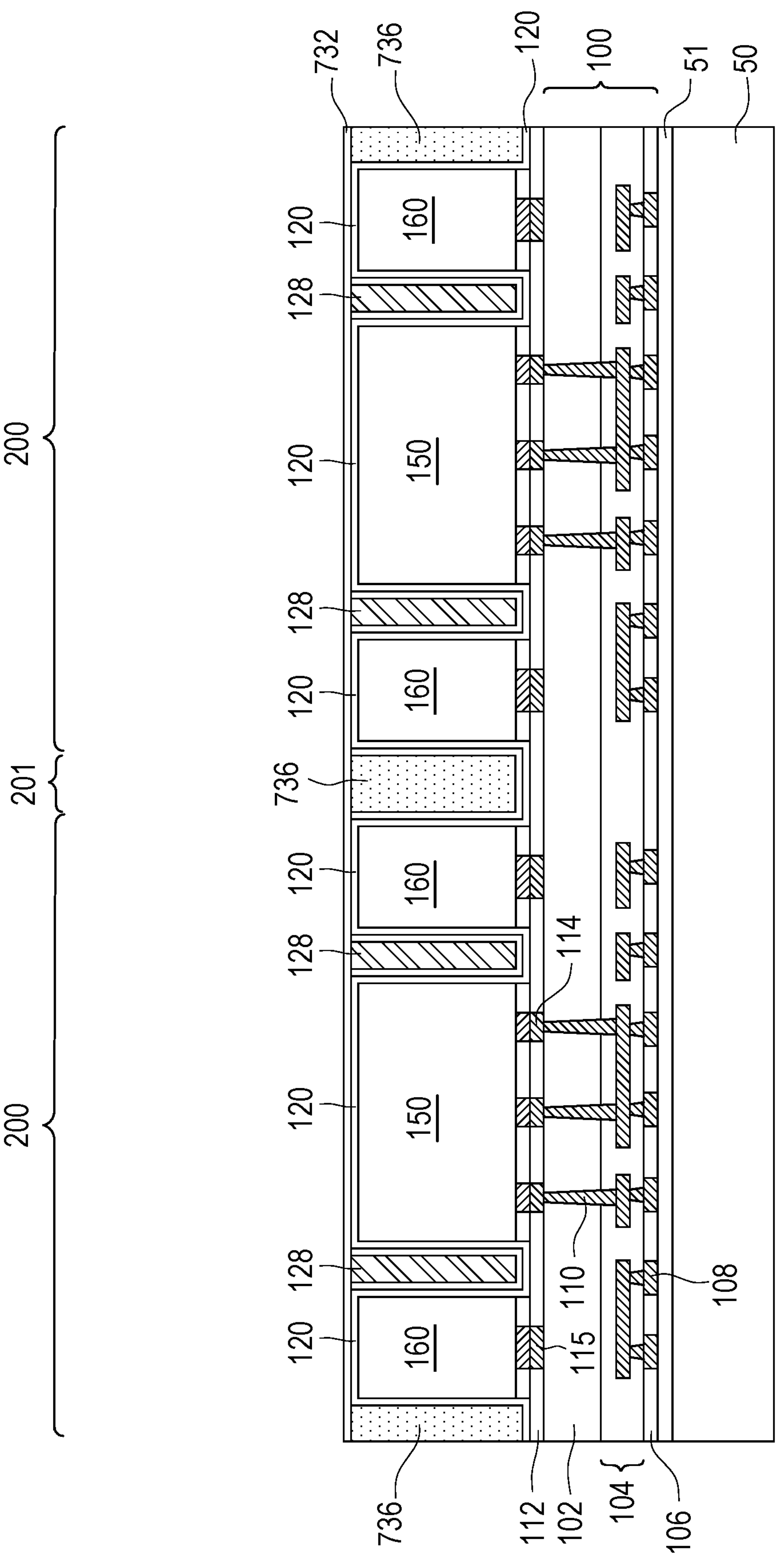

In FIG. 32, thermal metal regions 128 are formed in the gaps 118, in accordance with some embodiments. The thermal metal regions 128 may be formed using similar material and techniques as described previously for FIGS. 5-7. For example, a barrier layer 122 may be blanket deposited over the structure of FIG. 31, including within the gaps 118. The barrier layer 122 may be similar to the barrier layer 122 described for FIG. 5, and may be formed using similar techniques. A metal fill material 124 may then be deposited over the barrier layer 122 and fill the gaps 118. The metal fill material 124 may be similar to the metal fill material 124 described previously for FIG. 6, and may be formed using similar techniques. The metal fill material 124 may cover the scribe fill regions 736, the semiconductor devices 150, and/or the thermal structures 160. A planarization process (e.g., a CMP process) may be performed to remove excess portions of the barrier layer 122 and the metal fill material 124, with the remaining portions forming the thermal metal regions 128. The planarization process may stop on the stop layer 120 and/or may expose the stop layer 120. A protection layer 732 may then be deposited over the scribe fill regions 736 and the thermal metal regions 128, in some embodiments. The protection layer 732 may be similar to the protection layer 132 described previously for FIG. 10, and may be formed using similar techniques.

Figure 33:
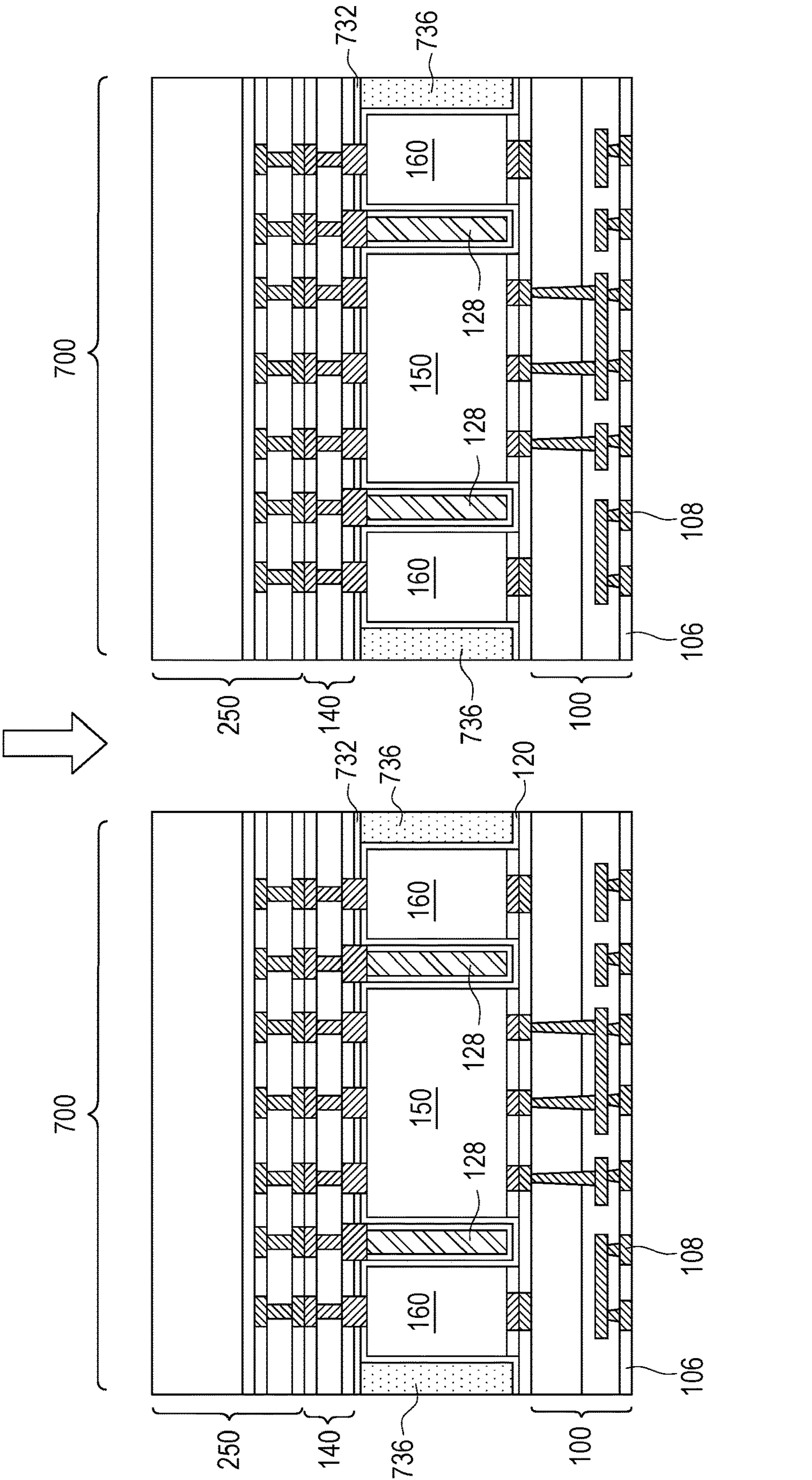

The structure shown in FIG. 32 may be subsequently processed and then singulated to form individual packages 700, shown in FIG. 33. The structure shown in FIG. 32 may be processed using steps similar to those described previously for FIGS. 13 and 14, for example, though other processing steps are possible. The singulation process may be similar to the singulation process described previously for FIG. 15. Example packages 700 are shown in FIG. 33, in accordance with some embodiments. The packages 700 are similar to the packages 200 described previously for FIG. 15, except that a protection layer 732 is formed over the top of the scribe fill regions 736 instead of on sidewalls of the scribe fill regions 736 and/or underneath the scribe fill regions 736. In other embodiments, the singulation process removes the scribe fill regions 736 from the packages 700.

Figure 34:
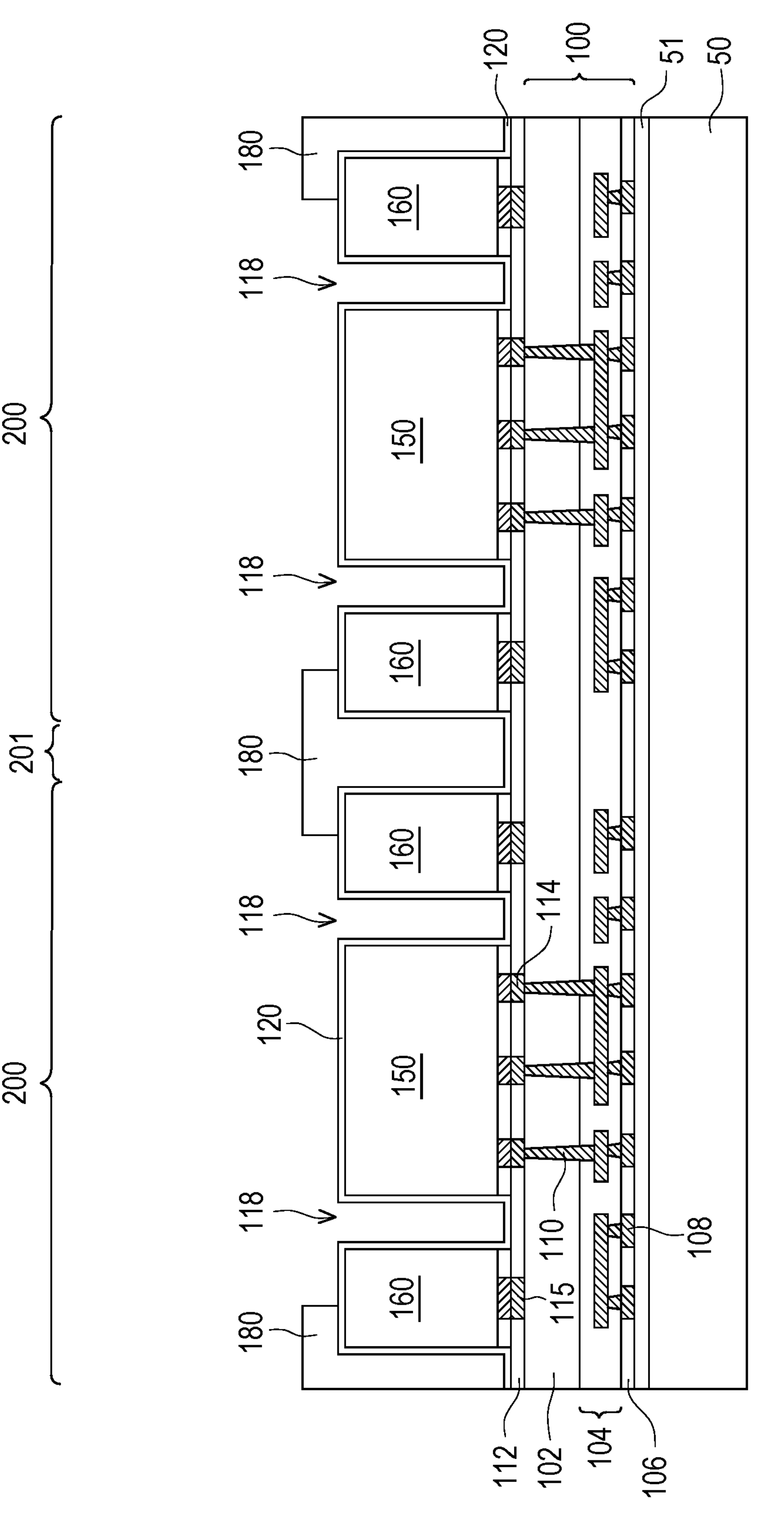
FIGS. 34, 35, and 36 are cross-sectional views of intermediate stages in the manufacturing of thermal metal regions of packages, in accordance with some embodiments.
Figure 35:
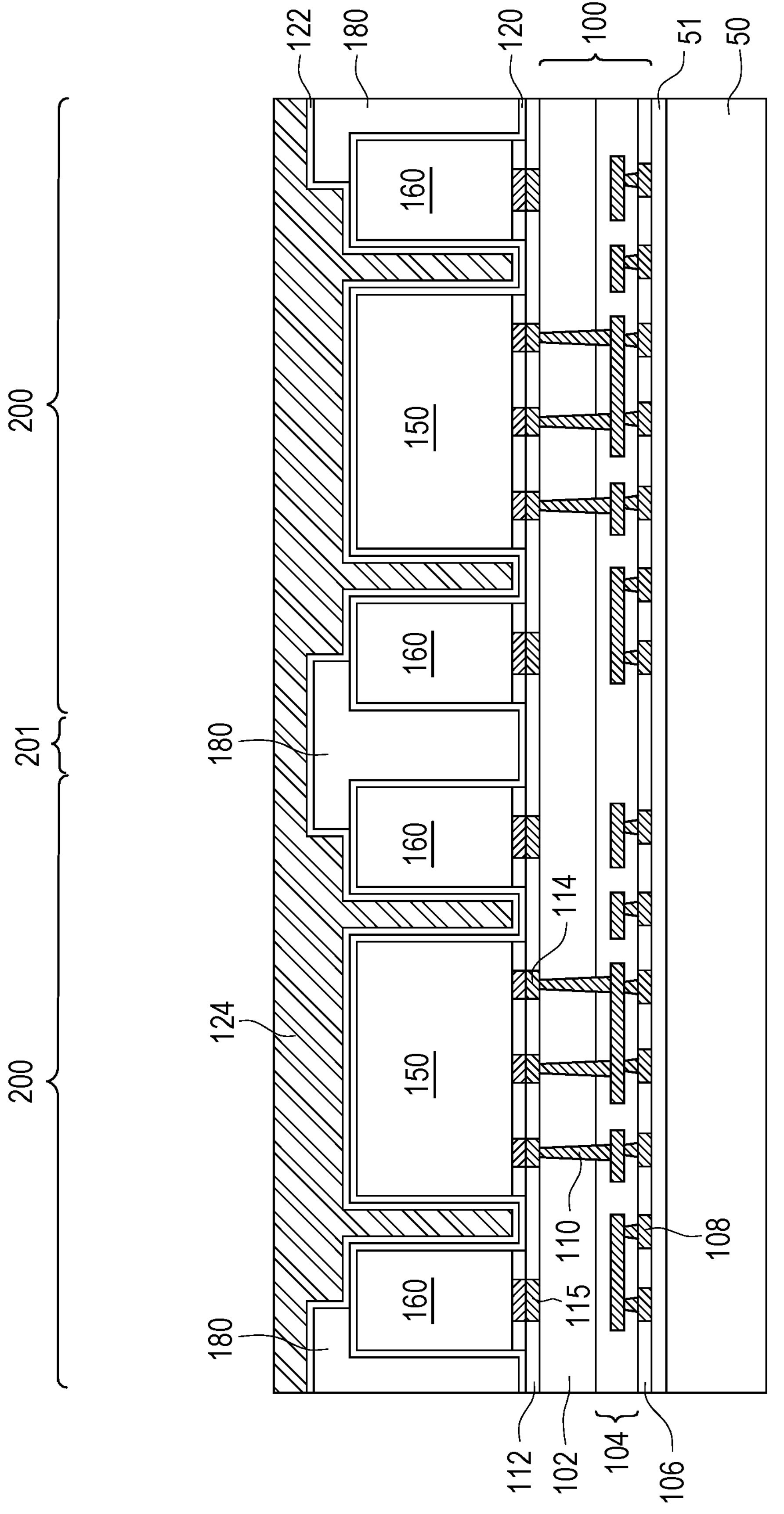
Figure 36:
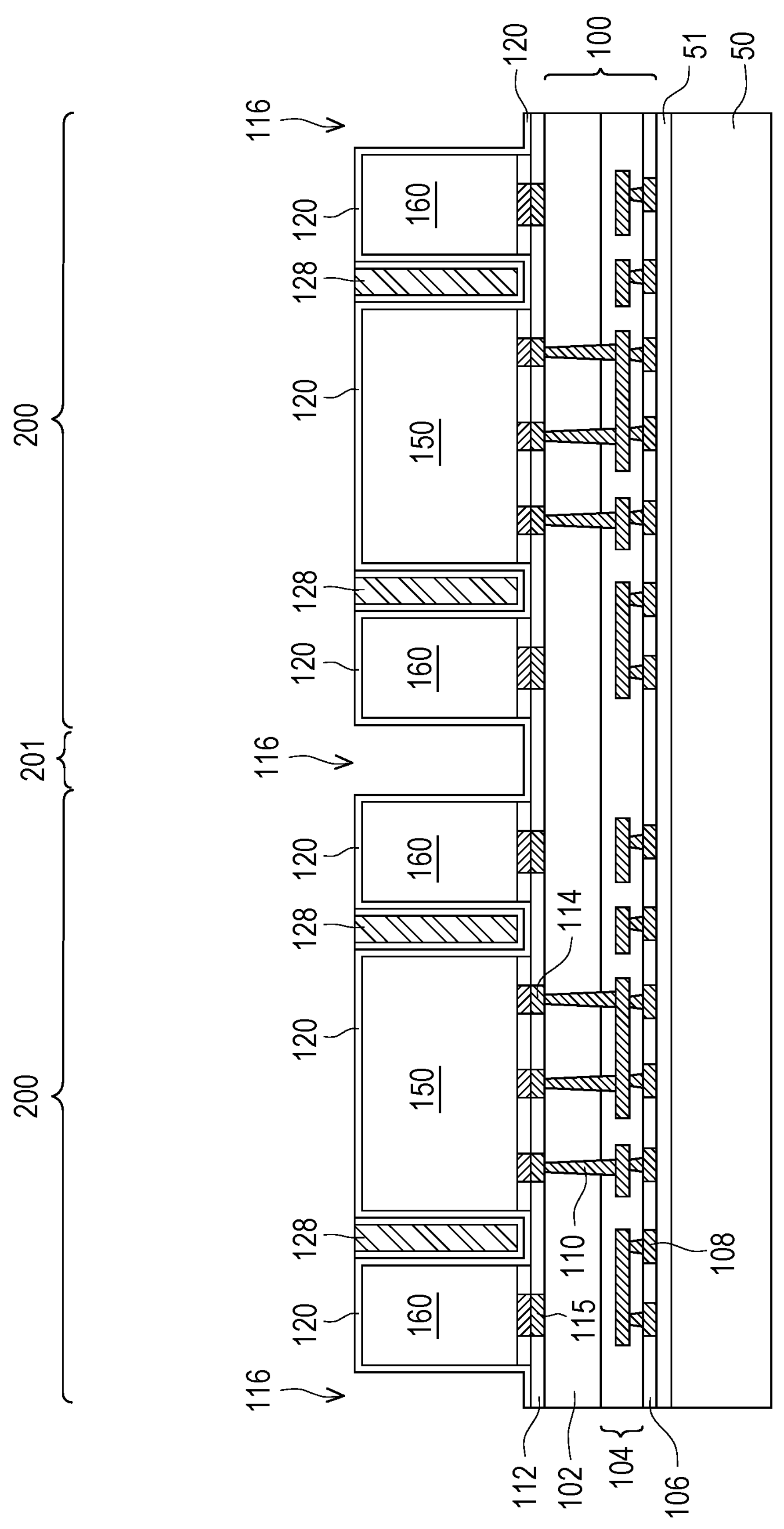

FIGS. 34, 35, and 36 illustrate cross-sectional views of intermediate steps in the formation of thermal metal regions 128, in accordance with some embodiments. The process shown in FIGS. 34-36 for forming the thermal metal regions 128 may be performed, for example, instead of the process described previously in FIGS. 5-9 for forming the thermal metal regions 128. The process steps described for FIGS. 34-36 may be performed after forming a structure similar to that of FIG. 4. Some of the processes or features of FIGS. 34-36 are similar to those of FIGS. 1-15, and for brevity some details of the similar processes or features are not repeated.

In FIG. 34, the gaps 116 (see FIG. 4) are filled by a sacrificial material 180, in accordance with some embodiments. The sacrificial material 180 may partially or fully fill the gaps 116, and may extend on surfaces outside of the gaps 116, in some embodiments. The sacrificial material 180 may comprise a suitable material, such as a photoresist, a polymer, a dielectric material (e.g., an oxide), the like, or another material, and may be formed using any suitable technique. The sacrificial material 180 may be deposited over the structure (e.g., over the stop layer 120) and then patterned such that the gaps 118 are exposed but the gaps 116 remain filled by the sacrificial material 180. The sacrificial material 180 may be patterned using suitable photolithography and etching techniques.

In FIG. 35, a barrier layer 122 and a metal fill material 124 are formed over the structure, in accordance with some embodiments. The barrier layer 122 may be similar to the barrier layer 122 described for FIG. 5, and may be formed using similar techniques. A metal fill material 124 may then be deposited over the barrier layer 122 and fill the gaps 118. The metal fill material 124 may be similar to the metal fill material 124 described previously for FIG. 6, and may be formed using similar techniques. The metal fill material 124 may cover the sacrificial material 180, the semiconductor devices 150, and/or the thermal structures 160. As shown in FIG. 35, the sacrificial material 180 blocks the barrier layer 122 and the metal fill material 124 from being deposited within the gaps 116.

In FIG. 36, excess barrier layer 122 and metal fill material 124 are removed to form thermal metal regions 128, in accordance with some embodiments. For example, a planarization process (e.g., a CMP process) may be performed to remove excess portions of the barrier layer 122 and the metal fill material 124, with the remaining portions forming the thermal metal regions 128. The planarization process may stop on the stop layer 120 and/or may expose the stop layer 120. Remaining portions of the sacrificial material 180 may then be removed using a suitable process, such as an ashing process or an etching process. In other embodiments, the sacrificial material 180 may be removed before performing the planarization process, or a planarization process may be performed both before and after the sacrificial material 180 is removed. The structure shown in FIG. 36 is similar to the structure shown in FIG. 9, and as such may be subsequently processed using similar process steps, such as those described for FIGS. 10-15, for example. For example, a protection layer 132 and a scribe fill material 134 may be deposited to form scribe fill regions 136.

FIGS. 37, 38, 39, 40, and 41 illustrate cross-sectional views of intermediate steps in the formation of thermal metal regions 128, in accordance with some embodiments. The process shown in FIGS. 37-41 for forming the thermal metal regions 128 may be performed, for example, instead of the processes described previously in FIGS. 5-9 or in FIGS. 34-36 for forming the thermal metal regions 128. The process steps described for FIGS. 37-41 may be performed after forming a structure similar to that of FIG. 5. Some of the processes or features of FIGS. 37-41 are similar to those of FIGS. 1-15, and for brevity some details of the similar processes or features are not repeated.

Figure 37:
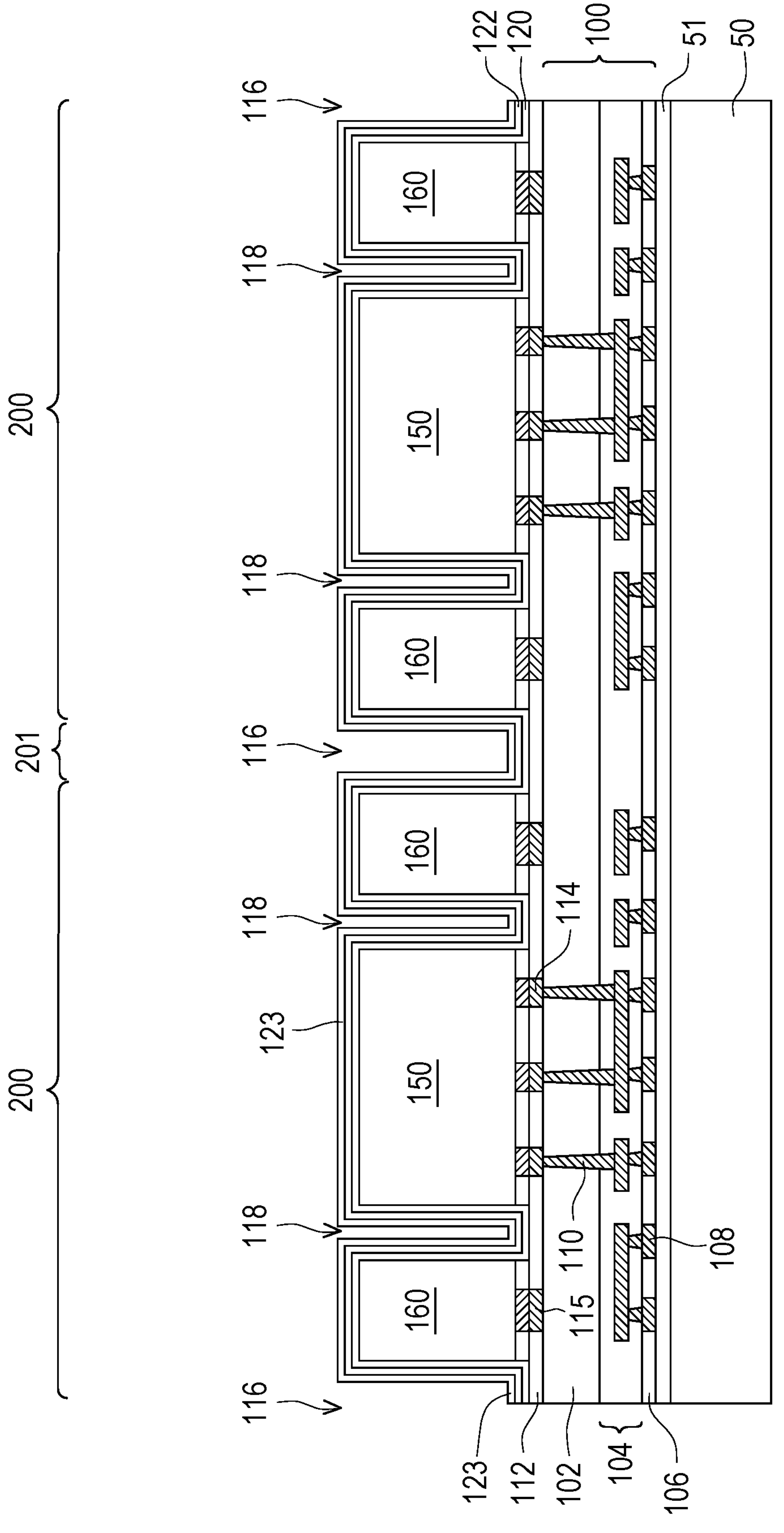
FIGS. 37, 38, 39, 40, and 41 are cross-sectional views of intermediate stages in the manufacturing of thermal metal regions of packages, in accordance with some embodiments.

In FIG. 37, a seed layer 123 are formed over the structure, in accordance with some embodiments. The seed layer 123 may be formed as a blanket layer over the barrier layer 122, for example, and may be formed within the gaps 116 and 118. In some embodiments, the seed layer 123 is a metal layer, which may be a single layer or a composite layer comprising a plurality of sub-layers formed of different materials. The seed layer 123 may be a conductive material and may be blanket deposited over the barrier layer 122 using a suitable process, such as sputtering, evaporation, PVD, or the like. In some embodiments, the seed layer 123 comprises copper. Other materials or techniques are possible.

Figure 38:
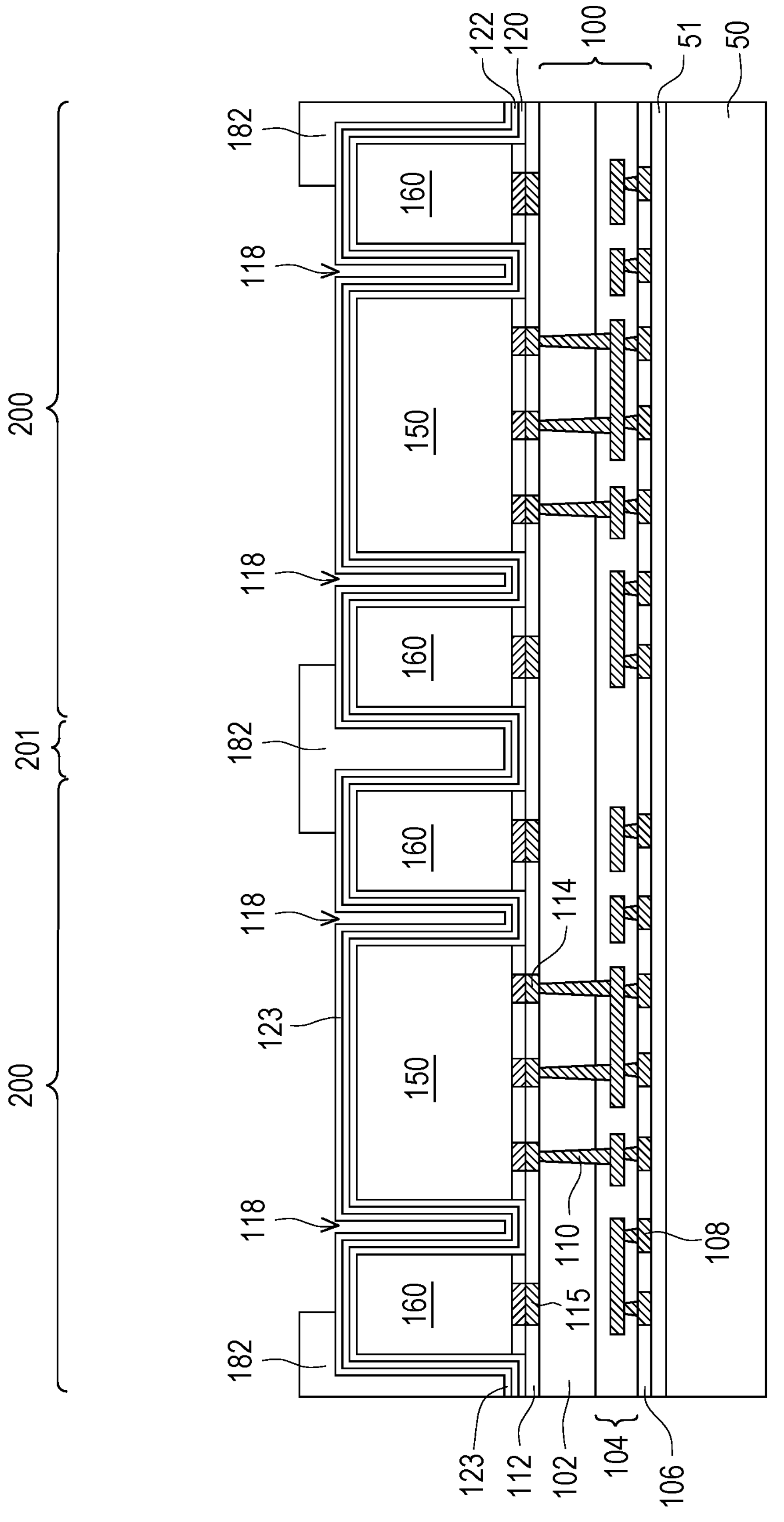

In FIG. 38, a sacrificial material 182 is deposited to cover portions of the seed layer 123 in the gaps 116, in accordance with some embodiments. The sacrificial material 182 may partially or fully fill the gaps 116, and may extend on surfaces outside of the gaps 116, in some embodiments. The sacrificial material 182 may be similar to the sacrificial material 180 described previously for FIG. 34. For example, the sacrificial material 182 may comprise material such as a photoresist, a polymer, a dielectric material (e.g., an oxide), the like, or another material. The sacrificial material 182 may be deposited over the structure (e.g., over the seed layer 123) and then patterned such that the seed layer 123 within the gaps 118 is exposed but the seed layer 123 within the gaps 116 is covered by the sacrificial material 182. The sacrificial material 182 may be patterned using suitable photolithography and etching techniques.

Figure 39:
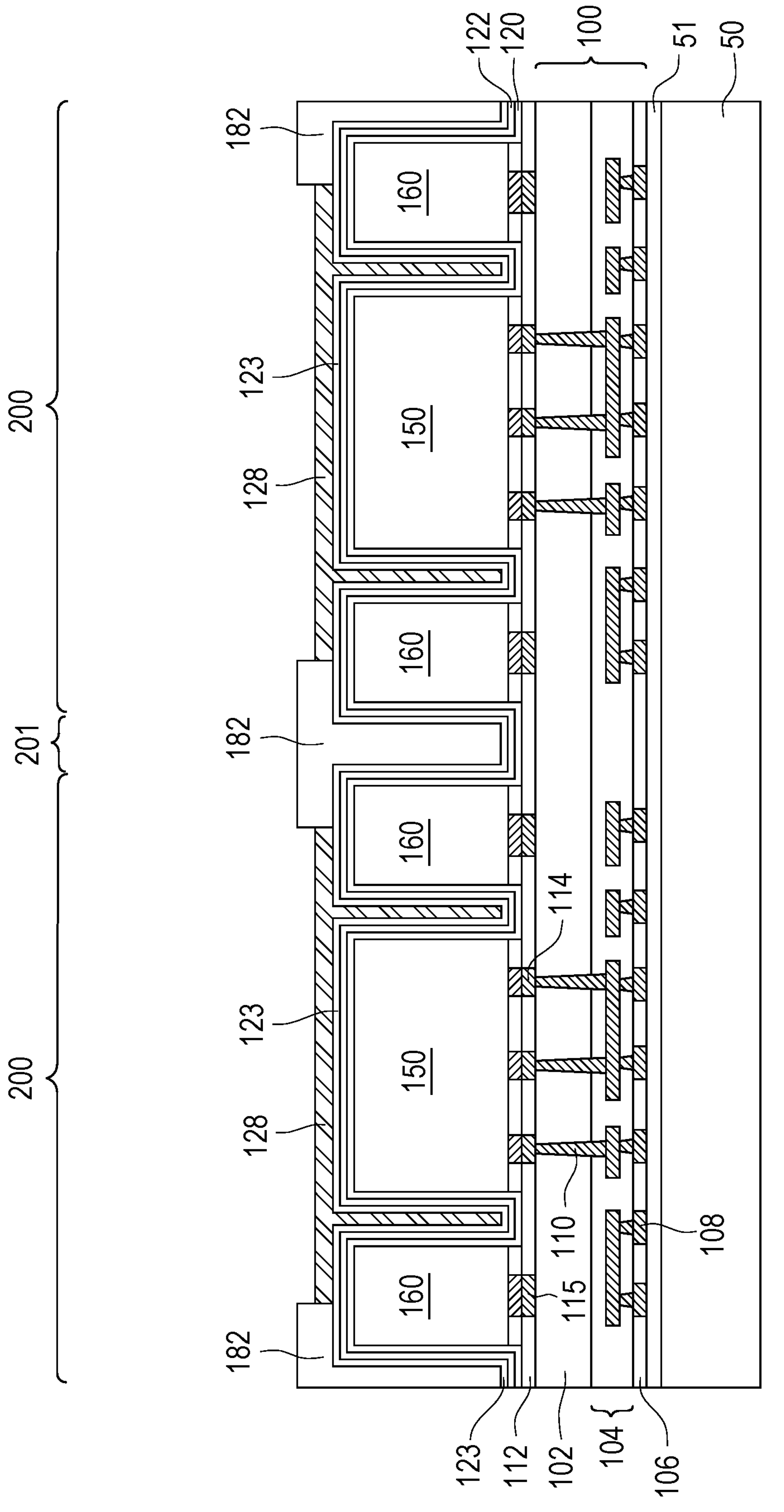

In FIG. 39, a metal fill material 124 is deposited on exposed portions of the seed layer 123, in accordance with some embodiments. The metal fill material 124 may be deposited, for example, using a plating process, such as an electroplating process or an electroless plating process, or the like. The sacrificial material 182 covers the seed layer 123 in the gaps 116 but not the seed layer 123 in the gaps 118, and thus the metal fill material 124 is formed in the gaps 118 but not in the gaps 116. The metal fill material 124 may overfill the gaps 118 and may extend on surfaces outside of the gaps 118, in some embodiments.

Figure 40:
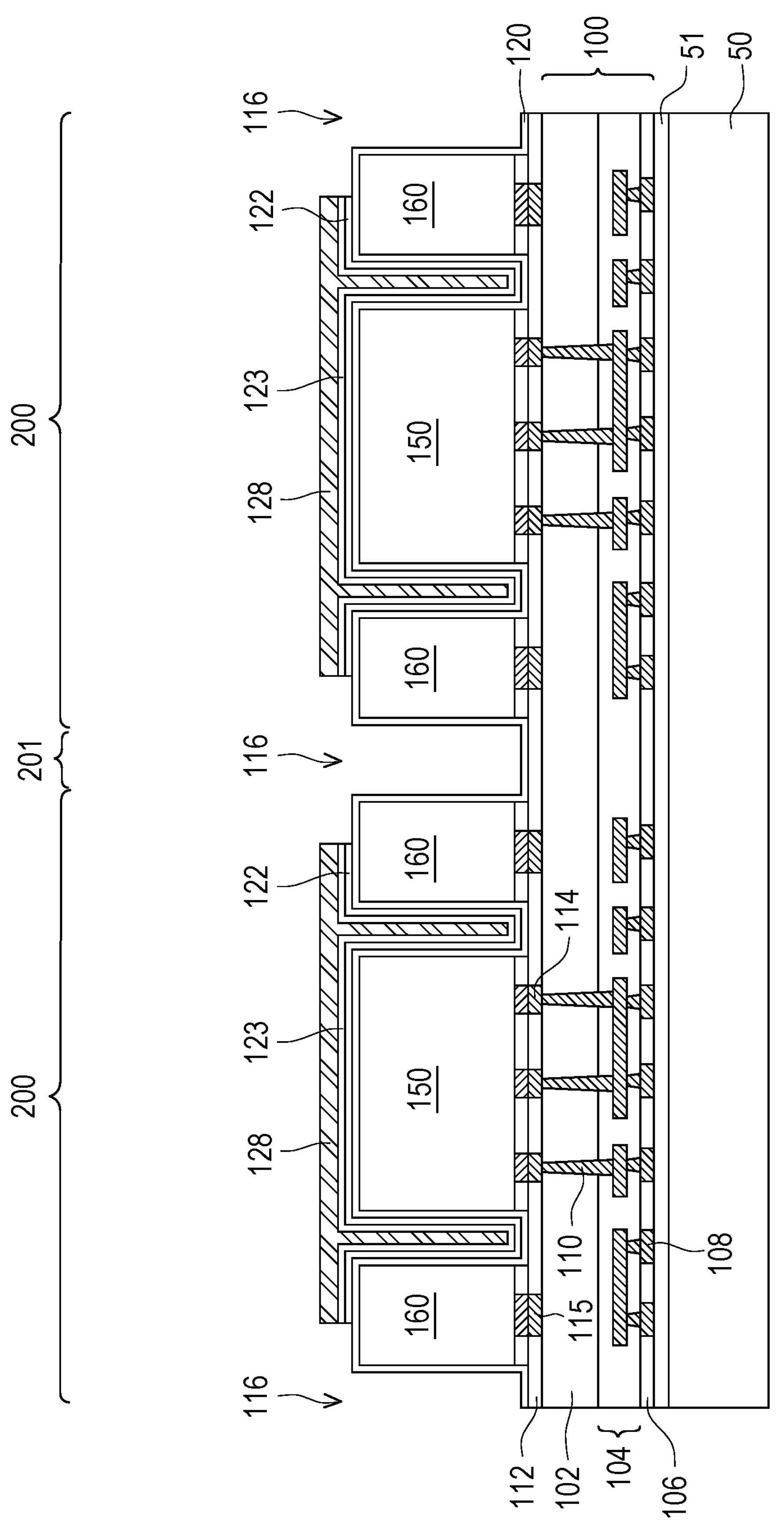

In FIG. 40, the sacrificial material 182 and underlying portions of the seed layer 123 are removed, in accordance with some embodiments. The sacrificial material 182 may be removed using a suitable process, such as an ashing process, a wet etching process, a dry etching process, or the like. After the sacrificial material 182 is removed, exposed portions of the seed layer 123 may be removed using a suitable etching process, such as a wet etching process or a dry etching process. In some embodiments, the barrier layer 122 underlying the sacrificial material 182 is also removed using a suitable etching process, which may be combined with an etching process that removes portions of the seed layer 123, in some cases. In other embodiments, the barrier layer 122 is not removed. In some embodiments, a planarization process may be performed before removing the sacrificial material 182 and/or the seed layer 123.

Figure 41:
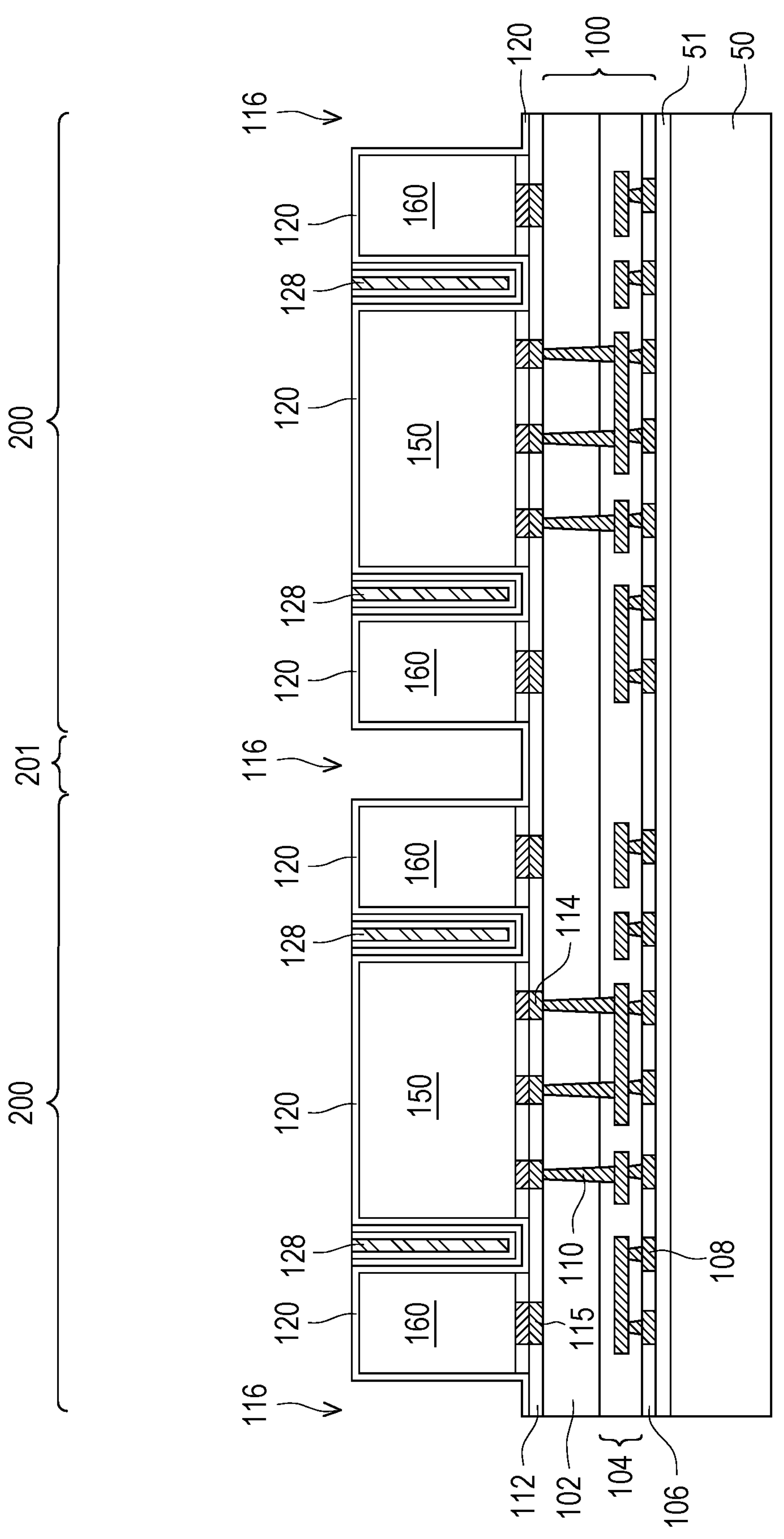

In FIG. 41, excess barrier layer 122, seed layer 123, and metal fill material 124 are removed to form thermal metal regions 128, in accordance with some embodiments. For example, a planarization process (e.g., a CMP process) may be performed to remove excess portions of the barrier layer 122, the seed layer 123, and the metal fill material 124, with the remaining portions forming the thermal metal regions 128. The planarization process may stop on the stop layer 120 and/or may expose the stop layer 120. In some embodiments, the planarization process is performed before removing the sacrificial material 182 and portions of the seed layer 123. In some embodiments, a planarization process may be performed both before and after the sacrificial material 182 is removed. The structure shown in FIG. 41 is similar to the structure shown in FIG. 9, and as such may be subsequently processed using similar process steps, such as those described for FIGS. 10-15, for example. For example, a protection layer 132 and a scribe fill material 134 may be deposited to form scribe fill regions 136.

Embodiments may achieve advantages. The present disclosure describes forming a material having high thermal conductivity between components (e.g., semiconductor devices, chips, dies, dummy structures, etc.) of a package. By filling regions between components with a high thermal conductivity material, such as a metal, heat generated within the package may be dissipated more efficiently. Improving heat dissipation in this manner can improve the performance of the components or of the overall package. Additionally, by replacing the high thermal conductivity material formed in scribe regions with a different material that is more suited to a singulation process, the singulation (e.g., sawing or the like) through the scribe regions may be performed more efficiently and with less risk of damage.

In accordance with some embodiments of the present disclosure, a method includes bonding a first semiconductor die to a semiconductor substrate; bonding a second semiconductor die to the semiconductor substrate, wherein the second semiconductor die is laterally separated from the first semiconductor die by a gap; filling the gap between the first semiconductor die and the second semiconductor die with a metal material to form a thermally conductive region; and depositing a first dielectric layer over the first semiconductor die, the second semiconductor die, and the thermally conductive region. In an embodiment, bonding the first semiconductor die to the semiconductor substrate includes dielectric-to-dielectric bonding and metal-to-metal bonding. In an embodiment, the first semiconductor die is a dummy die. In an embodiment, filling the gap with the metal material includes depositing a barrier layer and depositing copper over the barrier layer. In an embodiment, the method includes removing a portion of metal material that is adjacent a sidewall of the first semiconductor die to form a recess, and filling the recess with a dielectric material. In an embodiment, the method includes forming a thermal interconnect structure over the first semiconductor die, the second semiconductor die, and the metal material, wherein forming the thermal interconnect structure includes depositing a second dielectric layer over the first semiconductor die, the second semiconductor die, and the metal material, and forming metal features within the second dielectric layer, wherein the metal features physically contact the first semiconductor die, the second semiconductor die, and the metal material. In an embodiment, the method includes, before filling the gap with the metal material, conformally depositing a third dielectric on top surfaces and sidewalls of the first semiconductor die and the second semiconductor die.

In accordance with some embodiments of the present disclosure, a method includes bonding first semiconductor devices to a first package region of a substrate; bonding second semiconductor devices to a second package region of the substrate, wherein a scribe region separates the first package region from the second package region; depositing a metal fill material over the substrate, the first semiconductor devices, and the second semiconductor devices, wherein the metal fill material surrounds each of the first semiconductor devices and each of the second semiconductor devices; and depositing a first dielectric material in the scribe region, wherein the first dielectric material separates a first semiconductor device from a second semiconductor device. In an embodiment, the method includes, before depositing a metal fill material over the substrate, depositing a sacrificial material in the scribe region. In an embodiment, the first dielectric material is a spin-on-glass. In an embodiment, the first dielectric material is a molding material. In an embodiment, the method includes performing a singulation process through the first dielectric material and the substrate along the scribe region. In an embodiment, the first package region of the substrate includes a first die, wherein the second package region of the substrate includes a second die, wherein a second dielectric material separates the first die from the second die. In an embodiment, the first dielectric material is deposited in the scribe region before the metal fill material is deposited over the substrate. In an embodiment, the metal fill material is deposited within the scribe region, and the method includes removing portions of the metal fill material from the scribe region before depositing the first dielectric material in the scribe region. In an embodiment, the metal fill material is electrically isolated from the first semiconductor devices and the second semiconductor devices.

In accordance with some embodiments of the present disclosure, a package includes semiconductor devices directly bonded to an interposer, wherein the semiconductor devices are laterally separated from each other by a metallic material; a dielectric material collectively encircling the semiconductor devices; and a support substrate covering the semiconductor devices, wherein sidewalls of the support substrate, sidewalls of the dielectric material, and sidewalls of the interposer are coplanar. In an embodiment, at least one semiconductor device is a dummy device. In an embodiment, the metallic material is separated from the semiconductor devices by a dielectric layer. In an embodiment, a top surface of the dielectric material is farther from the interposer than a top surface of the metallic material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

bonding a first semiconductor die to a semiconductor substrate;

bonding a second semiconductor die to the semiconductor substrate, wherein the second semiconductor die is laterally separated from the first semiconductor die by a gap;

filling the gap between the first semiconductor die and the second semiconductor die with a metal material to form a thermally conductive region;

removing a portion of the metal material that is adjacent a sidewall of the first semiconductor die to form a recess;

filling the recess with a dielectric material; and depositing a first dielectric layer over the first semiconductor die, the second semiconductor die, and the thermally conductive region.

2. The method of claim 1, wherein bonding the first semiconductor die to the semiconductor substrate comprises dielectric-to-dielectric bonding and metal-to-metal bonding.

3. The method of claim 1, wherein the first semiconductor die is a dummy die.

4. The method of claim 1, wherein filling the gap with the metal material comprises depositing a barrier layer and depositing copper over the barrier layer.

5. The method of claim 1 further comprising forming a thermal interconnect structure over the first semiconductor die, the second semiconductor die, and the metal material, wherein forming the thermal interconnect structure comprises:

depositing a second dielectric layer over the first semiconductor die, the second semiconductor die, and the metal material; and forming a plurality of metal features within the second dielectric layer, wherein the plurality of metal features physically contact the first semiconductor die, the second semiconductor die, and the metal material.

6. The method of claim 1 further comprising, before filling the gap with the metal material, conformally depositing a third dielectric layer on top surfaces and sidewalls of the first semiconductor die and the second semiconductor die.

7. The method of claim 4, wherein the barrier layer comprises silicon nitride.

8. A method comprising:

bonding a plurality of first semiconductor devices to a first package region of a substrate;

bonding a plurality of second semiconductor devices to a second package region of the substrate, wherein a scribe region separates the first package region from the second package region;

depositing a metal fill material over the substrate, the plurality of first semiconductor devices, and the plurality of second semiconductor devices, wherein the metal fill material surrounds each of the first semiconductor devices and each of the second semiconductor devices, wherein the metal fill material is deposited within the scribe region;

removing portions of the metal fill material from the scribe region; and after removing portions of the metal fill material, depositing a first dielectric material in the scribe region, wherein the first dielectric material separates a first semiconductor device from a second semiconductor device.

9. The method of claim 8 further comprising, before depositing the metal fill material over the substrate, depositing a sacrificial material in the scribe region.

10. The method of claim 8, wherein the first dielectric material is a spin-on-glass.

11. The method of claim 8, wherein the first dielectric material is a molding material.

12. The method of claim 8 further comprising performing a singulation process through the first dielectric material and the substrate along the scribe region.

13. The method of claim 8, wherein the metal fill material is electrically isolated from the plurality of first semiconductor devices and the plurality of second semiconductor devices.

14. The method of claim 8 further comprising, before depositing the metal fill material, depositing a conformal barrier layer over the substrate, the plurality of first semiconductor devices, and the plurality of second semiconductor devices.

15. The method of claim 8, wherein the first dielectric material extends farther from the substrate than the metal fill material.

16. A method comprising:

bonding a plurality of semiconductor devices to an interposer;

forming a metallic material over the interposer, wherein the metallic material laterally separates neighboring semiconductor devices of the plurality of semiconductor devices;

removing the metallic material from between at least two neighboring semiconductor devices of the plurality of semiconductor devices;

after removing the metallic material, forming a dielectric material over the interposer, wherein the dielectric material laterally encircles a collective set of semiconductor devices of the plurality of semiconductor devices; and attaching a support substrate over the plurality of semiconductor devices, wherein sidewalls of the support substrate, sidewalls of the dielectric material, and sidewalls of the interposer are coplanar.

17. The method of claim 16, wherein the metallic material is separated from the semiconductor devices of the plurality of semiconductor devices by a dielectric layer.

18. The method of claim 16, wherein a top surface of the dielectric material is farther from the interposer than a top surface of the metallic material.

19. The method of claim 16 further comprising forming a thermal interconnect structure over the plurality of semiconductor devices, wherein the support substrate is attached to the thermal interconnect structure.

20. The method of claim 16 further comprising attaching the interposer to a package substrate using a plurality of conductive connectors.

* * * * *